(12) United States Patent
Tsukahara et al.

(10) Patent No.: US 7,176,055 B2
(45) Date of Patent: Feb. 13, 2007

(54) METHOD AND APPARATUS FOR MANUFACTURING ELECTRONIC COMPONENT-MOUNTED COMPONENT, AND ELECTRONIC COMPONENT-MOUNTED COMPONENT

(75) Inventors: Norihito Tsukahara, Kyoto-fu (JP); Daisuke Sakurai, Hyogo-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/285,475

(22) Filed: Nov. 1, 2002

(65) Prior Publication Data

US 2004/0082100 A1    Apr. 29, 2004

(30) Foreign Application Priority Data

Nov. 2, 2001 (JP) ............................ 2001-337728
Dec. 20, 2001 (JP) ............................ 2001-387617

(51) Int. Cl.
*H01L 21/00* (2006.01)
(52) U.S. Cl. .................. 438/106; 438/121; 438/107
(58) Field of Classification Search ................ 438/106, 438/107, 121
See application file for complete search history.

(56) References Cited

U.S. PATENT DOCUMENTS

| | | | | |
|---|---|---|---|---|
| 5,418,688 A * | 5/1995 | Hertz et al. ................. | 361/790 |
| 5,812,387 A * | 9/1998 | Lu et al. ..................... | 363/144 |
| 5,933,343 A * | 8/1999 | Lu et al. ..................... | 363/144 |
| 6,105,226 A * | 8/2000 | Gore et al. ................. | 29/25.35 |
| 6,130,110 A * | 10/2000 | Hashimoto ................... | 438/106 |
| RE38,381 E * | 1/2004 | Martich ....................... | 335/151 |
| 6,717,241 B1 * | 4/2004 | Tuttle ......................... | 257/659 |
| 6,780,668 B1 * | 8/2004 | Tsukahara et al. .......... | 438/106 |
| 6,913,947 B2 * | 7/2005 | Totokawa .................... | 438/106 |
| 6,987,030 B2 * | 1/2006 | Mita ........................... | 438/106 |
| 6,987,314 B1 * | 1/2006 | Yoshida et al. ............. | 257/698 |
| 2004/0082100 A1 * | 4/2004 | Tsukahara et al. .......... | 438/106 |
| 2004/0115864 A1 * | 6/2004 | Sakurai et al. ............. | 438/106 |
| 2006/0005384 A1 * | 1/2006 | Hung et al. ................ | 29/832 |
| 2006/0063301 A1 * | 3/2006 | Hung et al. ................. | 438/106 |

FOREIGN PATENT DOCUMENTS

| | | |
|---|---|---|
| JP | 53-79266 | 7/1978 |
| JP | 54-158669 | 12/1979 |
| JP | 57-118690 | 7/1982 |
| JP | 62-230027 | 10/1987 |
| JP | 11-220262 | 8/1999 |
| JP | 2000-151061 | 5/2000 |
| JP | 2001-093926 | 4/2001 |
| JP | 2001-250839 | 9/2001 |

* cited by examiner

*Primary Examiner*—Laura M. Schillinger
(74) *Attorney, Agent, or Firm*—Wenderoth, Lind & Ponack, L.L.P.

(57) ABSTRACT

After a first electronic component is inserted into a base substrate, first circuit patterns are formed on the inserted first electronic component, and then a second electronic component is mounted on the first circuit patterns to complete an electronic component-mounted component. According to the above method, a thickness of a module may be decreased by a thickness of the base substrate. Further, since electronic components are surface-mounted, electronic components of arbitrary sizes and types may be used.

26 Claims, 30 Drawing Sheets

Fig.45

- S41: FORM THROUGH HOLE
- S42: EMBED SEMICONDUCTOR DEVICE
- S43: EXPOSE ELECTRODE
- S44: FORM CIRCUIT PATTERN AND FILL THROUGH HOLE
- S45: JOIN SHEET MODULES
- S46: FORM INTO A CASING

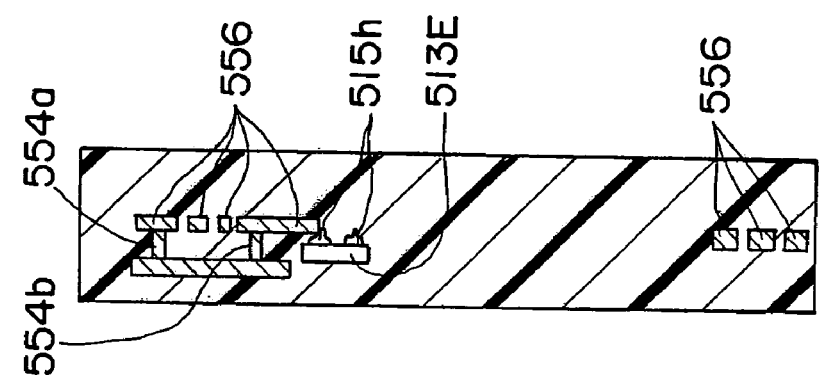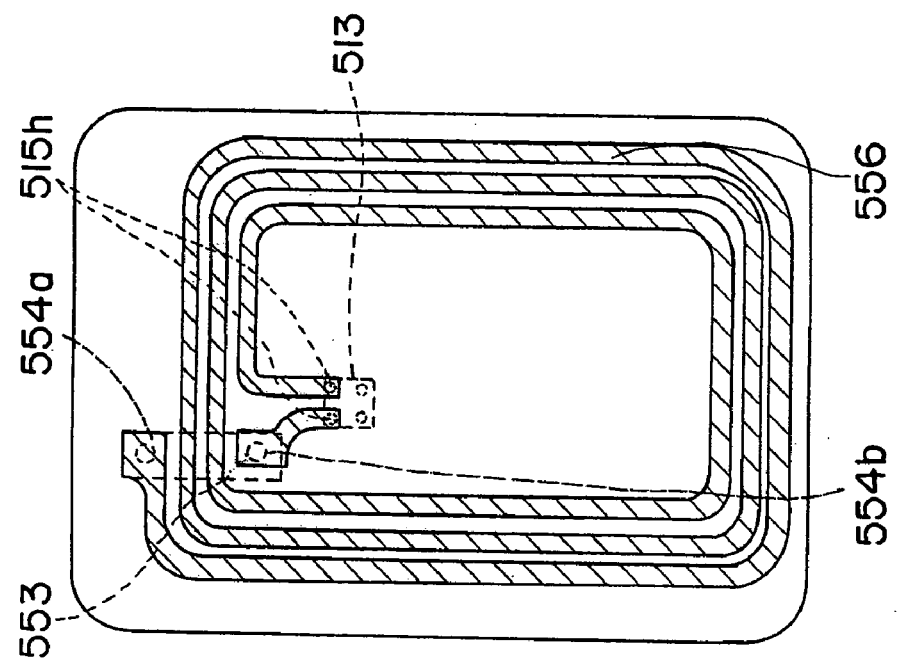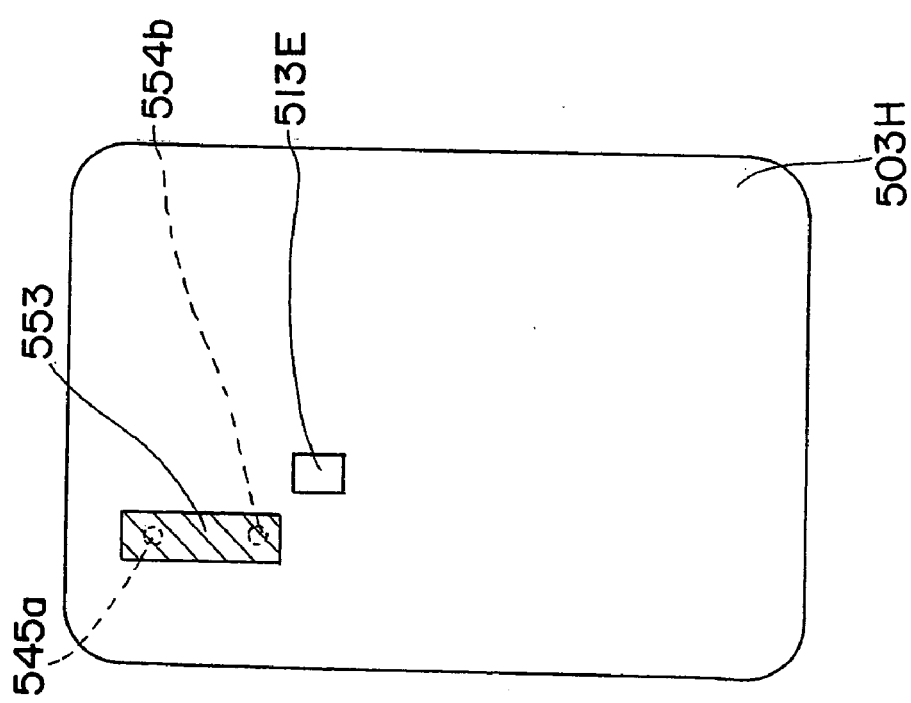

METHOD AND APPARATUS FOR MANUFACTURING ELECTRONIC COMPONENT-MOUNTED COMPONENT, AND ELECTRONIC COMPONENT-MOUNTED COMPONENT

BACKGROUND OF THE INVENTION

The present invention relates to a method and an apparatus for manufacturing an electronic component-mounted component with electronic components such as IC chips mounted on a substrate, and to an electronic component-mounted component manufactured by the method for manufacturing an electronic component-mounted component. Examples of the electronic component-mounted component include: an MCM (Multi Chip Module) with a plurality of semiconductor chips and capacitors as well as passive components such as resistors being mounted on one carrier substrate; stack IC modules with a plurality of memory chips stacked in multiple stages; and memory cards.

Following description discusses a conventional method for manufacturing an electronic component-mounted component with reference to FIG. 50 and FIG. 51.

Conventionally, in the MCM with the plurality of semiconductor devices and electronic components such as the passive components being mounted thereon, the stack IC modules with the plurality of memory chips stacked in multiple stages, and the memory cards, there is adopted a method for electrically connecting the semiconductor devices to a carrier substrate by a wire-bonding method for multi-layering. Also, the electronic components are mounted by a method in which solder paste is printed on a specified circuit pattern of the carrier substrate and reflowed.

As shown in FIG. 50, a plurality of semiconductor devices 1, more specifically, three semiconductor devices 1 in this example, provided in a conventional MCM 20 are laminated onto a carrier substrate 3, and electrically connected to electrodes 4 of a specified circuit pattern formed on the carrier substrate 3 via wires 8 made of gold, copper, aluminum, or the like formed by a wire bonding method. Reference numeral 12 denotes an encapsulant for protecting the semiconductor devices 1 including the wires 8. As for an electronic component 5, specified electrodes 4 on the carrier substrate 3 are connected to electrodes 6 of the electronic component 5 via solder paste 7. It is noted that reference numeral 9 denotes external electrode terminals for establishing electric connection between an unshown mother board and the MCM 20. The external electrode terminals 9 are not necessary if the MCM 20 is a module for fulfilling functions of a product as a single unit. Reference numeral 11 is a through hole for obtaining electric conduction between a circuit pattern on a mounting face side of the carrier substrate 3 and the external electrode terminal 9.

A manufacturing process thereof is structured such as shown in FIG. 51, such that first in step (referred to as "S" in the drawing) 1, solder paste is printed onto specified electrodes 4 on a carrier substrate 3. Solder paste 7 is printed generally by a screen printing method. Next, in step 2, an electronic component 5 is positioned and mounted on the solder paste 7 applied by printing. Next, in step 3, the carrier substrate 3 with the electronic component 5 mounted thereon is put in a reflow furnace so that the solder paste 7 is melted and then hardened. Next, in step 4, semiconductor devices 1 are stacked along a thickness direction of the carrier substrate 3. Though not shown in this figure, some silver paste is generally used to join the semiconductor device 1 and the carrier substrate 3, as well as to join each semiconductor device 1. Next in step 5, each electrode 2 of the semiconductor device 1 is electrically connected to the specified electrode 4 on the carrier substrate 3 by a wire bonding method with use of a metal wire 8 made of gold, copper, solder and the like. Next in step 6, encapsulant 12 is applied for protecting the semiconductor device 1. Next in step 7, the carrier substrate 3 with the encapsulant 12 applied thereto is put in a batch type furnace for hardening the encapsulant 12. Thus, the MCM 20 as an electronic component-mounted component is manufactured.

However, the above-described conventional method and apparatus for manufacturing an electronic component-mounted component, as well as an MCM, memory modules and the like, as electronic component-mounted components manufactured by the above manufacturing method of an electronic component-mounted component have following issues in terms of their structure.

Semiconductor components such as semiconductor devices 1 are stacked on the carrier substrate 3, so that a height of an electronic component-mounted component in a thickness direction is increased, which makes it impossible to satisfy recent product needs of reduced thickness.

Also, since the semiconductor devices 1 are stacked up and each semiconductor device 1 is electrically connected by wire bonding, each of the electrodes 2 needs to be disposed on a periphery of the semiconductor device 1. Consequently, in stacking up the semiconductor devices 1 as shown in FIG. 50, it is necessary to use semiconductor devices whose planar sizes are smaller in sequence, and therefore sizes of usable semiconductor devices are limited. In other words, in a case of a semiconductor device a so called area pad, where electrodes 2 are disposed in a portion other than an external layer portion of the semiconductor device 1, stacking is not possible.

The present invention is intended to solve the above issues, and therefore it is an object of the present invention to provide a method and an apparatus for manufacturing an electronic component-mounted component enabling reduction of a thickness and having less restriction of usable electronic components, and an electronic component-mounted component manufactured by the method for manufacturing an electronic component-mounted component.

SUMMARY OF THE INVENTION

In order to accomplish the above object, the present invention is structured as follows.

According to a first aspect of the present invention, there is provided a method for manufacturing an electronic component-mounted component, comprising:

inserting a first electronic component into a base substrate;

forming first circuit patterns, which are electrically connected to a plurality of electrodes of the inserted first electronic component, on a circuit formation face of the base substrate, and then establishing electrical connection between each of the electrodes and the first circuit patterns; and then mounting a second electronic component on the first circuit patterns of the base substrate.

According to a second aspect of the present invention, there is provided a method for manufacturing an electronic component-mounted component as defined in the first aspect, wherein the first electronic component is inserted into the base substrate so that each of the electrodes of the first electronic component is exposed from a circuit formation face of the base substrate.

According to a third aspect of the present invention, there is provided a method for manufacturing an electronic component-mounted component as defined in the first aspect, further comprising: after inserting the first electronic component into the base substrate and forming the first circuit patterns, and before mounting the second electronic component, performing lamination processing for disposing an insulating protective sheet on an opposite face side opposed to the circuit formation face of the base substrate.

According to a fourth aspect of the present invention, there is provided a method for manufacturing an electronic component-mounted component as defined in the first aspect, further comprising: superposing the base substrate and a first substrate, which has third circuit patterns and fourth circuit patterns opposed to each other and has first substrate through holes having conductors inside thereof for electrically connecting the third circuit patterns and the fourth circuit patterns, in a thickness direction of the base substrate and the first substrate, so that the fourth circuit patterns of the first substrate are electrically connected to a plurality of electrodes of the second electronic component mounted on the base substrate.

According to a fifth aspect of the present invention, there is provided a method for manufacturing an electronic component-mounted component as defined in the first aspect, wherein the electric connection between each of the electrodes of the first electronic component and the first circuit patterns is established so that the first circuit patterns are also electrically connected to conductive through-holes which are formed to penetrate through the base substrate in its thickness direction and that have conductors inside thereof.

According to a sixth aspect of the present invention, there is provided a method for manufacturing an electronic component-mounted component as defined in the fifth aspect, further comprising:

superposing the base substrate with the first electronic component inserted therein and the first circuit patterns formed thereon and a second substrate, which has fifth circuit patterns and sixth circuit patterns opposed to each other and has second substrate through holes for electrically connecting the fifth circuit patterns and the sixth circuit patterns, in a thickness direction of the base substrate and the second substrate, so that the sixth circuit patterns of the second substrate are electrically connected to the through holes of the base substrate; and then mounting a third electronic component on the fifth circuit patterns.

According to a seventh aspect of the present invention, there is provided a method for manufacturing an electronic component-mounted component as defined in the fifth aspect, wherein the electric connection between each of the electrodes of the first electronic component and the first circuit patterns is established so that the first circuit patterns are also electrically connected, via the through holes, to second circuit patterns which are formed on an opposite face side opposed to the circuit formation face and which are electrically connected to the through holes.

According to an eighth aspect of the present invention, there is provided a method for manufacturing an electronic component-mounted component as defined in the seventh aspect, further comprising: mounting a third electronic component on the second circuit patterns.

According to a ninth aspect of the present invention, there is provided a method for manufacturing an electronic component-mounted component as defined in the sixth aspect, further comprising: stacking a plurality of base substrates with first electronic components inserted therein and first circuit patterns formed thereon; and superposing these stacked base substrates and the second substrate.

According to a tenth aspect of the present invention, there is provided a method for manufacturing an electronic component-mounted component, comprising:

inserting a first electronic component into a base substrate;

forming first circuit patterns, which are electrically connected to a plurality of electrodes of the inserted first electronic component, on a circuit formation face of the base substrate for establishing electric connection between each of the electrodes and the first circuit patterns; and then superposing the base substrate and a first substrate, which has third circuit patterns and fourth circuit patterns opposed to each other and has first substrate through holes having conductors inside thereof for electrically connecting the third circuit patterns and the fourth circuit patterns, in a thickness direction of the base substrate and the first substrate, so that the fourth circuit patterns of the first substrate are electrically connected to the first circuit patterns of the base substrate.

According to an eleventh aspect of the present invention, there is provided a method for manufacturing an electronic component-mounted component as defined in the tenth aspect, wherein the first electronic component is inserted in the base substrate so that each of the electrodes of the first electronic component is exposed from the circuit formation face of the base substrate.

According to a twelfth aspect of the present invention, there is provided a method for manufacturing an electronic component-mounted component as defined in the tenth aspect, further comprising:

superposing the base substrate, with the first electronic component inserted therein and the first circuit patterns formed thereon, and the first substrate, and then establishing electrical connection between the fourth circuit patterns and the first circuit patterns; and then mounting a second electronic component on the third circuit patterns.

According to a thirteenth aspect of the present invention, there is provided a method for manufacturing an electronic component-mounted component as defined in the tenth aspect, further comprising: mounting a second electronic component on the third circuit patterns prior to establishing the electrical connection between the fourth circuit patterns of the base substrate and the first circuit patterns of the first substrate.

According to a fourteenth aspect of the present invention, there is provided a method for manufacturing an electronic component-mounted component as defined in the tenth aspect, further comprising:

after inserting the first electronic component into the base substrate and forming the first circuit patterns, performing lamination processing for disposing an insulating protective sheet on an opposite face opposed to the circuit formation face of the base substrate; and establishing electric connection between the first circuit patterns of the lamination-processed base substrate and the fourth circuit patterns.

According to a fifteenth aspect of the present invention, there is provided a method for manufacturing an electronic component-mounted component as defined in the tenth aspect, wherein the electric connection between each of the electrodes of the first electronic component and the first circuit patterns is established so that the first circuit patterns are also electrically connected to conductive through-holes which are formed to penetrate through the base substrate in its thickness direction and that have conductors inside thereof.

According to a sixteenth aspect of the present invention, there is provided a method for manufacturing an electronic component-mounted component as defined in the fifteenth aspect, further comprising:

superposing the base substrate, with the first electronic component inserted therein and the first circuit patterns formed thereon, and a second substrate which has fifth circuit patterns and sixth circuit patterns opposed to each other and has second substrate through holes for electrically connecting the fifth circuit patterns and the sixth circuit patterns, in a thickness direction of the base substrate and the second substrate, so that the sixth circuit patterns of the second substrate are electrically connected to the through holes of the base substrate; and then mounting a third electronic component on the fifth circuit patterns.

According to a seventeenth aspect of the present invention, there is provided a method for manufacturing an electronic component-mounted component as defined in the tenth aspect, wherein the base substrate and the first substrate is superposed via binder.

According to an eighteenth aspect of the present invention, there is provided a method for manufacturing an electronic component-mounted component as defined in the sixteenth aspect, wherein the first substrate and the second substrate are superposed on the base substrate via binder.

According to a nineteenth aspect of the present invention, there is provided an electronic component-mounted component manufactured by the method for manufacturing an electronic component-mounted component as defined in the first aspect.

According to a twentieth aspect of the present invention, there is provided a method for manufacturing an electronic component-mounted component as defined in the first aspect, further comprising: after inserting the first electronic component into the base substrate, exposing each of the electrodes of the inserted first electronic component from a surface of the base substrate by performing either one of or both polishing processing and plasma discharge processing.

According to a twenty-first aspect of the present invention, there is provided a method for manufacturing an electronic component-mounted component as defined in the twentieth aspect, further comprising:

before inserting the first electronic component into the base substrate, forming a protruding electrode on each of a plurality of electrodes of a semiconductor device as the first electronic component; then inserting the semiconductor device into the base substrate with each of the protruding electrodes leveled to have a uniform height, or without performing a leveling operation; and exposing each of the protruding electrodes from a surface of the base substrate.

According to a twenty-second aspect of the present invention, there is provided a method for manufacturing an electronic component-mounted component as defined in the twentieth aspect, further comprising: after exposing each of the electrodes of the first electronic component from the surface of the base substrate, forming a conductive film on each of the exposed electrodes instead of forming the first circuit patterns, and mounting the second electronic component, for forming circuit components.

According to a twenty-third aspect of the present invention, there is provided a method for manufacturing an electronic component-mounted component as defined in the twentieth aspect, further comprising:

after exposing each of the electrodes of the first electronic component from the surface of the base substrate, printing solder paste or conductive adhesive on each of the exposed electrodes; and then heat-hardening the electrodes in a high-temperature furnace or in a high-temperature stage for forming the first circuit patterns.

According to a twenty-fourth aspect of the present invention, there is provided a method for manufacturing an electronic component-mounted component as defined in the twentieth aspect, further comprising:

collectively inserting a plurality of first electronic components into the base substrate;

exposing each of the electrodes of each of the first electronic components from the surface of the base substrate; and cutting the base substrate into pieces so that each of the first electronic components is separated from each other.

According to a twenty-fifth aspect of the present invention, there is provided a manufacturing method of an electronic component-mounted component for manufacturing a multilayer-laminated electronic component-mounted component comprising: after manufacturing the electronic component-mounted component by the method for manufacturing the electronic component-mounted component as defined in the twenty-second aspect, superposing on one face or both faces of the electronic component-mounted component, a plurality of electronic component-mounted components or base substrates in a thickness direction thereof; and disposing an insulating protective sheet on both superposed front and back faces.

According to a twenty-sixth aspect of the present invention, there is provided an electronic component-mounted component manufactured by the method for manufacturing an electronic component-mounted component as defined in the twentieth aspect.

According to a twenty-seventh aspect of the present invention, there is provided an electronic component-mounted component, comprising:

a base substrate; and an electronic component inserted in the base substrate with a plurality of electrodes being exposed from a surface of the base substrate by performing either one of or both polishing processing and plasma discharge processing.

According to a twenty-eighth aspect of the present invention, there is provided the electronic component-mounted component as defined in the twenty-seventh aspect, further comprising a circuit component formed by forming a conductive film on each of the electrodes exposed from the surface of the base substrate.

According to a twenty-ninth aspect of the present invention, there is provided an apparatus for manufacturing an electronic component-mounted component, comprising:

an electronic component feeding apparatus for feeding a base substrate and an electronic component;

a vertical inverting apparatus for sucking the electronic component and then inverting the electronic component vertically;

an electronic component mounting apparatus for mounting the electronic component onto the base substrate;

an electronic component inserting apparatus for inserting the electronic component into the base substrate; and an electrode exposing apparatus for exposing each of electrodes from a surface of the base substrate by performing either one or both of plasma discharge processing and polishing processing.

BRIEF DESCRIPTION OF THE DRAWINGS

These and other objects and features of the present invention will become clear from the following description taken in conjunction with the preferred embodiments thereof with reference to the accompanying drawings, in which:

FIG. 45 is a flowchart showing a manufacturing process of the memory card of FIG. 44;

FIGS. 46A, 46B and 46C are, respectively, a top view, a bottom view and a cross sectional view each showing an intermediate layer of a non-contact IC card manufactured by a method for manufacturing a non-contact IC card according to yet another embodiment of the present invention;

DETAILED DESCRIPTION OF THE PREFERRED EMBODIMENTS

Figure 1:
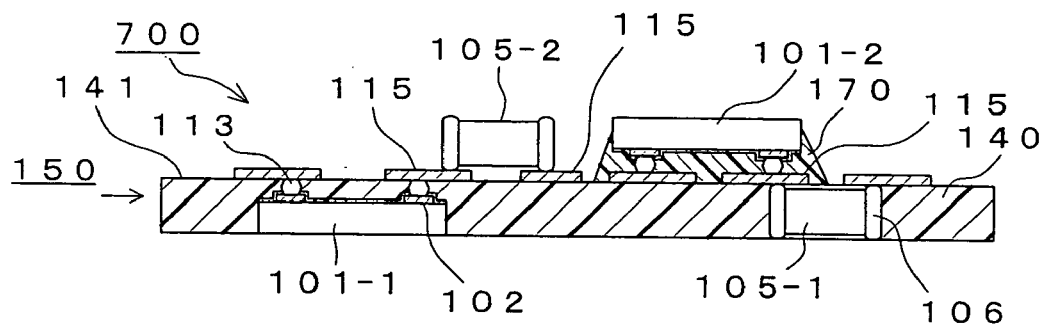
FIG. 1 is a view showing an electronic component-mounted component in an embodiment of the present invention.

Before description of the present invention proceeds, it is to be noted that like parts are designated by like reference numerals throughout the accompanying drawings.

Description will be hereinbelow given of a method for manufacturing an electronic component-mounted component and an electronic component-mounted component in embodiments of the present invention with reference to the drawings. Herein, the electronic component-mounted component is a component manufactured by a method for manufacturing an electronic component-mounted component. It is noted that like component members are designated by like reference numerals throughout the drawings.

As an example that achieves a function of the electronic component-mounted component, an MCM (Multi Chip Module) and a sheet module (including memory cards and non-contact IC cards) are adopted in the present embodiment. However, the present invention is not limited thereto.

First Embodiment

FIG. 1 is a view showing an electronic component-mounted component 700 manufactured by using a method for manufacturing an electronic component-mounted component of the present embodiment. The electronic component-mounted component 700 is composed of: a first electronic component-mounted component 150 corresponding to one example of an electronic component-mounted component with a first electronic component (the first electronic component is also one example of an electronic component) inserted or embedded for example, therein; and a second electronic component (the second electronic component is also an example of an electronic component) mounted on the first electronic component-mounted component 150. In the present embodiment, examples of a component corresponding to the first electronic component include a semiconductor device 101-1 that is a bare IC chip, or a capacitor component 105-1. The first electronic component-mounted component 150 has the semiconductor device 101-1 and the capacitor component 105-1 embedded in a first resin base substrate 140 corresponding to one example of a base substrate that is made of a sheet-like resin material. On a circuit formation face 141 of the first resin base substrate 140, there are exposed: a bump 113 formed on each of a plurality of electrodes 102 on the semiconductor device 101-1; and each of electrodes 106 of the capacitor component 105-1. On the circuit formation face 141, there are formed first circuit patterns 115 that are electrically connected to each of the bumps 113, that are an example of a protruding electrode, and to each of the electrodes 106, and therefore the semiconductor device 101-1 and the capacitor component 105-1 are electrically connected to the first circuit patterns 115. Also in the present embodiment, examples of a component corresponding to the second electronic component include a semiconductor device 101-2 that is a bare IC chip, or a capacitor 105-2. This semiconductor device 101-2 and the capacitor 105-2 are mounted on the first circuit patterns 115. Therefore, the first electronic component and the second electronic component are electrically connected via the first circuit patterns 115.

It is noted that examples of the electronic components such as the capacitor components 105-1, 105-2, are not limited to capacitors, and other components such as resistors may be included in the examples. Further, sheet-like components may be substituted for chip-like components. It is noted that the semiconductor devices 101-1, 101-2 may be generically referred to as semiconductor devices 101, and the capacitor components 105-1, 105-2 may be generically referred to as capacitor components 105.

Following description discusses a method for manufacturing the electronic component-mounted component 700 having the above configuration with reference to FIGS. 2 to 8.

Figure 2:
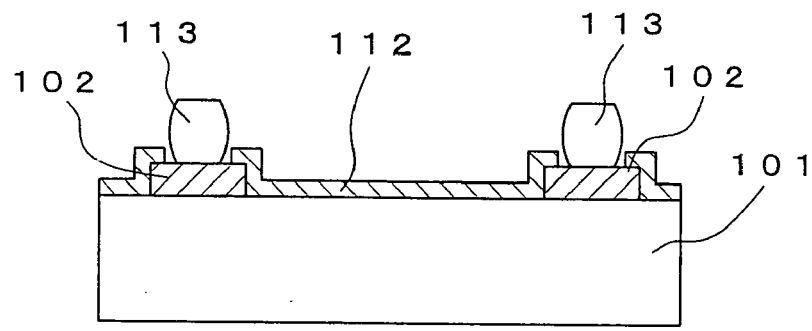
FIG. 2 is a view showing a semiconductor device included in the electronic component-mounted component shown in FIG. 1.
Figure 3:
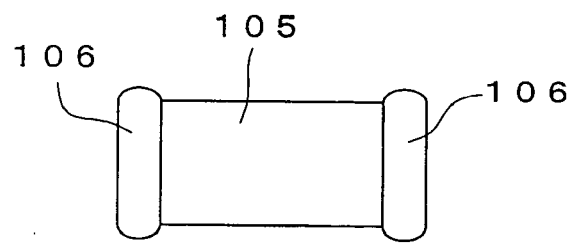
FIG. 3 is a view showing a capacitor component included in the electronic component-mounted component shown in FIG. 1.

FIG. 2 is a view showing semiconductor device 101, in which reference numeral 102 denotes electrodes of the semiconductor device 101, and reference numeral 112 denotes a passivation film for protecting an active face of the semiconductor device 101. FIG. 3 is a view showing a capacitor component 105 having external electrodes 106.

Figure 8:
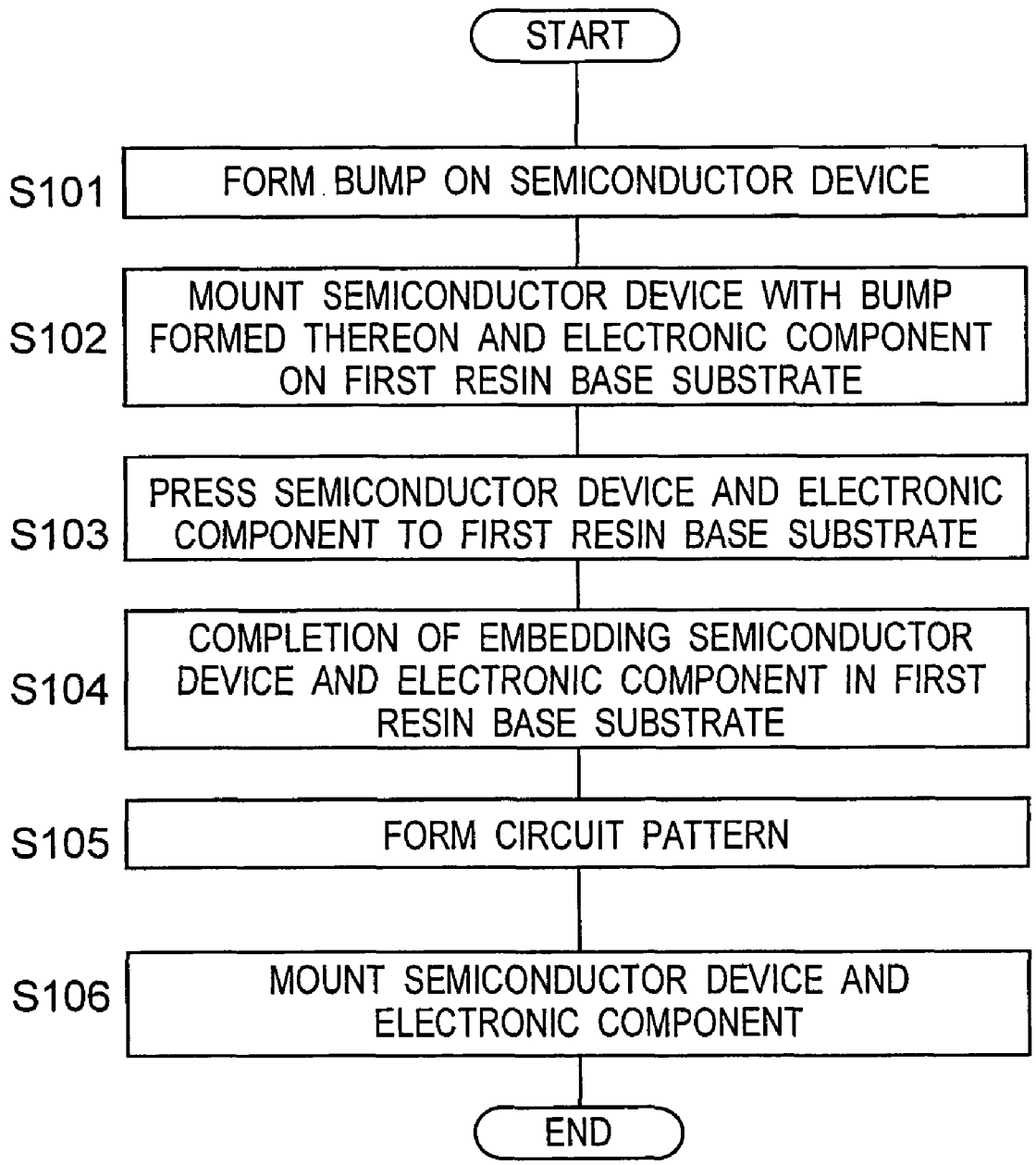
FIG. 8 is a flowchart showing the manufacturing process of the electronic component-mounted component shown in FIG. 1.

In step 101 (a word "step" is referred to as "S" in FIG. 8) shown in FIG. 8, each bump 113 is formed on each of the electrodes 102 of the semiconductor device 101 by a wire bonding method with use of metal wires made of gold, copper and solder. It is noted that a formation method of the bump 113 is not limited to the wire boding method, and so a plating method is also applicable.

In next step 102, the semiconductor device 101-1 and the capacitor component 105-1 with each of the bumps 113 formed thereon are mounted on a sheet-like thermoplastic first resin base-substrate 140 formed from a resin having electrical insulation such as polyethylene phthalate, polyvinyl chloride, polycarbonate, acrylonitrile butadiene, polyimide, and epoxy. In some cases, a plurality of the semiconductor devices 101-1 and the capacitor components 105-1 are mounted, or the capacitor component 105-1 is not mounted at all.

Here, since the bumps 113 and the external electrodes 106 need to be exposed from the circuit formation face 141 of the first resin base-substrate 140 as described later in this embodiment, it is preferable that a thickness of the first resin base substrate 140 is basically equal to or larger than a thickness of the semiconductor device 101-1 and equal to or smaller than a sum of a thickness of the semiconductor device 101-1 and a height of the bump 113. For example, if the thickness of the semiconductor device 101-1 is 0.18 mm and the height of the bump 113 is 0.04 mm, the thickness of the first resin base substrate 140 is preferably 0.2 mm. It is also preferable to use a capacitor component 105-1 whose thickness is larger by approximately 50 μm than the thickness of the first resin base substrate 140. The thickness of the capacitor component 105-1 is no less than the thickness of the first resin base substrate 140.

Figure 4:
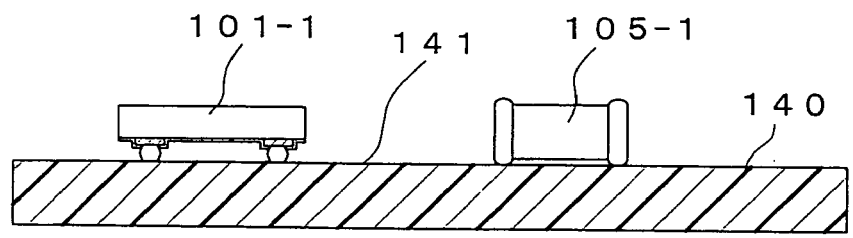
FIG. 4 is a view of a manufacturing process of the electronic component-mounted component shown in FIG. 1 for showing a state that first electronic components are placed on a base substrate.
Figure 5:
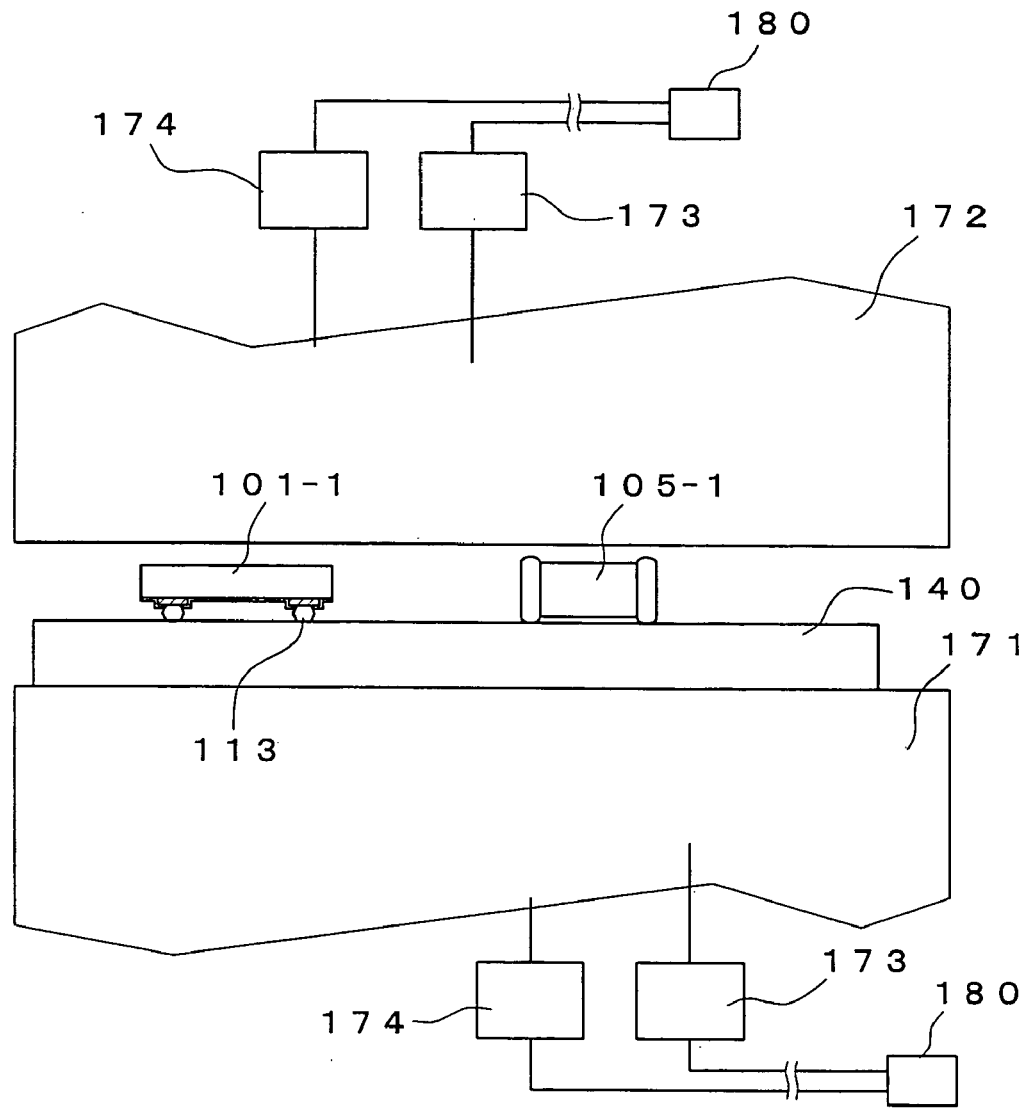
FIG. 5 is a view of the manufacturing process of the electronic component-mounted component shown in FIG. 1 for describing an operation of embedding the first electronic components in the base substrate.

In next step 103, the first resin base substrate 140 with the semiconductor device 101-1 having the bumps 113 and the capacitor component 105-1 mounted thereon as shown in FIG. 4 is interposed between hot pressing plates 171, 172 as shown in FIG. 5, where the semiconductor device 101-1 having the bumps 113, the capacitor component 105-1 and the first resin base substrate 140 are heated by a heating apparatus 173 while being pressed relatively by a pressing apparatus 174, by which the semiconductor device 101-1 and the electronic component 105-1 are pressed and embedded in the first resin base substrate 140. Hot pressing conditions in a case of using a first resin base substrate 140 made of, for example, polythene terephthalate, are such that pressure is $30 \times 10^5$ Pa, temperature is 160° C., and pressing time is 1 minute. It is noted that the temperature and pressure differ by materials of the first resin base substrate 140. The pressing conditions are controlled by a controller 180 that controls the heating apparatus 173 and the pressing apparatus 174. A pressing operation of the semiconductor device 101-1 and the capacitor component 105-1 may be individually performed by using separate hot pressing plates.

Figure 6:
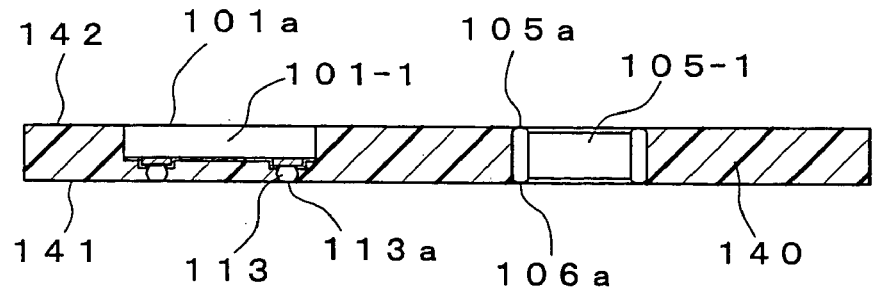
FIG. 6 is a view of the manufacturing process of the electronic component-mounted component shown in FIG. 1 for showing a state that the first electronic components are embedded in the base substrate.

FIG. 6 corresponding to next step 104 is a cross sectional view showing a state of the semiconductor device 101-1, the capacitor component 105-1 and the first resin base substrate 140 after execution of pressing step 103. As shown in FIG. 6, in the present embodiment, by an operation of inserting the semiconductor device 101-1 and the capacitor component 105-1 in the first resin base substrate 140, end faces 113a of the bumps 113 and end faces 106a of the electrodes 106 of electronic component 105-1, that are the faces of each of the bumps 113 and the electrodes 106 that are brought into contact with the hot pressing plate 171 by the pressing operation, are exposed from the circuit formation face 141 of the first resin base substrate 140, and in this state the semiconductor device 101-1 and the capacitor component 105-1 are embedded in the first resin base substrate 140.

Here in the present embodiment, for decreasing a thickness of the component, a back face 101a opposed to the active face of the semiconductor device 101-1, and an end face 105a of the capacitor component 105-1, are the same face as an opposite face 142 of the first resin base substrate 140 opposed to the circuit formation face 141 as shown in FIG. 6. However, the present invention is not limited thereto. More specifically, depending on each semiconductor component-mounted component, by adjusting the above-described thickness of the first resin base substrate 140, the pressing force of the hot pressing plates 171, 172, and the like, the back face 101a of the semiconductor device 101-1 and the end face 105a of the capacitor component 105-1 may be protruded from, for example, the opposite face 142 of the first resin base substrate 140.

It is noted that a word "embedding" used in the present first embodiment throughout the later-described eighth embodiment refers to a state that electronic components such as the semiconductor device 101-1 and the capacitor component 105-1 are inserted into a base substrate so that each electrode of these electronic components is exposed from a surface of the base substrate. Contrary to this, a word "embedding" used in the later described ninth embodiment and the following embodiments refers to a state that electronic components are embedded in the base substrate with each electrode not exposed from the surface of the base substrate.

Figure 7:
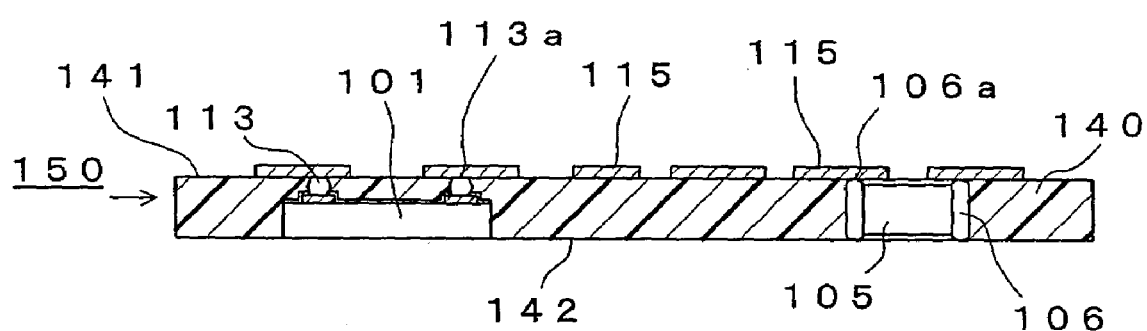
FIG. 7 is a view of the manufacturing process of the electronic component-mounted component shown in FIG. 1 for showing a state that first circuit patterns are formed on the base substrate.

In next step 105 as shown in FIG. 7, a first circuit pattern 115 that is electrically connected to the semiconductor device 101-1 and the capacitor component 105-1 is formed on the circuit formation face 141 of the first resin base substrate 140 so as to come into contact with the end faces 113a of the bumps 113 and the end faces 106a of the electrodes 106 of the capacitor component 105-1 with use of conductive paste such as silver and copper. Formation of the first circuit pattern 115 with the conductive paste is generally performed by performing screen printing, offset printing, gravure, or the like. In the case of screen printing, for example, a conductive paste is printed via a 165 meshes/inch mask with an emulsion thickness of 10 μm for forming a first circuit pattern 115 with a conductor thickness of approximately 30 μm.

Formation of first circuit patterns 115 is not limited to formation by printing of conductive paste, and therefore the first circuit pattern 115 may be formed by thin-film formation and the like by such a method as metal plating and deposition with use of copper, Ni, aluminum or the like.

Thus, there is established electric connection of the first circuit patterns 115 to the semiconductor device 101-1 and the capacitor component 105-1. A component portion in a state shown in FIG. 7 is the first electronic component-mounted component 150.

In next step 106, a semiconductor device 101-2 and a capacitor component 105-2, that are second electronic components, are mounted on the first circuit patterns 115 of the first electronic component-mounted component 150 to complete an MCM corresponding to one example that achieves a function of the electronic component-mounted component 700 as shown in FIG. 1. It is noted that a method for mounting the semiconductor device 101-2 and the capacitor component 105-2 on the first circuit patterns 115 of the first electronic component-mounted component 150, though unshown, is performed by a general circuit mounting method such as soldering, bonding with silver paste and the like. In FIG. 1, reference numeral 170 denotes an insulation encapsulant for protecting the semiconductor device 101-2.

Thus, according to the present invention, a module has a structure in which the semiconductor device 101-1 and the capacitor component 105-1 are embedded in the first resin base substrate 140, which is different from a structure of stacking components on the carrier substrate 3 as described in the conventional example. Therefore, a thickness of the module may be decreased by a thickness of the carrier substrate 3, which makes it possible to satisfy recent product needs of reduced thickness.

Also, by forming the first circuit patterns 115 so that the first circuit patterns 115 comes into direct contact with each of the bumps 113 of the semiconductor device 101-1 and each of the electrodes 106 of the capacitor component 105-1, a necessity of forming electrodes for wire bonding in a peripheral portion of the semiconductor device may be eliminated. This makes it possible to use semiconductor devices of arbitrary sizes in stacking semiconductor devices. Further, since there is no limitation of a position of an electrode of the semiconductor device, it becomes possible to stack area pad-type semiconductor devices.

Second Embodiment

Figure 9:
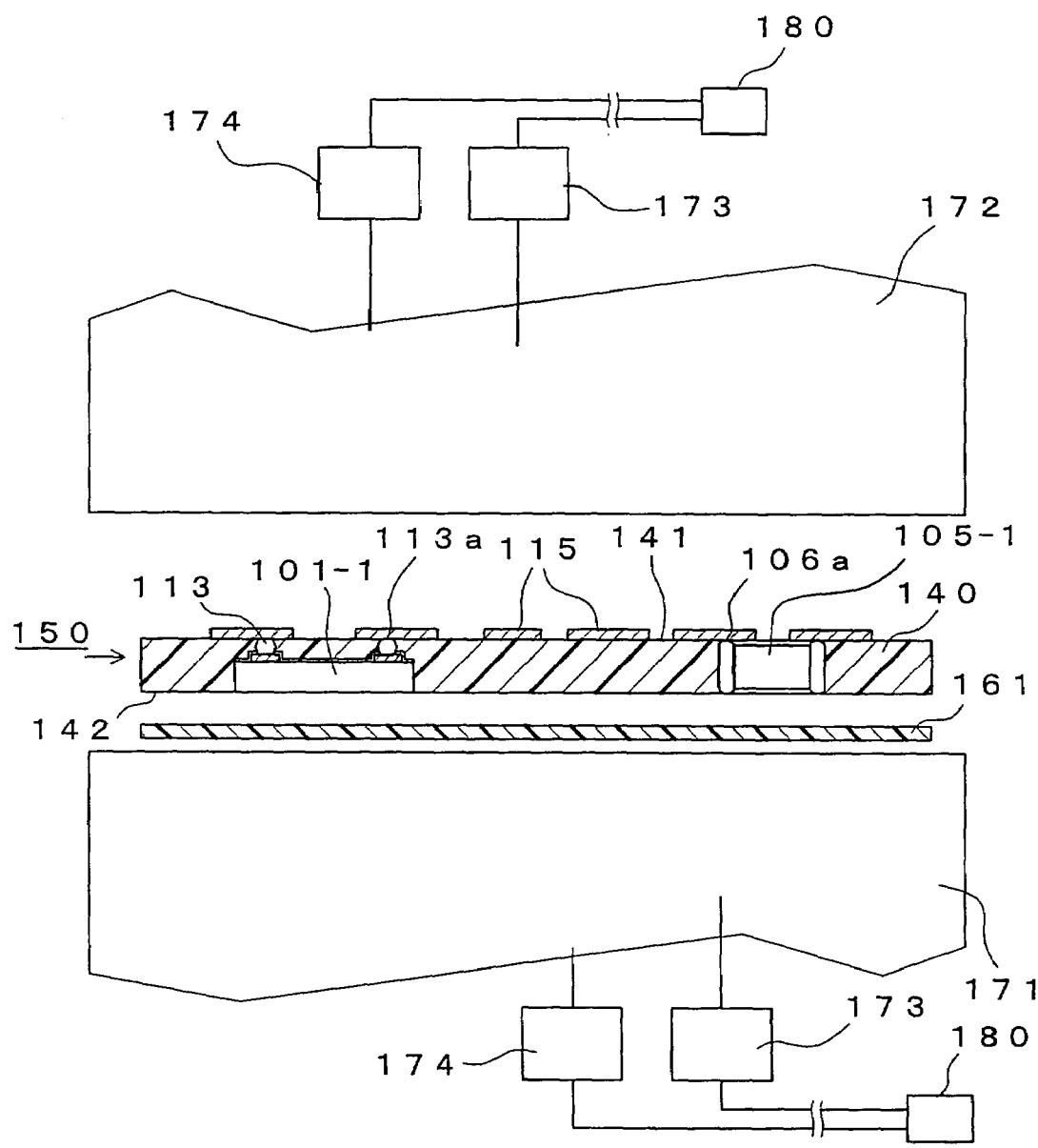
FIG. 9 is a view of the manufacturing process of the electronic component-mounted component shown in FIG. 1 for showing a state that another face of the base substrate is lamination-processed.

In a second embodiment, after forming the first electronic component-mounted component 150 in step 105 of FIG. 8, and before mounting the second electronic component on the first circuit patterns 115 in step 106, a second resin base-substrate 161 (the second resin base-substrate 161 is an example of a insulation protecting sheet) having electric insulating properties, such as polyethylene phthalate, polyvinyl chloride, polycarbonate, acrylonitrile butadiene, polyimide and epoxy is disposed on an opposite face 142 opposed to the circuit formation face 141 of the first electronic component-mounted component 150, and is heat-fused by lamination processing, by which the first electronic component-mounted component 150 is sealed. The lamination processing is performed by pressing and heating the second resin base-substrate 161 with hot pressing plates 171, 172 having a planar face as shown in FIG. 9. Processing conditions in a case of using a second resin base-substrate 161 made of, for example, polythene terephthalate, are such that pressure is $30 \times 10^5$ Pa, temperature is 160° C., pressing time is 1 minute, and pressure holding time is 1 minute.

Figure 10:
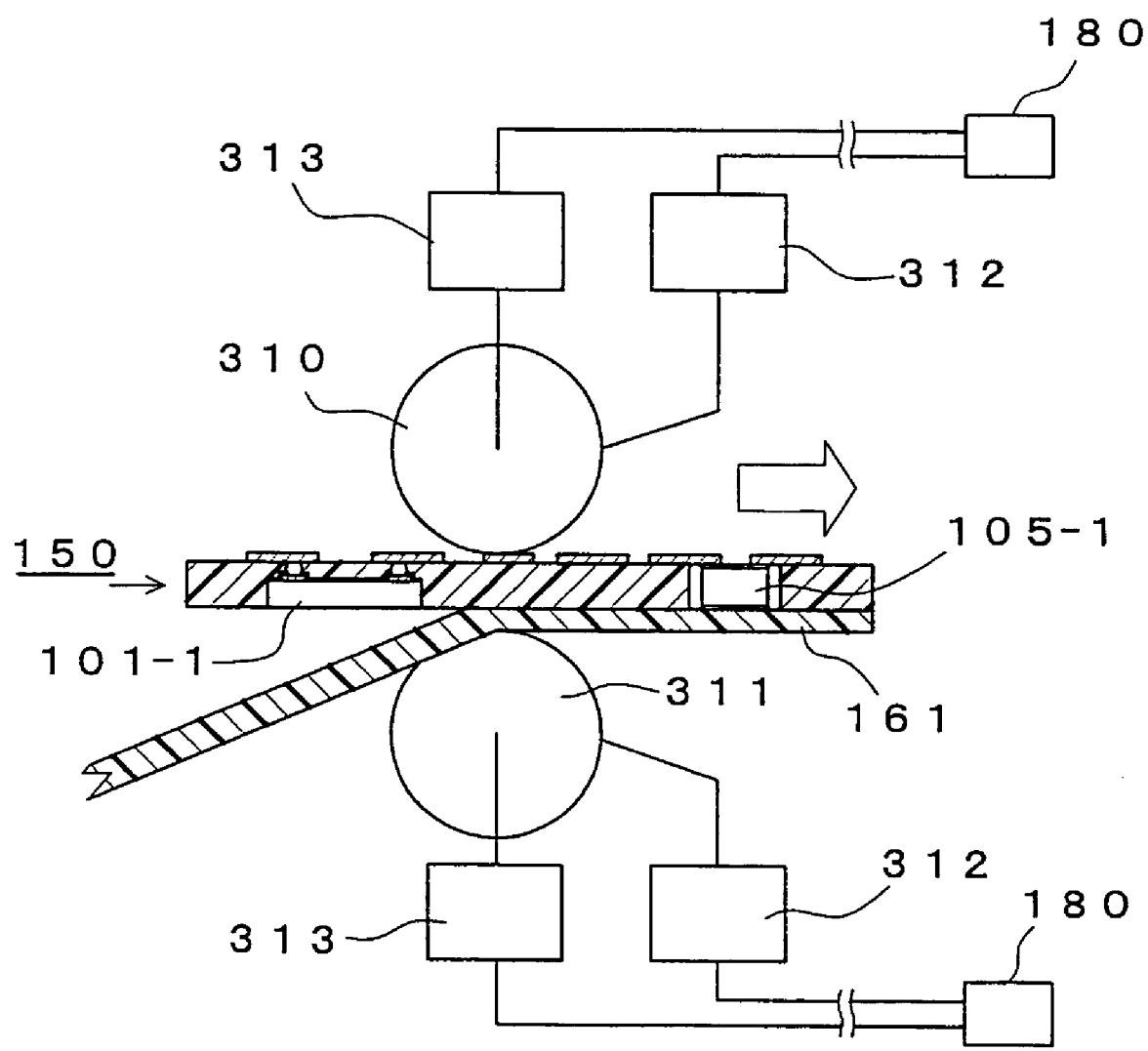
FIG. 10 is a view showing a modified example of an apparatus for performing lamination processing shown in FIG. 9.

Also, the lamination processing may be performed by a roll-press method shown in FIG. 10. In FIG. 10, reference numerals 310, 311 denote rollers that are heated by a heating apparatus 312 and rotated by a driving amount 313. The second resin base-substrate 161 is fed to between the rollers 310, 311 so that the first electronic component-mounted component 150 is pressed in a thickness direction, and the second resin base-substrate 161 is laminated and heat-fused in the thickness direction. Processing conditions in a case of using a second resin base-substrate 161 made of, for example, polythene terephthalate, are such that pressure is $30 \times 10^5$ Pa, temperature is 140° C., and a lamination rate is 0.1 m/min.

Figure 12:
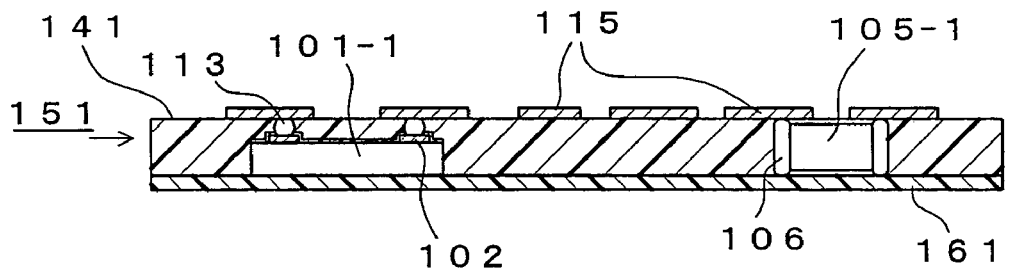
FIG. 12 is a view showing an electronic component-mounted component manufactured by the lamination processing shown in FIG. 9 and FIG. 10.

Through the above-described process, there is manufactured an electronic component-mounted component 151 shown in FIG. 12, that is a modified example of the above-described first electronic component-mounted component 150.

Figure 11:
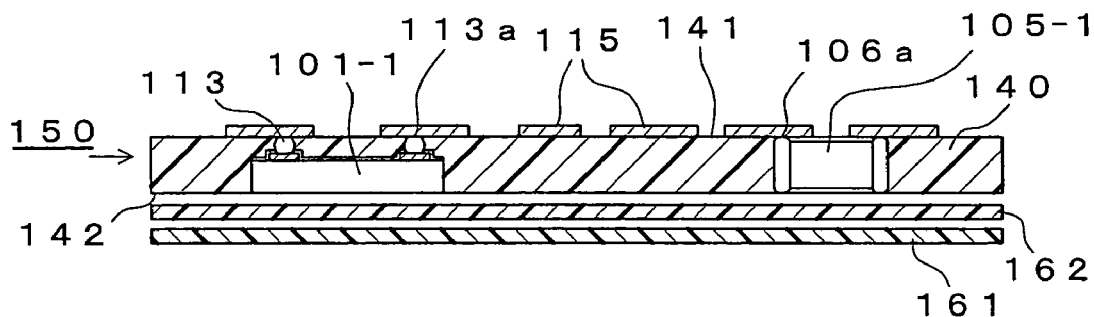
FIG. 11 is a view showing a modified example of the lamination processing shown in FIG. 9.

In executing a lamination step in a case where the first resin base substrate 140 and the second resin base-substrate 161, that are not heat-fused, are used as a material combination, there may be interposed a binder 162 such as epoxy and acryl between the first electronic component-mounted component 150 and the second resin base-substrate 161 as shown in FIG. 11.

Figure 13:
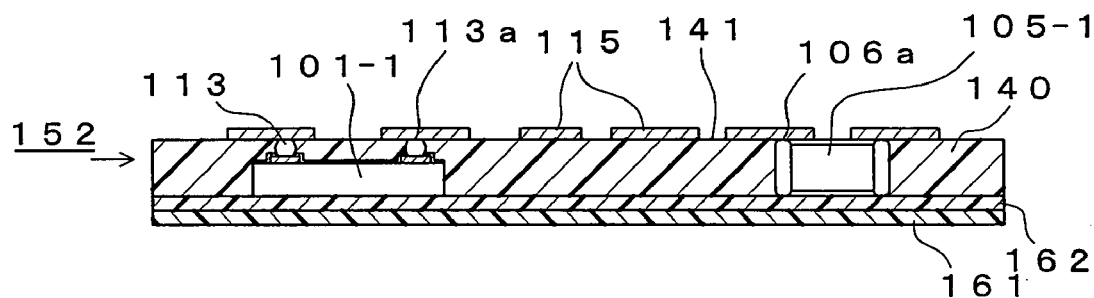
FIG. 13 is a view showing an electronic component-mounted component manufactured by the lamination processing shown in FIG. 11.

In this case, there is manufactured an electronic component-mounted component 152 shown in FIG. 13, that is a modified example of the above-described first electronic component-mounted component 150.

Figure 14:
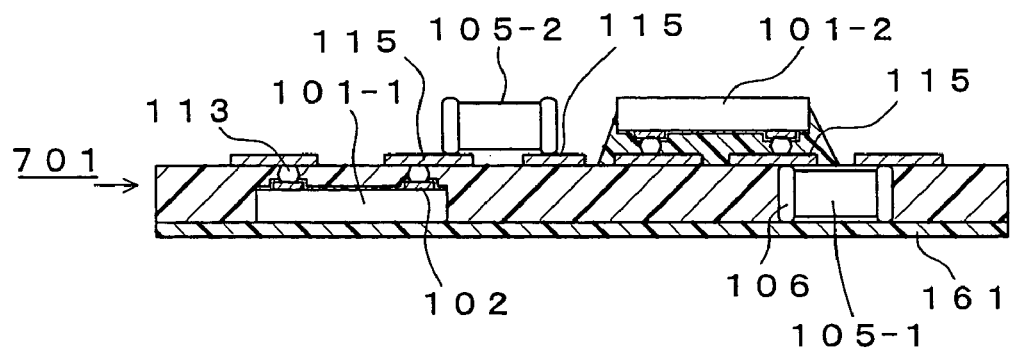
FIG. 14 is a view showing an electronic component-mounted component with second electronic components being mounted on the electronic component-mounted component shown in FIG. 12.

Then, as with the case of the first embodiment, these electronic component-mounted components 150, 151, 152 undergo mounting of semiconductor device 101-2 and capacitor component 105-2 as second electronic components on the first circuit patterns 115. Consequently, there is completed an MCM corresponding to one example that achieves a function of an electronic component-mounted component 701 as a module with the semiconductor device 101-2 and the capacitor component 105-2 mounted thereon as shown in FIG. 14.

According to the second embodiment, the semiconductor device 101-1 and the capacitor component 105-1 embedded in the first resin base substrate 140 are sealed by the second resin base-substrate 161, which makes a module superior in terms of moisture resistance as compared to the module of the first embodiment.

Third Embodiment

Figure 15:
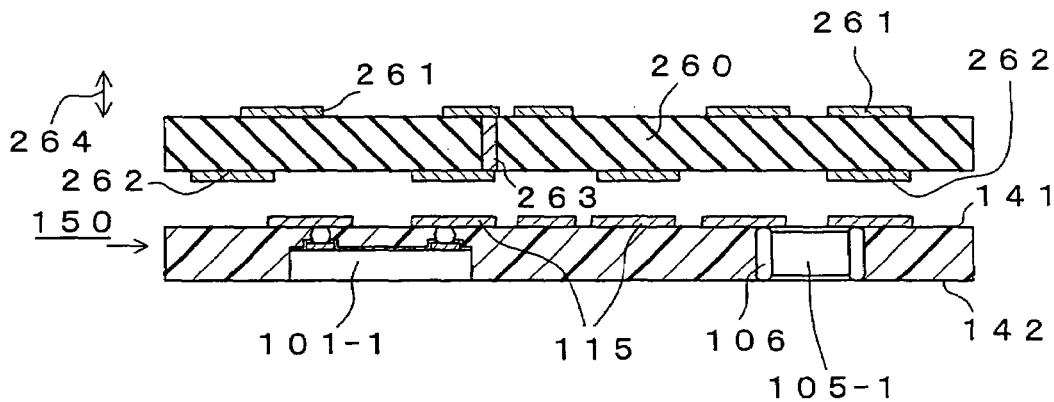
FIG. 15 is a view showing a step of bonding a first substrate on first circuit patterns of the electronic component-mounted component shown in FIG. 7.
Figure 16:
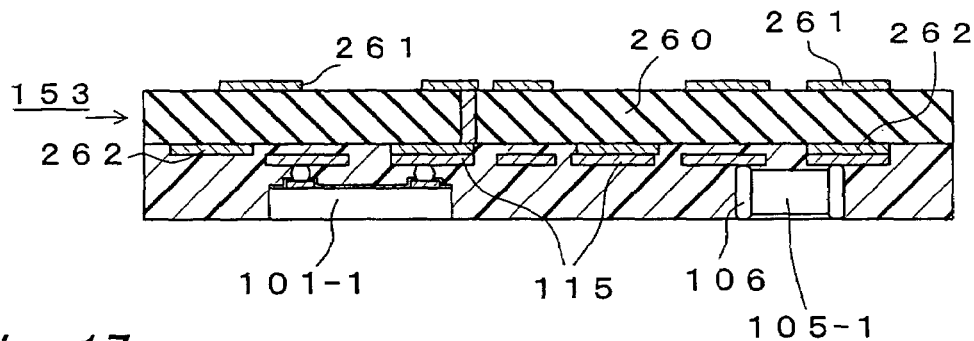
FIG. 16 is a view showing an electronic component-mounted component with the first substrate being bonded to the first circuit patterns of the electronic component-mounted component shown in FIG. 7.

In a third embodiment, after forming the first electronic component-mounted component 150 in step 105 shown in FIG. 8 and before proceeding to step 106, a first substrate 260 with a circuit pattern formed thereon is mounted on the first circuit patterns 115 of the first electronic component-mounted component 150 as shown in FIG. 15. The first substrate 260 is a general circuit board made of an insulation material that has been conventionally used as a circuit board such as glass epoxy, phenol and ceramic. Also, third circuit patterns 261 and fourth circuit patterns 262 are formed on both faces of the first substrate 260 that are opposite to each other in a thickness direction of the first substrate 260, and further there is formed, along thickness direction 264, a first substrate through hole 263 that is a through hole for electrically connecting the third circuit patterns 261 and the fourth circuit patterns 262. Therefore, the first substrate 260 is a substrate, both sides of which are mountable. The first electronic component-mounted component 150 and the first substrate 260 are joined by electrically connecting the first circuit patterns 115 of the first electronic component-mounted component 150 and the fourth circuit patterns 262 of the first substrate 260, and superposing them on top of each other in a thickness direction thereof. Next, there is interposed, for example, a conductive binder between the first electronic component-mounted component 150 and the first substrate 260, and lamination processing of the first electronic component-mounted component 150 is performed on the first substrate 260 so that the first electronic component-mounted component 150 is integrated with the first substrate 260. Thus, an electronic component-mounted component 153 shown in FIG. 16 is completed. It is noted that the first substrate through hole 263 refers to a "through hole" formed by forming a hole that connects both sides of the first substrate 260, and filling the hole with a conductor, or coating an inner circumferential face of the hole with a conductor, whereby the conductor and the hole is in an integrated state. Other "through holes" described later are also the same.

Figure 17:
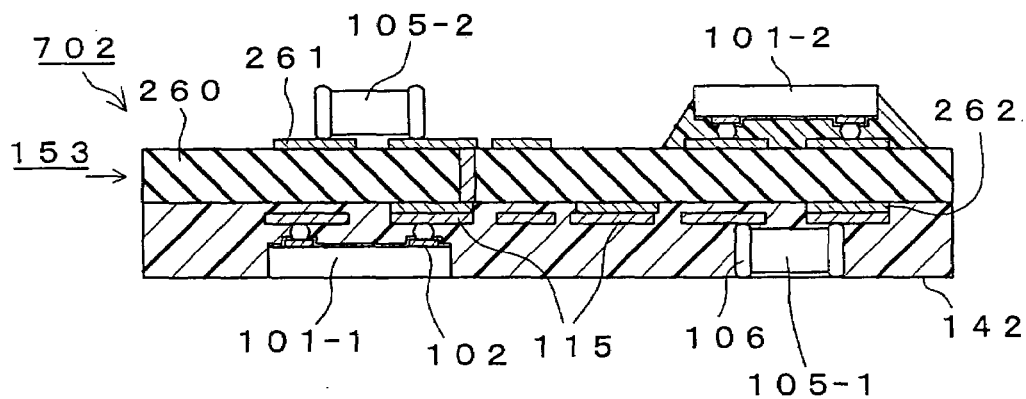
FIG. 17 is a view showing an electronic component-mounted component with second electronic components being mounted on the electronic component-mounted component shown in FIG. 16.

After manufacturing the electronic component-mounted component 153, semiconductor device 101-2 and capacitor component 105-2, that are the second electronic components, are mounted on the third circuit patterns 261 of the first substrate 260. Thus, there is completed an MCM corresponding to one example that achieves a function of an electronic component-mounted component 702 with the semiconductor device 101-2 and the capacitor component 105-2 mounted thereon as shown in FIG. 17.

Figure 18:
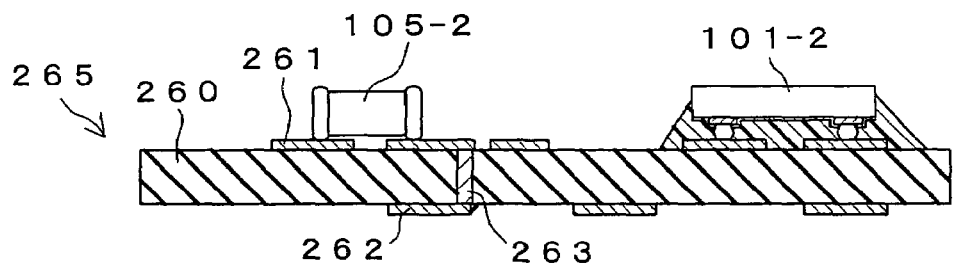
FIG. 18 is a view showing a first substrate having second electronic components mounted thereon.

It is noted that in the third embodiment, mounting of the second electronic components is executed after manufacturing of the electronic component-mounted component 153. However, as shown in FIG. 18, a first substrate 265 with the second electronic components mounted in advance on the third circuit patterns 261 may be joined to the first electronic component-mounted component 150.

Thus, in the third embodiment, like the first embodiment and the second embodiment described before, recent product needs of reduced thickness may be satisfied, a necessity of forming an electrode for wire boding in a peripheral portion of a semiconductor device may be eliminated, semiconductor devices of arbitrary sizes may be used, and therefore area pad-type semiconductor devices may be used.

Further in the third embodiment, using a general circuit board as the first substrate 260 enables application of a reflow technique, that is a conventional printing technique for surface mounting, and therefore a degree of difficulty in terms of module formation may be lowered.

Fourth Embodiment

Figure 19:
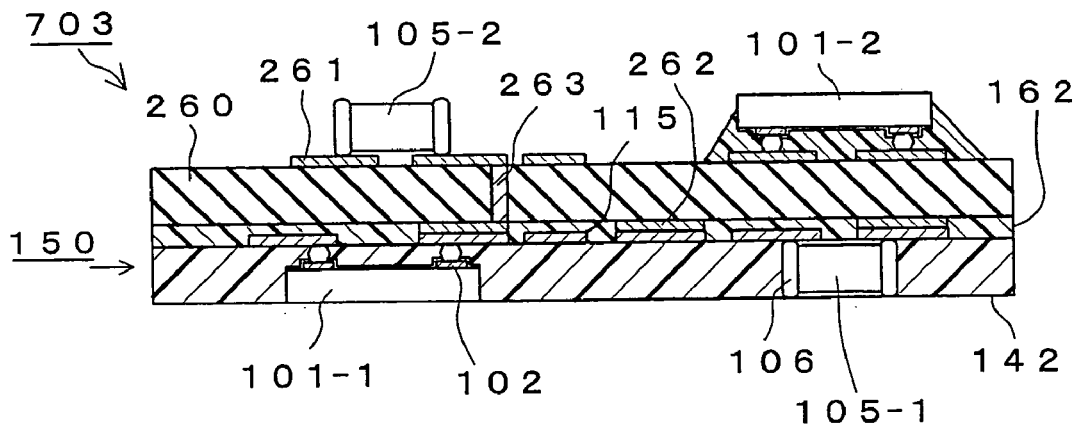
FIG. 19 is a view showing an electronic component-mounted component with a first substrate equipped with electronic components being bonded with binder to the first circuit patterns of the electronic component-mounted component shown in FIG. 7.
Figure 20:
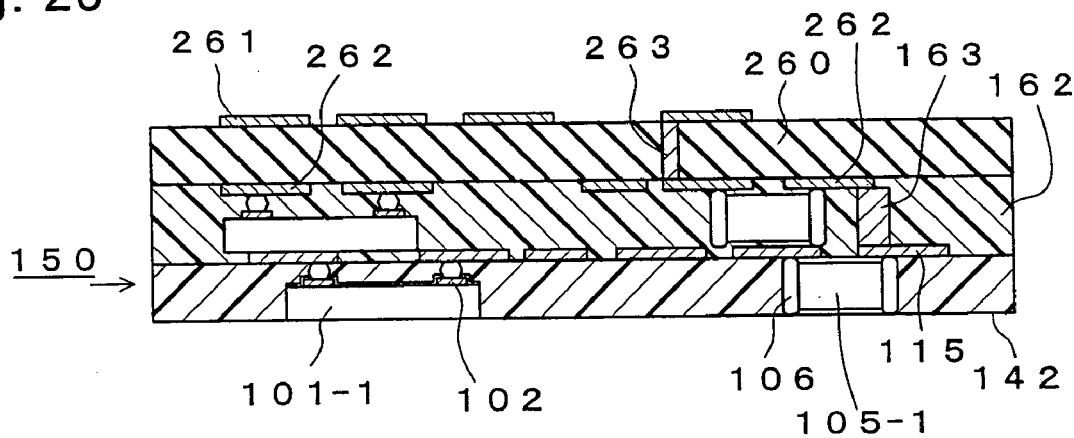
FIG. 20 is a view showing an electronic component-mounted component with a first substrate being bonded with binder to second electronic components of the electronic component-mounted component shown in FIG. 1.

In a fourth embodiment, in lamination-bonding the first substrate 260 or the first substrate 265 shown in FIG. 18 to the first electronic component-mounted component 150 after formation of the first electronic component-mounted component 150, it is structured that a binder 162 such as epoxy, acryl, anisotropic conductive sheets, and anisotropic conductive pastes is interposed between the first electronic component-mounted component 150 and the first substrate 260 or the first substrate 265 like an electronic component-mounted component 703 shown in FIG. 19. Herein, as shown in FIG. 20, increasing a thickness of the binder 162 makes it possible to laminate the first substrate 260 or the first substrate 265 on a side of second electronic components 101-2, 105-2 provided on the electronic component-mounted component 700 shown in FIG. 1. It is noted that in FIG. 20, reference numeral 163 denotes an electrode for electrically connecting fourth circuit patterns 262 of the first substrate 260 or the first substrate 265 to first circuit patterns 115 of the first electronic component-mounted component 150.

Figure 21:
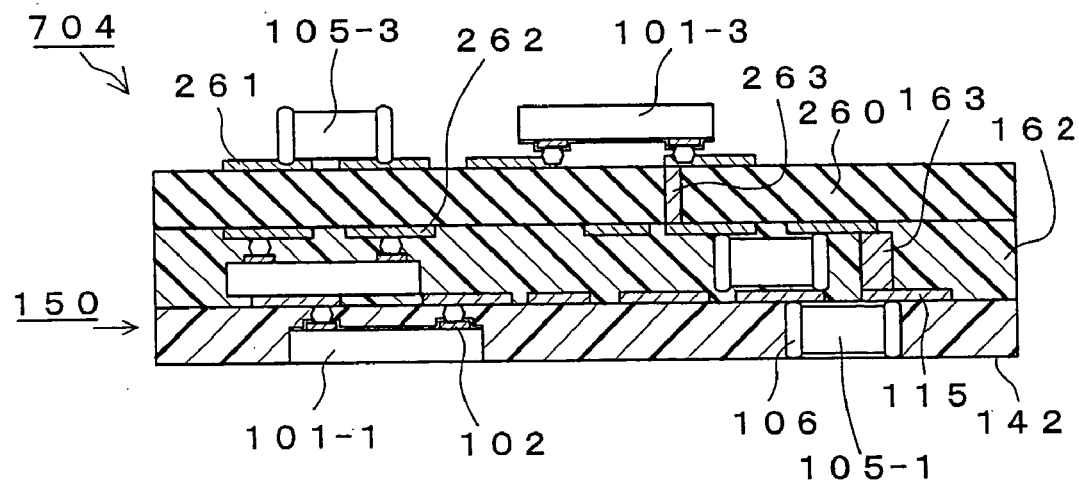
FIG. 21 is a view showing an electronic component-mounted component with third electronic components being mounted on the electronic component-mounted component shown in FIG. 20.

Also in the above-described case, when the first substrate 260 is joined to the first electronic component-mounted component 150, it becomes possible to mount a semiconductor device 101-3 and a capacitor component 105-3, that are third electronic components, on the third circuit patterns 261 of the first substrate 260 like an electronic component-mounted component 704 shown in FIG. 21. It is noted that a first substrate 265 with electronic components mounted in advance may be used. Therefore, order of a mounting process of the third electronic components 101-3, 105-3 is passed over.

Fifth Embodiment

Figure 22:
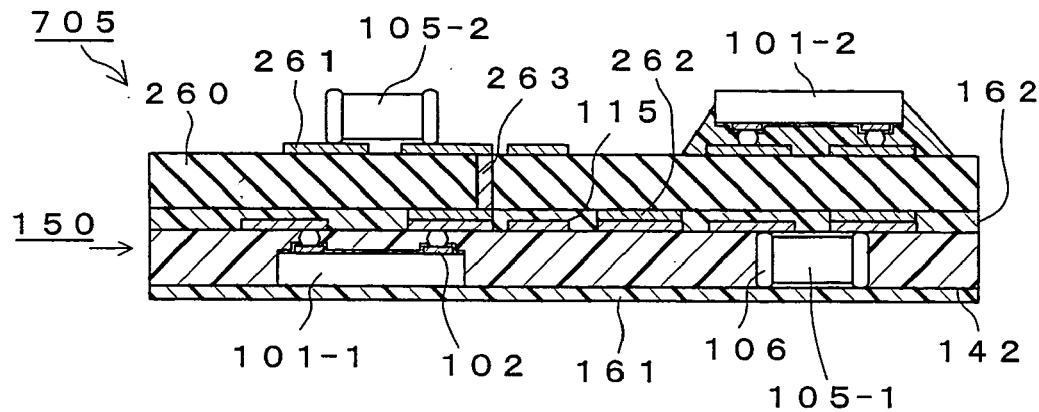
FIG. 22 is a view showing an electronic component-mounted component with another face of the base substrate of the electronic component-mounted component shown in FIG. 19 being lamination-processed.

In a fifth embodiment, like an electronic component-mounted component 705 shown in FIG. 22, on an opposite face 142 opposed to a circuit formation face 141 of the first electronic component-mounted component 150 provided on each of the electronic component-mounted components 702, 703, 704 manufactured in the third and the fourth embodiments, a second resin base-substrate 161 having electric insulating properties, such as polyethylene phthalate, polyvinyl chloride, polycarbonate, acrylonitrile butadiene, polyimide and epoxy is disposed, and the first electronic component-mounted component 150 is lamination-processed. Thus, an electronic component-mounted component 705 with the second resin base-substrate 161 being heat-fused to the first electronic component-mounted component 150 may be manufactured.

Thus, by executing lamination-processing of the second resin base-substrate 161, the semiconductor device 101-1 and the capacitor component 105-1 embedded in the first resin base substrate 140 are sealed by the second resin base-substrate 161 as with the case of the second embodiment, which enables provision of a module excellent in terms of moisture resistance.

Sixth Embodiment

Figure 23:
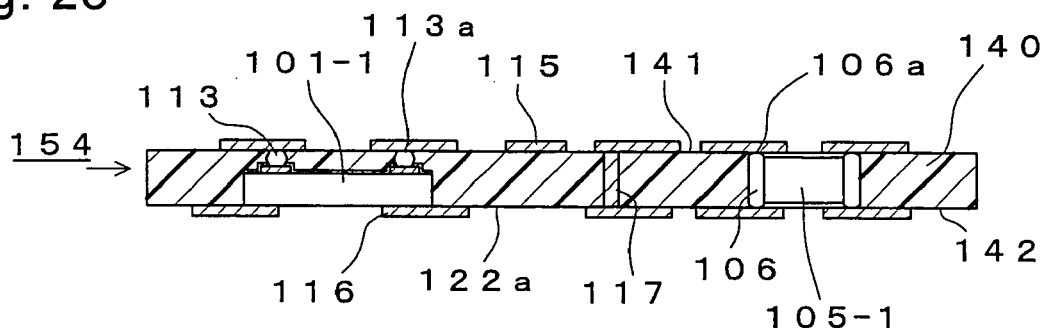
FIG. 23 is a view showing an electronic component-mounted component with second circuit patterns being formed on another face of the base substrate of the electronic component-mounted component shown in FIG. 7.

A sixth embodiment as shown in FIG. 23 is different from the above-described first to fifth embodiments in that an electronic component-mounted component 154 with circuit patterns formed on both sides of the first resin base substrate 140 is used. The electronic component-mounted component 154 is formed by the same formation method of the above-stated first electronic component-mounted component 150, though the electronic component-mounted component 154 has a through hole 117 that is an example of a through hole that passes through the first resin base-substrate 140 along a thickness direction of the first resin base substrate 140. The through hole 117 is formed by pressing with a mold or with an NC puncher. The through hole 117 is filled with a conductive material when first circuit patterns 115 are formed, and is electrically connected to later-formed second circuit patterns 116.

Figure 24:
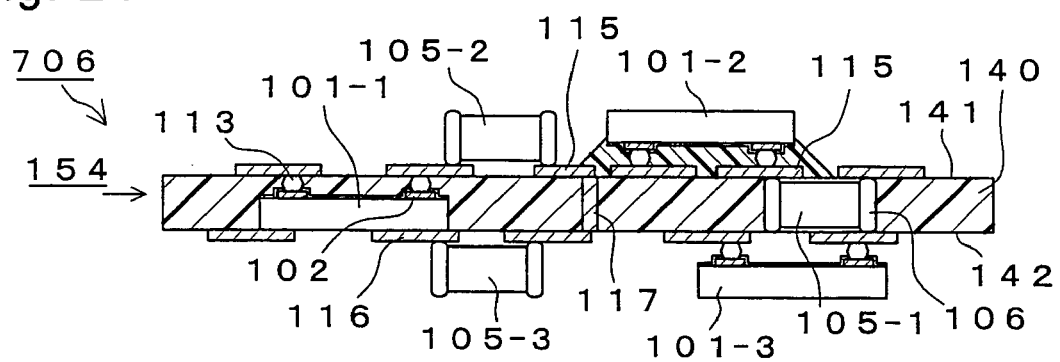
FIG. 24 is a view showing an electronic component-mounted component with an electronic component being mounted on the first and second circuit patterns of the electronic component-mounted component shown in FIG. 23.

Various processing as mentioned earlier may be applied to the thus-formed electronic component-mounted component 154. For example, like an electronic component-mounted component 706 shown in FIG. 24, semiconductor device 101-2 and capacitor component 105-2, that are the second electronic components, are mounted on the first circuit patterns 115, and further semiconductor device 101-3 and capacitor component 105-3 corresponding to the third electronic components may be mounted on the second circuit patterns 116. It is noted that an order of mounting the second electronic components and the third electronic components is not specifically defined.

Also, in the electronic component-mounted component 154 shown in FIG. 23, the second circuit patterns 116 are formed on opposite face 142. However, it is also possible to form an electronic component-mounted component 155 with the through hole 117 electrically connected to first circuit pattern 115 without forming second circuit patterns 116. With use of the electronic component-mounted component 155, an electronic component-mounted component 707 shown in FIG. 25 may be structured. In the electronic component-mounted component 707, on the opposite face 142 of the first resin base-substrate 140 constituting the electronic component-mounted component 155, a second substrate 270 having the same structure as the aforementioned first substrate 260 is disposed so that a sixth circuit pattern 272 of the second substrate 270 is electrically connected to the through hole 117. Herein, the second electronic components 101-2, 105-2 may be mounted on the electronic component-mounted component 155, or they may be mounted later. Also, the semiconductor device 101-3 and the capacitor component 105-3 as the third electronic components may be mounted on fifth circuit patterns 271 of the second substrate 270, or they may be mounted later.

Figure 26:
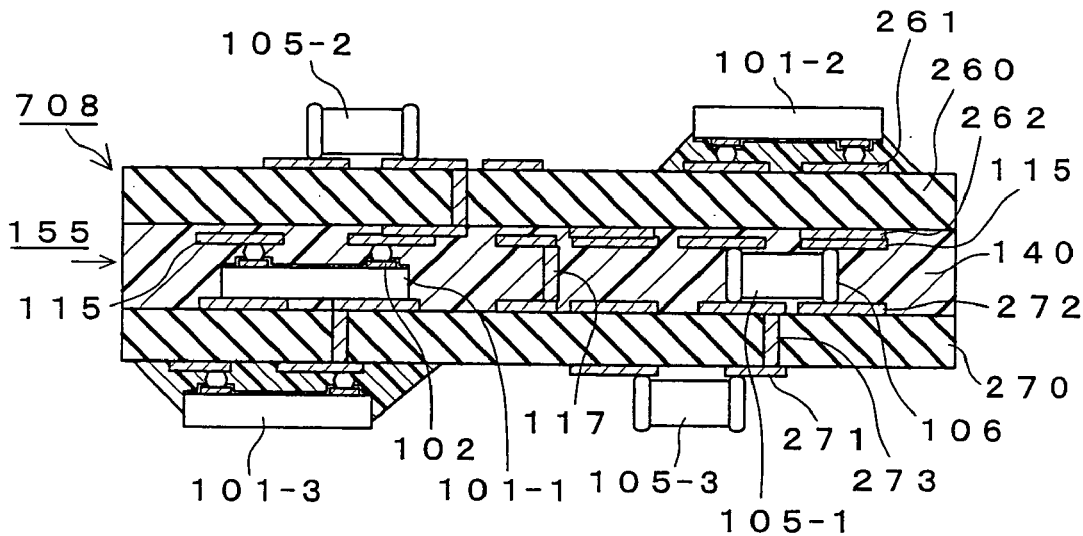
FIG. 26 is a view showing an electronic component-mounted component with conductive through-holes provided in the base substrate of the electronic component-mounted component shown in FIG. 17, and further with a second substrate as shown in FIG. 18 being mounted on another face of the substrate.

Also, an electronic component-mounted component 708 as shown in FIG. 26 may be structured with use of the electronic component-mounted component 155. In the electronic component-mounted component 708, the electronic component-mounted component 155 is lamination-processed from both sides of a thickness direction thereof on the first substrate 260 and the second substrate 270. On the first substrate 260 and the second substrate 270 to be installed in the electronic component-mounted component 155, the second electronic components 101-2, 105-2, and the third electronic components 101-3, 105-3 may be mounted in advance or may be mounted after installation.

Figure 27:
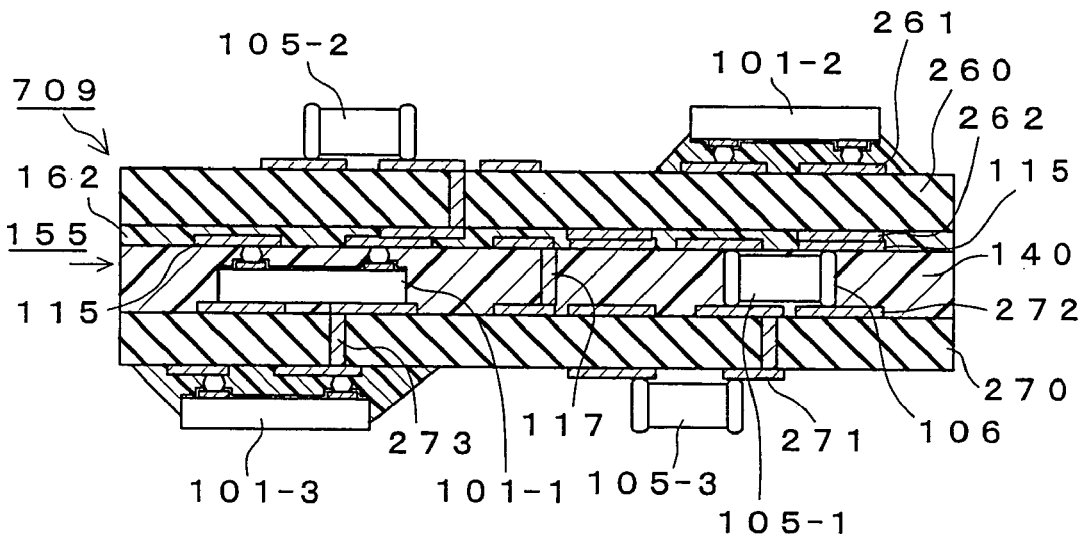
FIG. 27 is a view showing an electronic component-mounted component with conductive through-holes provided in the base substrate of the electronic component-mounted component shown in FIG. 19, and further with a second substrate as shown in FIG. 18 being mounted on another face of the substrate.

Furthermore, an electronic component-mounted component 709 as shown in FIG. 27 may be structured with use of the electronic component-mounted component 155. The electronic component-mounted component 709 has a structure of the electronic component-mounted component 708, in which the electronic component-mounted component 155 and the first substrate 260 are joined by a binder 162 like the electronic component-mounted component 703 described with reference to FIG. 19.

Thus, there may be deployed various forms consisting of combinations of the electronic component-mounted component 154 shown in FIG. 23 and the electronic component-mounted component 155 shown in FIG. 25 and various forms described with reference to FIG. 9 through FIG. 22. Eventually, FIG. 24 to FIG. 27 show only part of possible combinations.

Seventh Embodiment

Figure 25:
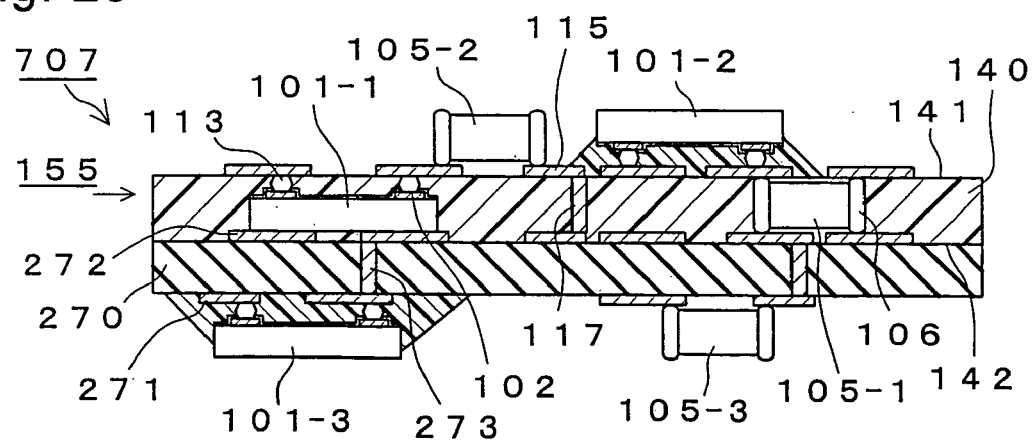
FIG. 25 is a view showing an electronic component-mounted component with conductive through-holes provided in the base substrate of the electronic component-mounted component shown in FIG. 1, and further with a second substrate as shown in FIG. 18 being mounted on another face of the substrate.
Figure 28:
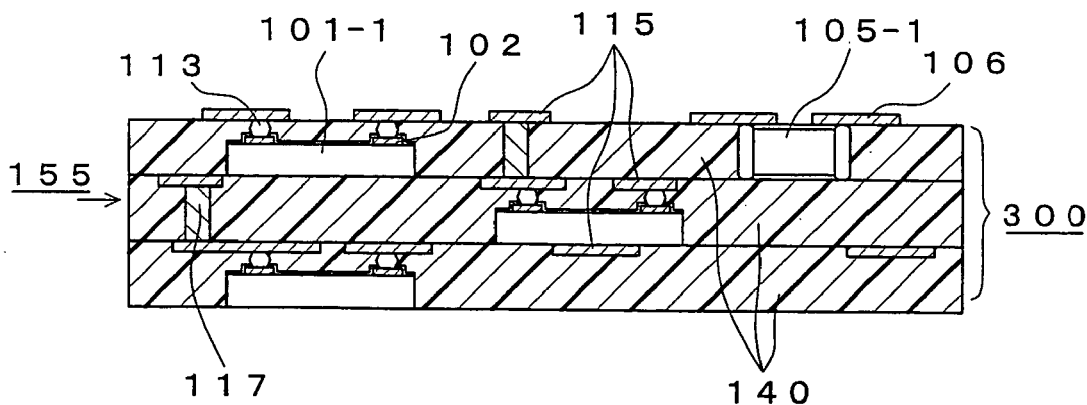
FIG. 28 is a view showing an electronic component-mounted component formed by laminating a plurality of electronic component-mounted components with conductive through-holes provided in the base substrate of the electronic component-mounted component shown in FIG. 7.

An electronic component-mounted component 300 shown in FIG. 28 in a seventh embodiment has a structure in which a plurality of electronic component-mounted components 155 described with reference to FIG. 25 are superposed in a thickness direction and lamination-processed. Lamination-processing conditions in a case of using a first resin base-substrate 140 made of, for example, polythene terephthalate, are such that pressure is $30 \times 10^5$ Pa, temperature is 160° C., pressing time is 1 minute, and pressure holding time is 1 minute.

Figure 29:
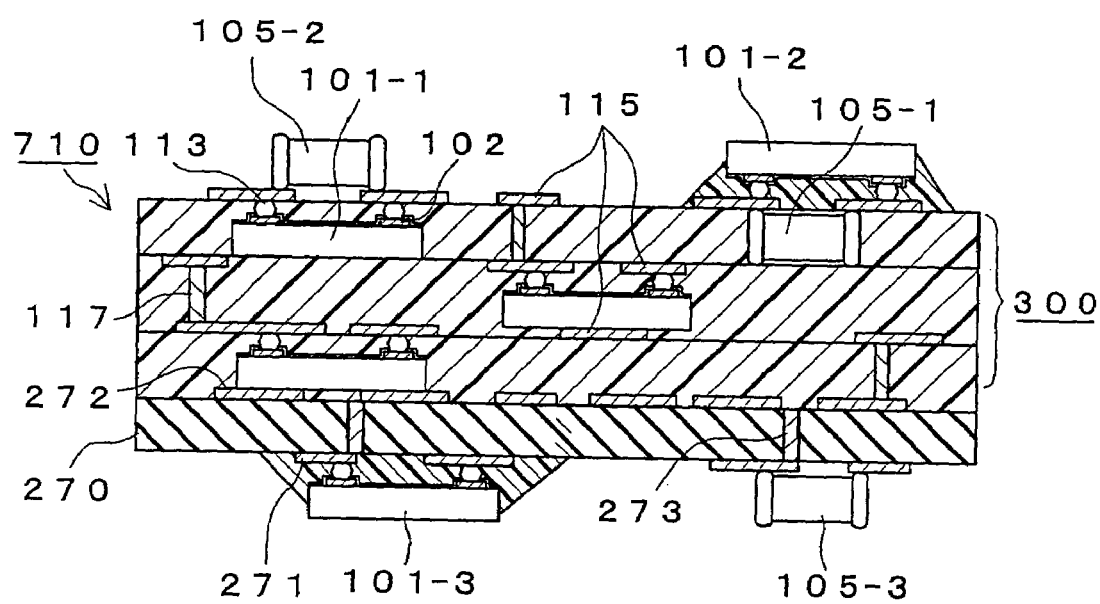
FIG. 29 is a view showing an electronic component-mounted component formed by mounting second electronic components on the first circuit patterns of the electronic component-mounted component shown in FIG. 28, and further mounting a second substrate as shown in FIG. 18 on another face of the substrate of the electronic component-mounted component.

Various combinations may be implemented for the electronic component-mounted component 300 formed as described above as with the aforementioned sixth embodiment, including mounting of semiconductor device 101 and capacitor component 105, and joining of the first substrate 260 or the first substrate 265 shown in FIG. 18 having the semiconductor device 101 and the capacitor component 105 mounted in advance thereon. FIG. 29 is a view showing an electronic component-mounted component 710 as one example of an electronic component-mounted component manufactured by such combinations.

Eighth Embodiment

In the foregoing first to seventh embodiments, there is a step of embedding the semiconductor device 101-1 and the capacitor component 105-1 in the first resin base-substrate 140. However, there may be used a base substrate in which the electronic components including semiconductor device 101 and capacitor component 105 are molded in advance in a resin base substrate by injection molding and the like. Then, on the base substrate, a circuit pattern may be formed to form an electronic component-mounted component 150 or the like.

Figure 30:
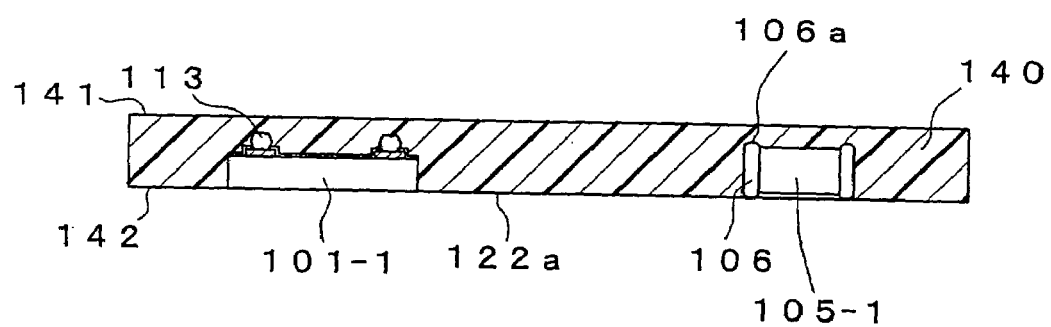
FIG. 30 is a view showing a case where electrodes of a first electronic component embedded in a base substrate are not exposed from the base substrate.

Also, as shown in FIG. 30, in the electronic component-mounted component 150 after the semiconductor device 101-1 and the capacitor component 105-1 are embedded in the first resin base-substrate 140, or the electronic component-mounted component 150 with the electronic components already embedded in the first resin base-substrate 140 and the like, if the bumps 113 of the semiconductor device 101-1 and the electrodes 106 of the capacitor component 105-1 are not exposed from the circuit formation face 141, the circuit formation face 141 may be subjected to polishing and plasma-etching or the like to expose the bumps 113 and the electrodes 106 from the circuit formation face 141, and then formation of circuit patterns may be performed.

Ninth Embodiment

Next, detailed description will be given of a method for manufacturing an electronic component-mounted component in a case of exposing each of the bumps and electrodes by performing the above polishing, plasma-etching or the like in a ninth embodiment and following embodiments thereof with reference to drawings.

Figure 37:
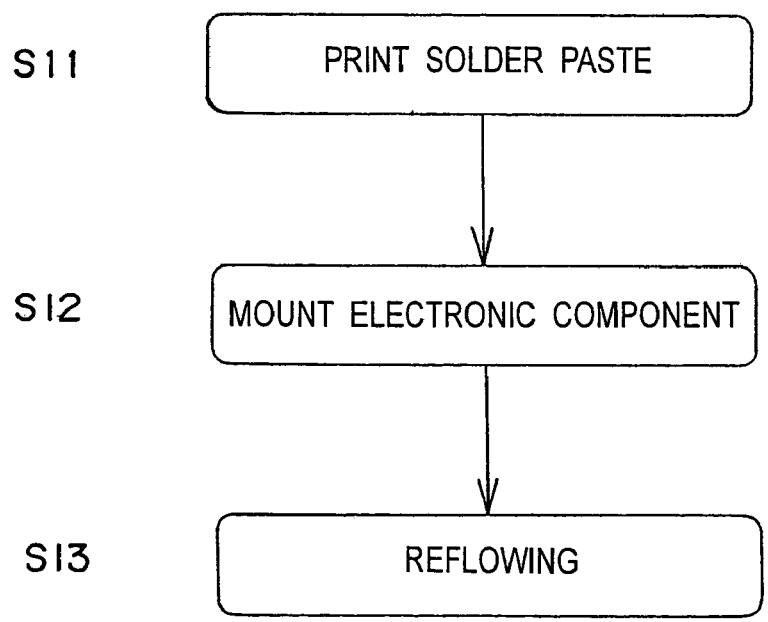
FIG. 37 is a flowchart showing a manufacturing process of the conventional electronic component-mounted component.
Figure 34A:
FIGS. 34A, 34B, 34C and 34D are, respectively, a partial cross sectional view, a plane view, a partial cross sectional view, and a plane view of a manufacturing process of an electronic component-mounted component for describing a step of mounting a plurality of electronic components and dividing into pieces per module, in a modified example of the eleventh embodiment of the present invention.
Figure 34B:
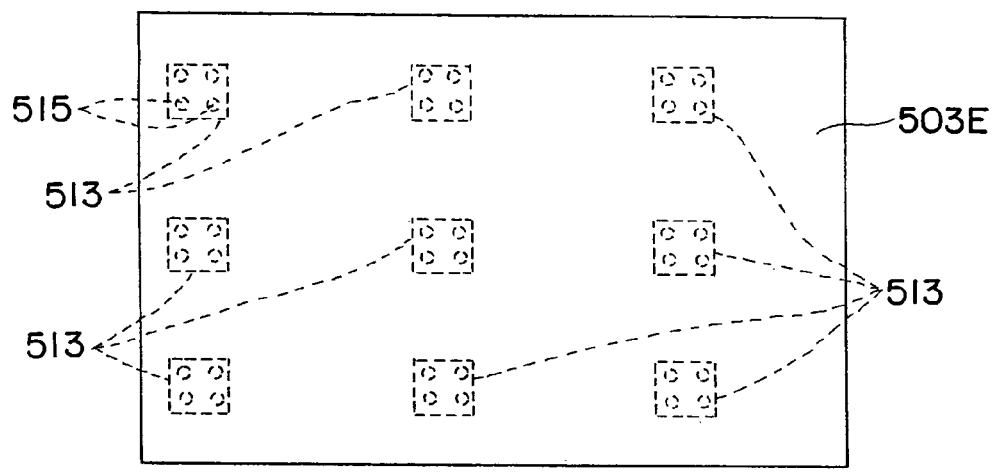
Figure 34C:
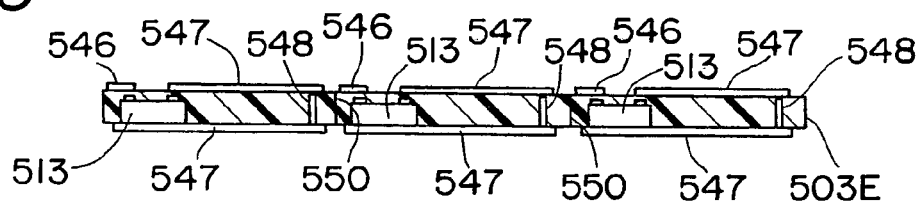
Figure 34D:
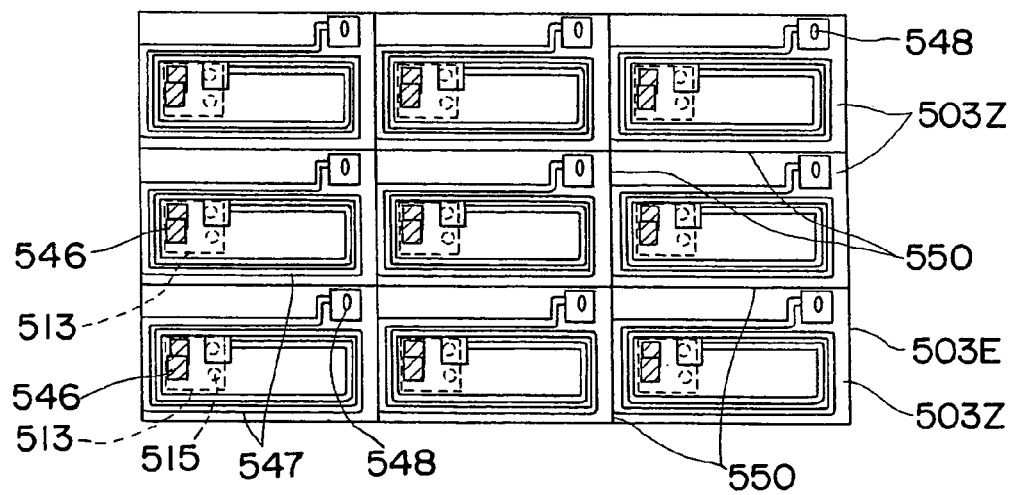

Before describing each of the ninth embodiment and the following embodiments, first, another conventional manufacturing method different from the foregoing conventional manufacturing method of the electronic component-mounted component will be described with reference to FIG. 36 and FIG. 37.

Conventionally, in CSP, MCM, memory modules with electronic components such as semiconductor devices and passive components being mounted thereon, there is adopted a method for heating and pressure-welding a semiconductor device on a carrier substrate via conductive adhesive or a sheet. Also, an electronic component is mounted by a method for printing a solder paste on specified circuit patterns on a carrier substrate and then reflowing the solder paste.

Figure 36:
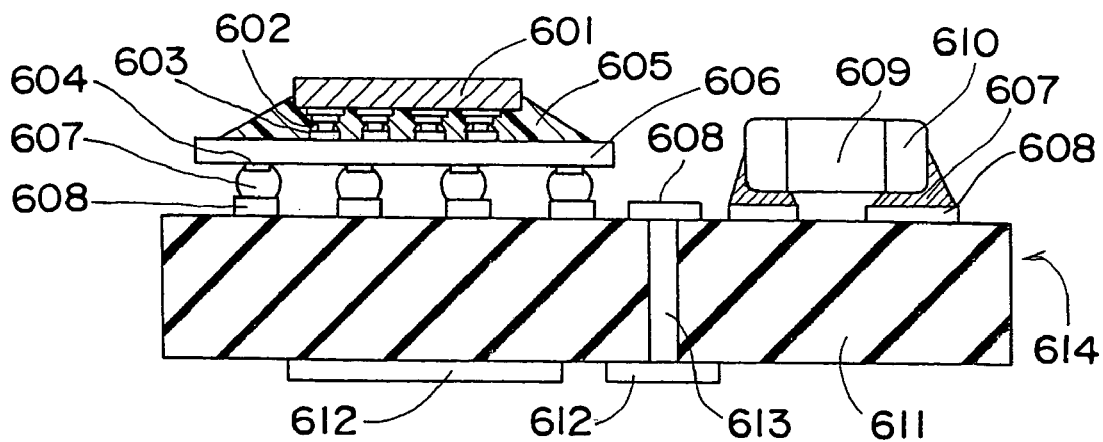
FIG. 36 is a partial cross sectional view showing a conventional electronic component-mounted component.

More specifically, as shown in FIG. 36, an electronic component-mounted component is formed such that protruding electrodes 602 formed on unshown electrode pads of a semiconductor device 601 are electrically joined to electrodes 603 on a carrier substrate 606 via an unshown anisotropic conductive adhesive. It is noted that an encapsulant 605 is injected and hardened inbetween the semiconductor device 601 and the carrier substrate 606 for increasing a joining strength thereof.

Also, the carrier substrate 606 and an electronic component 609 are joined to each other through joining of specified electrodes 604 on the carrier substrate 606 and electrodes 610 of the electronic component 609, and specified electrodes 608 of a mother board 611 via solder paste 607. It is noted that reference numeral 613 in FIG. 36 denotes a through hole having a conductor formed therein for electrically joining the electrode 608 on a surface of the mother board 611 and a circuit pattern 612 on a back face of the mother board 611. In a module that fulfills a function of a CSP product only with one face on which the electrodes 608 are formed, the through hole 613 is not necessary. The manufacturing process thereof is structured such, as shown in FIG. 37, that first in step (referred to as "S" in the drawing) 11, solder paste 607 is printed and applied on specified electrodes 608 on the mother board 611. The solder paste 607 is printed generally by a screen printing method.

Next in step 12, the carrier substrate 606, with the semiconductor device 601 mounted thereon, and the electronic component 609 are aligned and mounted on the solder paste 607 formed on the mother board 611 by the above printing method.

Next in step 13, the carrier substrate 606, with the semiconductor device 601 mounted thereon, and the mother board 611, with the electronic component 609 mounted thereon, are put in a reflow furnace so that the solder paste 607 is melted and then hardened.

Thus, a memory module 614 as an electronic component-mounted component is manufactured.

However, the above-described conventional method for manufacturing the electronic component-mounted component, as well as an MCM, memory modules and the like, as the electronic component-mounted components manufactured by the above manufacturing method of an electronic component-mounted component, have following problems in terms of their structure.

For mounting electronic components such as a CSP on the mother board 611, a height of a module in a thickness direction is increased, which makes it impossible to satisfy recent product needs of reduced thickness.

Consequently, the module is susceptible to an influence of bending, and it is hard to soften the module, which makes it difficult to apply the module to such configuration as curved surfaces. Also, there is required an area for mounting the electronic component 609 and the carrier substrate 606 onto the mother board 611. Eventually, a number of electronic components mountable on one mother board 611 and an area for forming circuit patterns are determined by a size of the mother board 611, which makes it impossible to satisfy recent product needs of downsizing of the mother board 611.

Further, since the semiconductor device 601 and the solder paste 607 are directly exposed to air, use thereof in an environment of high temperature and high humidity causes oxidation, which tends to cause an electric short-circuit, open fault, and reduction of joining strength. Further, presence of dispersion of temperature in the reflow furnace disables increase of substrate size. This makes batch-processing a main stream, thereby resulting in poor productivity.

In view of the background of this conventional method for manufacturing an electronic component-mounted component, description will be given of the ninth embodiment of the present invention hereinbelow.

FIGS. 31A, 31B, 31C and 31D are fragmentary cross sectional views each showing a manufacturing process of a method for manufacturing an electronic component-mounted component according to the ninth embodiment of the present invention. This manufacturing process consists of a step of inserting, e.g., embedding, an electronic component as a first electronic component in a base substrate, and a step of exposing electrodes of this embedded electronic component from a surface of this sheet base substrate.

Here, as one example, there is described a method for forming a sheet module exemplifying an electronic component-mounted component in which an electronic component 501 including capacitor components, passive components such as resist components, semiconductor devices and CSP components, is embedded in a thermoplastic resin sheet base-substrate 503 exemplifying a base substrate. It is noted that the electronic component-mounted component is not limited to such a sheet module, but may include, for example, an MCM (Multi Chip Module).

Preferably, the thermoplastic resin sheet base-substrate 503 has electrical insulation properties like polyethylene phthalate, polyvinyl chloride, polycarbonate, acrylonitrile butadiene and thermoplastic polyimide, and a thickness thereof is 10 μm to 1 mm.

FIGS. 31A, 31B, 31C and 31D are fragmentary cross sectional views each showing one example of a step of embedding the electronic component 501 in the thermoplastic resin sheet base-substrate 503. It is noted that embedding of the electronic component 501 in the thermoplastic resin sheet base-substrate 503 may be achieved by methods other than the method stated above.

Figure 31A:
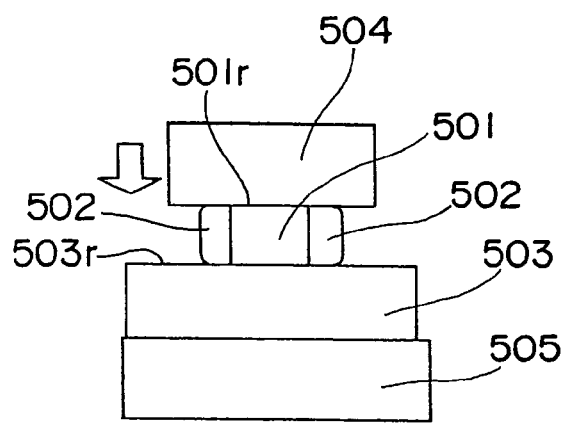
FIGS. 31A, 31B, 31C and 31D are fragmentary cross sectional views each showing a manufacturing process of a method for manufacturing an electronic component-mounted component according to a ninth embodiment of the present invention.

FIG. 31A is a fragmentary cross sectional view showing a state prior to embedding the electronic component 501 in the thermoplastic resin sheet base-substrate 503, wherein the thermoplastic resin sheet base-substrate 503 is placed on a heating stage 505, and the electronic component 501 having a plurality of electrodes 502 is placed on top of the thermoplastic resin sheet base-substrate 503. A press tool 504 is disposed on top of the electronic component 501. It is noted that a surface of the heating stage 505 and the press tool 504 are preferably planar and made of glass, stainless steel, ceramic and polytetrafluoroethylene like, for example, Teflon (registered trademark). Though not shown in this figure, a base substrate such as ceramic plates and Teflon (registered trademark) sheets may be interposed between a capacitor component 501 as an example of the electronic component 501 and the press tool 504, or between the sheet base-substrate 503 and the heating stage 505. The base substrate is interposed as described above because the thermoplastic resin sheet base-substrate 503 is gelled and obtains viscosity when it is heated over its glass transition point, so that the sheet-substrate 503 adheres to a heating tool 4 and stage 5, and sticks thereon. If cooled in this state, the sheet-substrate 503 is hardened and contracted, which makes it further stick thereon. Therefore, it is desirable to use a base substrate such as Teflon (registered trademark) as a release member. For example, when a semiconductor device having a thickness of 180 µm, exemplifying the electronic component 501, is embedded in a polyester terephthalate substrate exemplifying the base substrate, it is desirable to dispose Teflon (registered trademark) having a thickness of 50 µm to 100 µm therebetween. The base substrate is disposed therebetween because polyester terephthalate has a glass transition point of 120° C., at which the heating tool is heated up to 200° C. In view of heat resistance, polytetrafluoroethylene is preferable. It is noted that if the thickness thereof is too large, the semiconductor device is embedded not in the thermoplastic base substrate but in a release paper, whereas if the thickness is too small, there is the possibility that the release paper is broken when it is brought into contact with a back face of the semiconductor device. When a semiconductor device of 0.180 mm in thickness, having protruding electrodes of 0.040 mm in height, is embedded in a PET sheet base-substrate of 0.200 mm in thickness, an appropriate thickness of Teflon (registered trademark) is 0.050 to 0.100 mm.

In the embedding step, the electronic component 501 is pressed into the thermoplastic resin sheet base-substrate 503 while the heated press tool 504 is pressed an arbitrary load toward the heating stage 505, so that the electronic component 501 is embedded in the thermoplastic resin sheet base-substrate 503. In this state, a back face 501r of the electronic component 501 in contact with the press tool 504 forms a plane approximately identical to a back face 503r of the sheet-substrate 503.

Figure 31B:
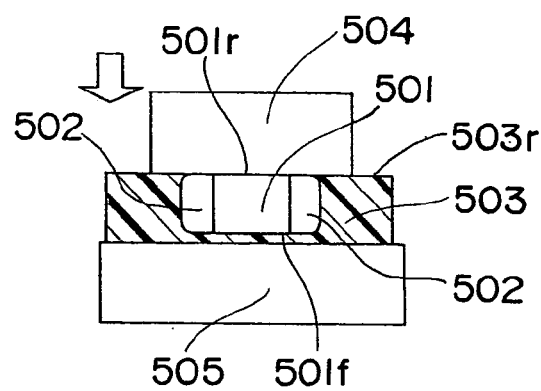

FIG. 31B is a view showing a state of the electronic component 501 embedded in the thermoplastic resin sheet base-substrate 503. It is noted that when the thermoplastic resin sheet base-substrate 503 is heated while the electronic component 501 is being embedded therein, the thermoplastic resin sheet base-substrate 503 is preferably heated such that the heating temperate is between a glass transition point of the thermoplastic resin sheet base-substrate 503 and an upper-limit temperature at which viscosity of the thermoplastic resin sheet base-substrate 503 decreases and the electronic component 501 passes through the thermoplastic resin sheet base-substrate 503. For example, in a case where an electronic component consisting of a chip capacitor of 0.3 mm×0.6 mm×0.3 mm is embedded in a sheet substrate made of polyethylene terephthalate, it is desirable that the sheet substrate made of polyethylene terephthalate has: a thickness of 0.3 to 0.4 mm; resin temperature during an embedding operation of 150 to 170° C.; a load of 40 to 50 kgf (392.4 to 490.5N) or pressure of approximately $2.9 \times 10^6$ Pa; and a pressing time of 20 seconds to 150 seconds.

Next, the press tool 504 is lifted, and the sheet-substrate 503 with the electronic component 501 embedded therein is detached from the heating stage 505 and cooled down to room temperature, by which the sheet-substrate 503 is hardened and the electronic component 501 is embedded in the sheet-substrate 503.

However at this point, each of the electrodes 502 of the electronic component 501 embedded in the sheet-substrate 503 does not break through the sheet-substrate 503 nor protrude from a surface of the sheet-substrate, and therefore only the back face 501r of the electronic component 501 in contact with the press tool 504 forms a plane approximately identical to the back face 503r of the sheet-substrate 503, which signifies that only one side of sheet surfaces (that is the back face 501r of the electronic component 501 in this case) is exposed from a surface on a side of the back face 503r of the sheet-substrate 503, so that joining with each of the electrodes 502 on a side of the top face 501f of the electronic component 501 is not attained. For example, in the above-stated example, a maximum distance from the electrode to the surface of the sheet-substrate 503 is 0.4 mm−0.3 mm=0.1 mm=100 µm. Also, in a case of an electronic component having electrodes only on one side, such as IC chips (that is, on the front face of an IC chip), electric joining is not attainable from a back face of the IC chip, which means that electric joining is not obtainable from any face of the sheet-substrate 503.

Accordingly, during an exposing step, each of the electrodes 502 is exposed from the surface of the sheet-substrate 503 by using polishing processing that exemplifies an electrode exposing method, or by performing plasma discharge processing, or by using both types of processing.

Figure 31C:
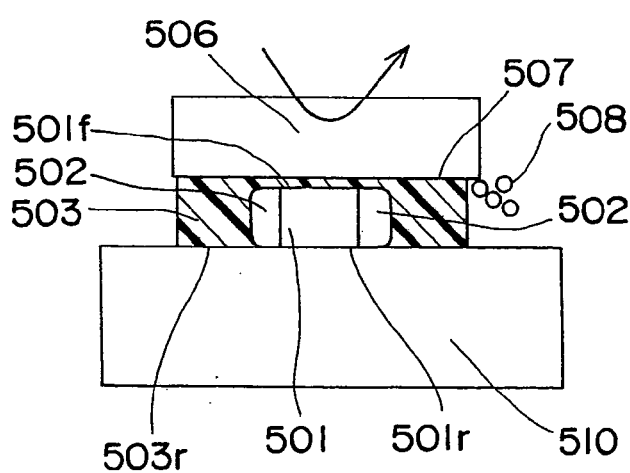

FIG. 31C is a fragmentary cross sectional view showing polishing processing. The sheet-substrate 503 with the electronic component 501 embedded therein is fixed to a polishing processing stage 510 by using a fixing jig or by sucking. A polishing paper 507 is placed and pressed by a polisher 506 onto a face of the sheet-substrate 503 from which the electrodes 502 are desired to be exposed, and then the polishing paper 507 is rotated or moved in a horizontal direction for polishing the sheet-substrate 503. It is desirable that the sheet-substrate 503 is polished with use of polishing papers finer in an order of #80, #100, #150, #500, #800, #1000, #1200, #1500, #2000, and then the sheet-substrate 503 is buffed with ceramic powders (e.g. alumina) with smaller grain sizes in the order of 1 µm, 0.5 µm, 0.3 µm or the like. It is noted that it is not necessary to use all the polishing papers and powders with roughness and grain size defined here, and therefore those with other roughness and grain sizes may also be applicable. Further, it is desirable to use water and organic solvent for removing polishing powders during polishing. Performing such a polishing step enables a plurality of the electrodes 502 to be exposed from the surface of the sheet-substrate 503.

Figure 31D:
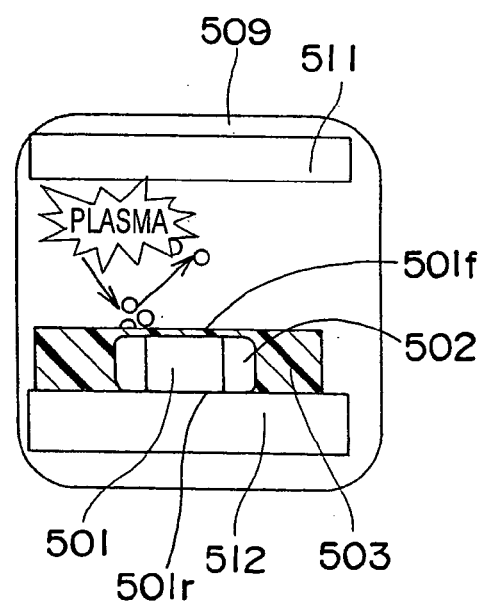

Also, FIG. 31D is a fragmentary cross sectional view showing a step of plasma discharge processing. The sheet-substrate 503 with the electronic component 501 mounted thereon is put in a vacuum chamber 509 of a vacuum furnace, and fixed to a plasma-discharge lower-side electrode 512 in the vacuum chamber 509. The vacuum chamber 509 is vacuumed to provide a reduced-pressure state, and inert gas such as Ar is introduced into the vacuum chamber 509, where high voltage is applied to between a plasma-discharge upper-side electrode 511 and the plasma-discharge lower-side electrode 512 for generating plasma between the upper-side electrode 511 and the lower-side electrode 512 in the vacuum chamber 509 to perform plasma etching. It is noted that locally concentrated generation of plasma may be achieved by simultaneous use of magnetic electric fields and the like. Plasma beats particles out of the sheet-substrate 503, by which the sheet-substrate 503 is ground down in its thickness direction.

Specific examples of the electrode exposing method in the exposing step include the following methods: (1) the sheet-substrate 503 is polishing-processed until the electrodes 502 are exposed; (2) the sheet-substrate 503 is plasma-processed until the electrodes 502 are exposed; (3) the sheet-substrate 503 is roughly ground down by performing polishing processing and finished by performing plasma discharge processing for exposing the electrodes 502; and (4) a combination method in which the sheet-substrate 503 in its entirety is ground down by performing polishing processing and only the vicinity of electrode 502 is plasma discharge-processed.

Employment of these methods bring about advantages that (1) it becomes possible to collectively expose a plurality of electrodes 502, resulting in improved productivity, and (2) a surface of a sheet after polishing is planar, which facilitates printing, film formation, lamination of sheet modules, formation of a card on the surface of the sheet, and makes a component practicable.

Particularly, like the aforementioned first embodiment to the eighth embodiment, in a state of an electronic component being embedded in a base substrate, it becomes possible to eliminate necessity of selecting the base substrate and electronic components so that each of electrodes of the electronic component has a thickness that ensures exposure from a surface of the base substrate. More specifically, when each of electrodes 502 of the electronic component 501 is embedded in the sheet-substrate 503 in the embedding state as described above, polishing processing or plasma processing is performed so that each of the electrodes 502 are possible to be exposed from the surface of the sheet-substrate 503.

According to the ninth embodiment, therefore, the electronic component 501 is embedded in the sheet-substrate 503, which makes it possible to decrease a thickness of the sheet module, thereby enabling decrease of the thickness. Further, since a thin sheet module is softer than a conventional substrate, it is possible to be used on a curved face or a place where a bending operation is performed. Furthermore, in a case where an IC chip as one example of an electronic component 1 is built in the sheet-substrate 503, a film formation area and a circuit pattern formation area on a substrate or the sheet-substrate 503 may be enlarged, which enables implementation of high functions and downsizing of the substrate.

Tenth Embodiment

In the ninth embodiment, the electronic component is exemplified by a chip-type capacitor component and passive component such as resists. However the electronic component may be a semiconductor device that is a bare IC chip. In a tenth embodiment of the present invention, a semiconductor device is taken as an example of the electronic component, and a manufacturing process of a semiconductor device-mounted component as one example of an electronic component-mounted component will be described with reference to FIG. 32A, FIG. 32B, FIG. 32C, FIG. 32D, FIG. 32E and FIG. 32F.

A manufacturing method of the semiconductor device-mounted component is mainly structured by the steps of: first, forming a protruding electrode on each of electrode pads of a semiconductor device exemplifying a first electronic component; next, leveling a height of each of the protruding electrodes; inserting this semiconductor device, or embedding it for example, in a sheet base substrate; and then exposing a surface of each of the protruding electrodes (the protruding electrode is one example of an electrode) from a surface of the sheet base substrate. It is noted that the step of leveling the height of protruding electrodes may be omitted. Hereinbelow, detailed description will be given of each step with reference to FIG. 32A, FIG. 32B, FIG. 32C, FIG. 32D, FIG. 32E and FIG. 32F.

Figure 32A:
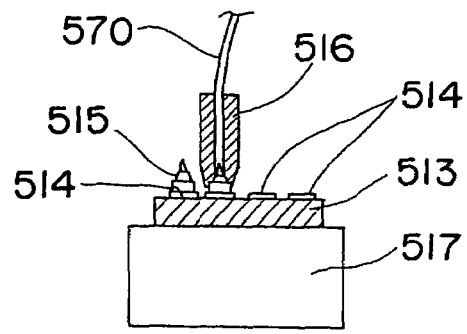
FIGS. 32A, 32B, 32C, 32D, 32E and 32F are partial cross sectional views each showing a manufacturing process of a method for manufacturing an electronic component-mounted component according to a tenth embodiment of the present invention.

FIG. 32A is a fragmentary cross sectional view showing a step of forming a plurality of protruding electrodes 515 on a semiconductor device 513 that is one example of the first electronic component. First, on a stage 517 there is placed the semiconductor device 513 having a plurality of planar metal electrode pads 514 (the metal electrode pad 514 is one example of an electrode) that has a surface layer and is made of gold or aluminum, and the semiconductor device 513 is fixed to the stage 517 with use of an unshown fixing jig or by such a method as sucking. Next, a metal fine line 570 made of gold or aluminum is passed through an electrode forming jig 516, and the metal fine line 570 coming out from a top end of the jig 516 is formed into a spherical portion by discharging. Then, the spherical portion of the metal fine line 570 is pressed to the electrode pad 514 while heat, a load and a supersonic wave are being applied thereto. After that, the jig 516 is lifted, which breaks the metal fine line 570 in the vicinity of an interface between a recrystallized region and an amorphous region in the spherical portion of the metal fine line 570, and thereby a protruding electrode 515 is formed on the electrode pad 514 of the semiconductor device 513. It is noted that the protruding electrodes 515 may be formed by plating, or printing, melting and hardening of a solder paste.

Figure 32B:
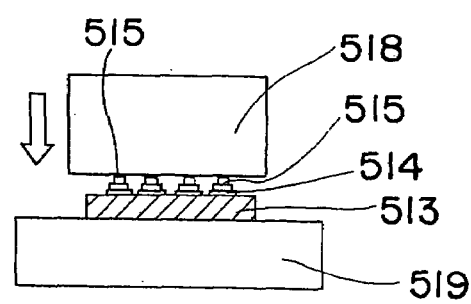

FIG. 32B is a fragmentary cross sectional view showing the step of leveling. The semiconductor device 513 having a plurality of protruding electrodes 515 formed in the previous step is fixed to stage 519 and all the protruding electrodes 515 are pressed downward by a specified height while a load is being applied by a leveling tool 518. This makes it possible to level all the protruding electrodes 515 to have a uniform height. A face of the stage 519 to which the semiconductor device 513 is fixed, and a face of the leveling tool 518 that comes into contact with all the protruding electrodes 515 are planar.

Figure 32C:
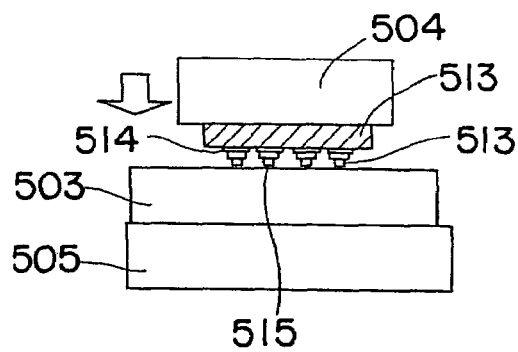
Figure 32D:
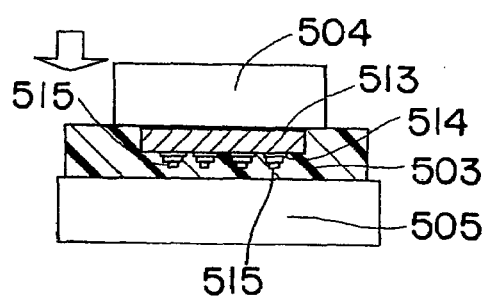
Figure 32E:
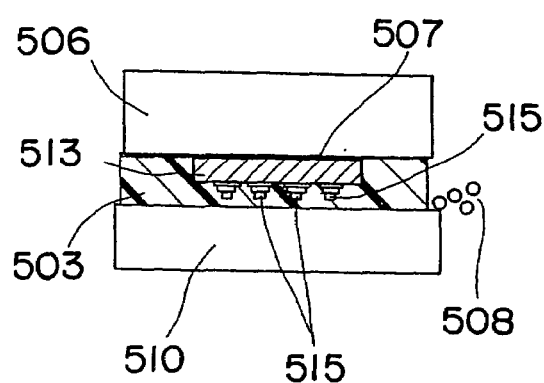
Figure 32F:
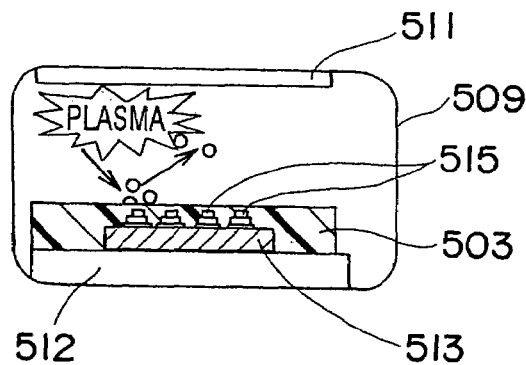

FIGS. 32C and 32D are fragmentary cross sectional views showing a step of embedding the semiconductor device 513 in a sheet-substrate 503, while FIGS. 32E and 32F are fragmentary cross sectional views showing a step of exposing the semiconductor device 513 from the sheet-substrate 503. In these steps, there is used the same method as used in FIGS. 31A, 31B, 31C and 31D of the ninth embodiment.

More specific examples of the method for manufacturing the semiconductor device-mounted component include a case of forming Au protruding electrodes on a bare IC chip that exemplifies the semiconductor device 513 with an external size of 2 mm×1.8 mm and a thickness of 0.18 mm that has two to ten units of square-shaped Al-plated lands whose one side is 80 μm, where a gold line with its diameter of 25 μm is used and preferable conditions are such that a current value is 30.0 mA, discharge time is 2.0 ms, ultrasonic output is 150 mW, bonding temperature is 150° C., and a bonding load is 70 g. With these conditions, a bump height is 60 to 80 μm. After the height is leveled to 40 to 60 μm, the electronic component is embedded in a sheet base substrate of polyethylene terephthalate with a thickness of 190 to 210 μm under conditions of: resin temperature of 150 to 170° C.; a load of 40 to 50 kgf (392.4 to 490.5N) or pressure of approximately $2.9 \times 10^6$ Pa; and pressing time of 20 seconds to 150 seconds. Consequently, a maximum distance from a top end of the electrode to a surface of the sheet base substrate of the polyethylene terephthalate becomes 10 μm. After that, the electrodes are exposed from the surface of the sheet base substrate by performing plasma etching or polishing.

According to the tenth embodiment, since the semiconductor device 513 is embedded in the sheet-substrate 503, it becomes possible to decrease a thickness of the sheet module that is the semiconductor device-mounted component, thereby enabling decrease of a thickness of the component. Further, this thin sheet module is softer than a conventional substrate, so that it is enabled to be used on a curved face or a place where a bending operation is performed. Furthermore, since the semiconductor device 513 is built in the sheet-substrate 503, a film formation area and a circuit pattern formation area on a surface of the substrate or the sheet-substrate 503 is enabled to be enlarged, which enables implementation of high functions and downsizing of the substrate.

Eleventh Embodiment

A method for manufacturing the electronic component-mounted component according to an eleventh embodiment of the present invention will be described with reference to FIG. 33A and FIG. 33B.

Figure 33A:
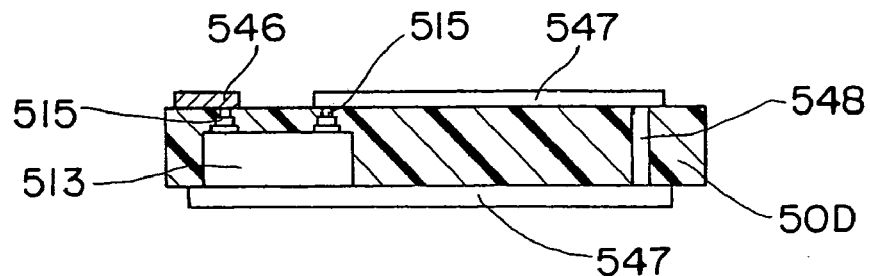
FIGS. 33A and 33B are, respectively, a partial cross sectional view and a plane view each showing an electronic component-mounted component having a thin-film capacitor and a coil on a surface of a base substrate in an eleventh embodiment of the present invention.
Figure 33B:
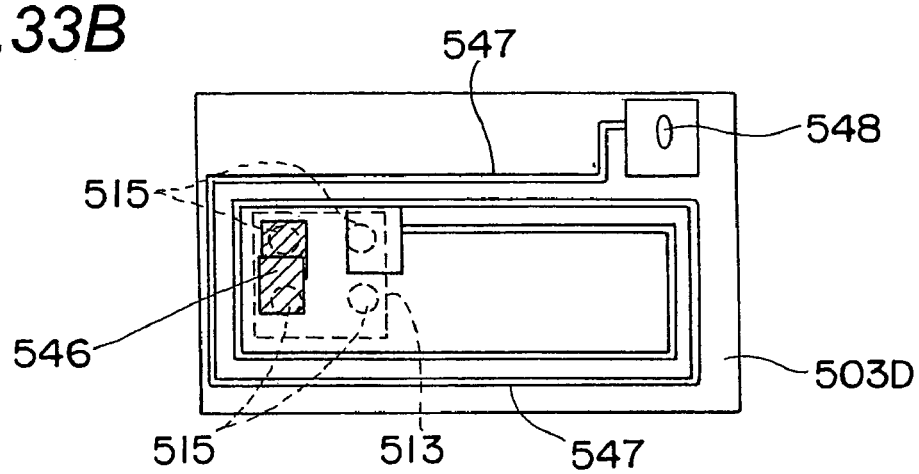

FIG. 33A and FIG. 33B are a fragmentary cross sectional view and a plane view showing a sheet module as one example of the electronic component-mounted component. The sheet module is formed such that, for example, semiconductor device 513 having a plurality of protruding electrodes 515 formed by the same method as that in the tenth embodiment is embedded in a thermoplastic resin sheet base-substrate 503D that exemplifies a base substrate having a through hole 548 exemplifying a through hole for electric connection that obtains electric connection by a thin coating and a conductive paste that are examples of conductors put on surroundings of a hole formed by an NC puncher or a laser and having electric insulating properties. After that, a plurality of the protruding electrodes 515 are exposed by performing polishing processing or plasma discharge processing. Next, there are formed (or mounted) a thin-film capacitor 546 and a coil 547, that are examples of second electronic components, so as to be connected to the protruding electrodes 515, respectively. It is noted that the through hole 548 is not necessary if a module sheet as a product fulfills a function only with one face (a face from which the protruding electrodes 515 are exposed in this case). The thin-film capacitor 546 is manufactured by forming two kinds of conductive films by performing sputtering or vapor deposition on sheet base substrate 503D so as to cover the protruding electrodes 515 via a dielectric film. The coil 547 is manufactured on the sheet base substrate 503D by printing solder paste or conductive paste on the sheet base substrate 503D with use of a mask squeegee or by performing photolithography after plating. It is noted that a thin-film resist may be formed on the sheet base substrate 503D. More specifically, circuit patterns that exemplify a circuit component formed in the shape of a film, a metal thin-film capacitor 546, the coil 547, or a resist may be formed on the sheet base substrate 503D by performing plating, ion plating, sputtering and deposition that exemplify methods for forming a conductor. Also, the circuit patterns (the circuit patterns are also an example of the first circuit patterns) may be formed by printing a solder paste or a conductive adhesive on electrodes exposed from the surface of the base substrate and then by heating and hardening the same in a high-temperature furnace or a high-temperature stage.

According to the eleventh embodiment, in addition to a working effect of the above-described tenth embodiment, the semiconductor device 513 being built in the sheet-substrate 503D makes it possible to enlarge a film formation area and a circuit pattern formation area (e.g., an area for forming the thin-film capacitor 546 and the coil 547) on a surface of the substrate or the sheet-substrate 503D, which enables implementation of high functions and downsizing of the substrate.

As a modified example of the eleventh embodiment, FIGS. 34A, 34B, 34C and 34D are fragmentary cross sectional views and plane views showing a manufacturing process of the electronic component-mounted component in a case where nine units of modules are manufactured at the same time. A thermoplastic resin sheet base-substrate 503E having electric insulating properties used in the modified example (the sheet base-substrate 503E is one example of the base substrate) is structured such that nine individual module areas 503z are integrally formed, and each of the individual module areas 503z corresponds to a sheet base substrate 503D. Each of the individual module areas 503z has through hole 548.

The manufacturing process of the electronic component-mounted component is composed of the steps of: collectively embedding nine semiconductor devices 513 in the nine individual module areas 503z of the thermoplastic resin sheet base-substrate 503E having electric insulating properties; exposing electrodes 515 of each of the semiconductor devices 513 from a surface of the sheet base-substrate 503E by performing polishing processing or plasma processing; printing conductive adhesive on the sheet base-substrate 503E and forming circuit patterns by formation of a metal film and the like; and cutting the component into pieces per module.

The step of collectively embedding the nine semiconductor devices 513 is basically performed in accordance with the tenth embodiment by the same method as the ninth embodiment, in which nine semiconductor devices 513 are brought into contact with press tool 504, and while an arbitrary load is being applied toward heating stage 505, the nine semiconductor devices 513 are pressed simultaneously into the nine individual module areas 503z of the sheet base-substrate 503E by the press tool 504, as a consequence of which these nine semiconductor devices 513 are collectively and simultaneously embedded in the sheet base-substrate 503E. Next, the press tool 504 is lifted, and the sheet base-substrate 503E with the nine semiconductor devices 513 embedded therein is detached from the heating stage 505 and cooled to room temperature, by which the sheet-substrate 503E is hardened and the nine semiconductor devices 513 are embedded in the sheet-substrate 503E.

A step of exposing the electrodes is also performed basically in accordance with the tenth embodiment by the same method as the ninth embodiment, in which electrodes 515 of each of the semiconductor devices 513 are simultaneously and collectively exposed from the surface of the sheet base-substrate 503E by performing polishing processing and plasma processing.

Further, a step of forming circuit patterns is basically performed by the same method as the tenth embodiment, in which the circuit patterns are collectively and simultaneously formed by printing of conductive adhesive on the sheet base-substrate 503E and formation of a metal film.

A cutting step is performed so as to cut the component into pieces so that each semiconductor device 513 is separated from each other per individual module areas 503z, i.e., per individual modules. The component is preferably cut into pieces with use of a dicing machine or a laser. It is noted that reference numeral 550 denotes a virtual cutting line for cutting the component into pieces per module.

According to the modified example of the eleventh embodiment, in addition to a working effect of the above-mentioned eleventh embodiment, there is implemented an effect of increasing productivity since unlike conventional batch-processing, collective embedding of a number of semiconductor devices 513 is achieved as well as collective exposure of the protruding electrodes 515 of a number of semiconductor devices 513 being enabled.

Twelfth Embodiment

The following description discusses a method for manufacturing a multilayer-laminated electronic component-mounted component according to a twelfth embodiment of the present invention.

In this manufacturing method, a sheet module 549 is formed by the steps of: embedding semiconductor device 513, that is one example of the electronic component and also one example of a first electronic component, in a thermoplastic resin sheet base-substrate 503F having electric insulating properties (the sheet base-substrate 503F is one example of a base substrate) by a method for manufacturing the electronic component-mounted component according to the previous embodiment; exposing protruding electrodes 515 from a surface of the sheet base-substrate 503F by performing polishing processing and plasma processing; and then forming circuit patterns, a thin-film resist, a thin-film capacitor 546 and the like on a front face of the sheet base-substrate 503F or on both front and back faces thereof. Then, a plurality of sheet modules 549 are superposed on top of each other and pressed for lamination.

Figure 35:
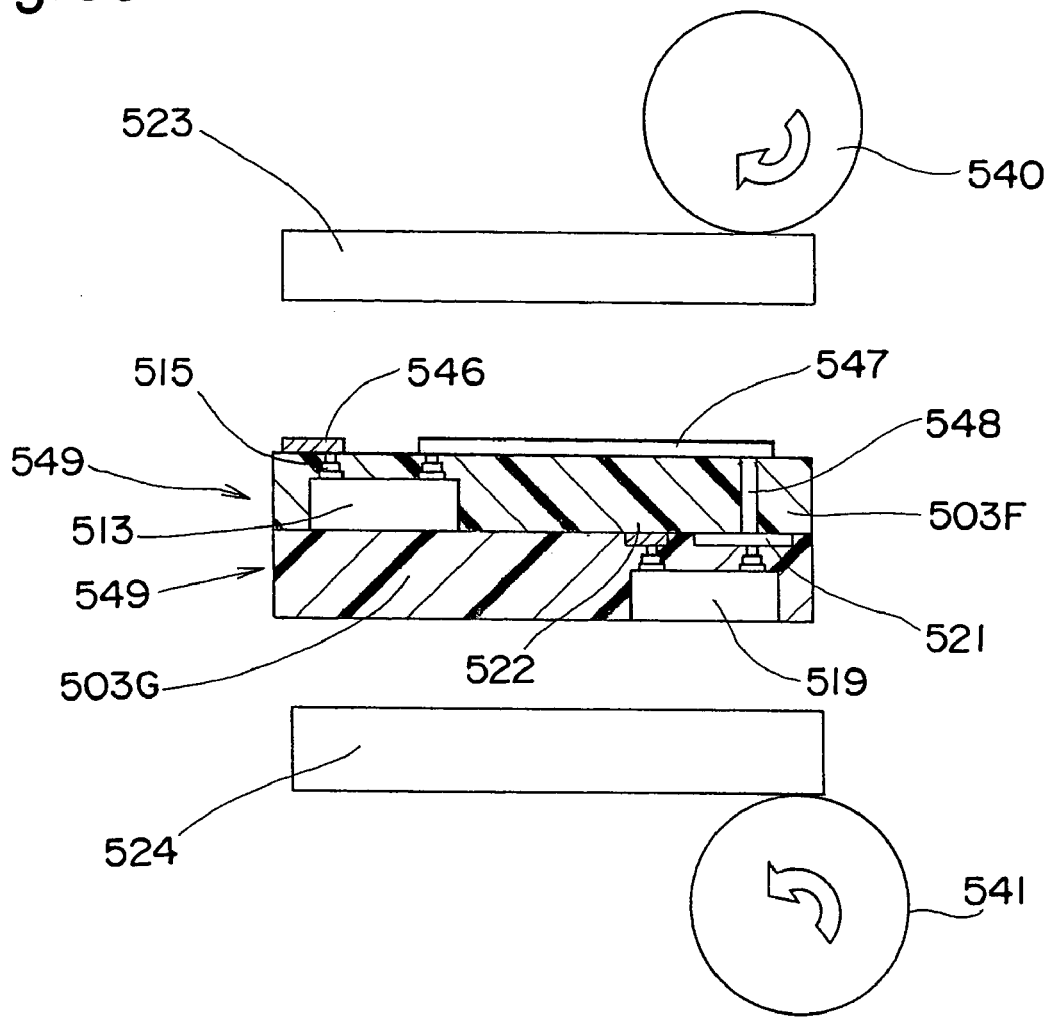
FIG. 35 is a partial cross sectional view showing a manufacturing process of a method for manufacturing a multilayer-laminated electronic component-mounted component, with electronic component-mounted components being laminated, in a twelfth embodiment of the present invention.

More specifically, FIG. 35 is a fragmentary cross sectional view showing a sheet module and the like for describing a lamination method for laminating semiconductor device-mounted sheet modules 549 with electrodes of this semiconductor device being exposed by performing polishing processing or plasma processing. In the thermoplastic resin sheet base-substrate 503F having through hole 548, the semiconductor device 513 is embedded, and then the protruding electrodes 515 of the semiconductor device 513 are exposed from a top face of the sheet base-substrate 503F by performing polishing processing and plasma processing. Next, a thin-film capacitor 546 and a coil 547 made of a conductive paste are formed on the protruding electrodes 515. On a back face of the sheet base-substrate 503F, a thermoplastic resin sheet base-substrate 503G having the semiconductor device 519 and having electric insulating properties, as well as including a thin-film capacitor 522 and a coil 521 made of a conductive paste formed on the protruding electrodes 515, is aligned so as to enable electrical joining with the back face of the sheet base-substrate 503F. Next, on both faces thereof, protective sheets 523, 524 having electric insulating properties (the protective sheets 523, 524 are examples of insulating protecting sheets) are placed and laminated in a thickness direction, and roll pressing is performed upward and downward by upward and downward rolls 540, 541. This forms a laminated electronic component built-in module.

As for a function and material of the protective sheets 523, 524, the protective sheets 523, 524 are composed of thermoplastic resin that are preferably made of the same material as the thermoplastic resin sheet base-substrate 503 for embedding, but they may be made of other materials. Preferable materials include polyethylene phthalate, polyvinyl chloride, polycarbonate, and acrylonitrile styrene-butadiene. In FIG. 35, the sheet base-substrate 503G is disposed on the lower face of the sheet base-substrate 503F. Without being limited to this, the sheet base-substrate 503G may be disposed on the upper face of the sheet base-substrate 503F, or disposed on both faces of the sheet base-substrate 503F, and further a plurality of other sheet base-substrates may be laminated in a thickness direction on one face or both faces of the sheet base-substrate 503F.

According to the twelfth embodiment, in addition to working effects of the ninth and the tenth embodiments, humidity resistance of the semiconductor devices 513, 519 and circuit patterns becomes excellent since the semiconductor devices 513, 519 and the circuit patterns are covered by lamination of a plurality of the sheet base-substrates 503F and 503G. More specifically, the semiconductor devices 513, 519 are not exposed to air, so that they are less susceptible to oxidation or migration in the electrode 515, and wear thereof is prevented, which enables portable usage as a thin-film card and makes the component practicable.

Next, description will be given of another embodiment of the present invention, in which a base substrate is embedded directly in a semiconductor device without leveling protruding electrodes to have a uniform height.

Figure 38A:
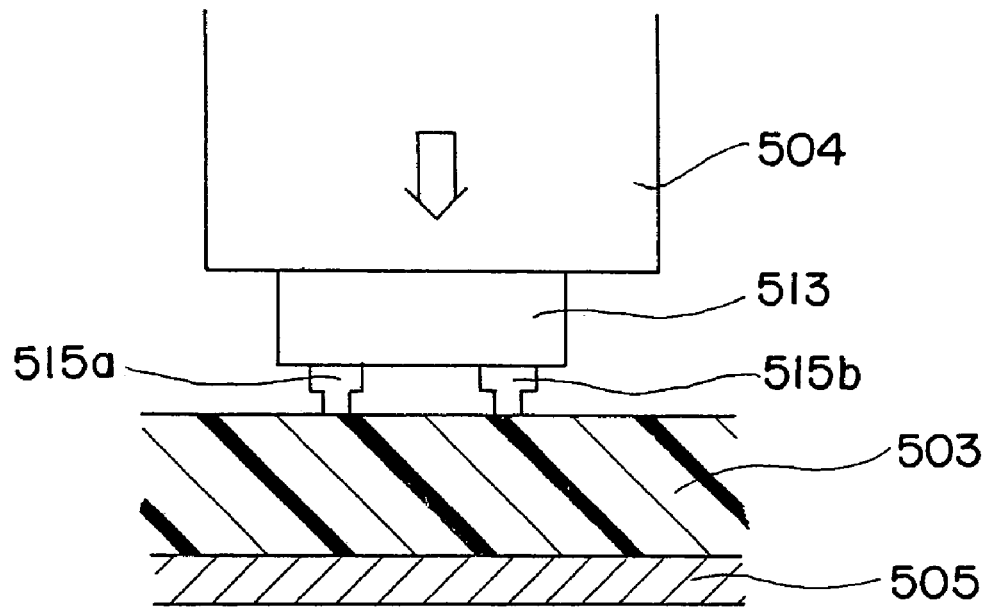
FIGS. 38A and 38B are cross sectional views of a thermoplastic resin sheet base-substrate and others for describing a method for directly embedding a semiconductor device in the thermoplastic resin sheet base-substrate without leveling protruding electrodes to have a uniform height in another embodiment of the present invention.
Figure 38B:
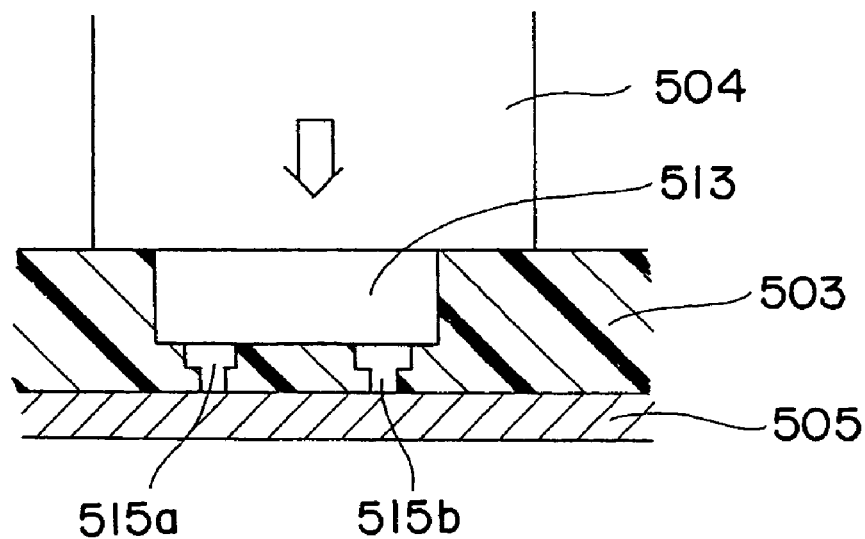

FIGS. 38A and 38B are cross sectional views showing a method for directly embedding a semiconductor device (a bare IC chip) 513, as one example of an electronic component, in a thermoplastic resin sheet base-substrate 503 without leveling protruding electrodes to have a uniform height.

For comparison, FIGS. 38A and 38B are cross sectional views of the thermoplastic resin sheet-substrate 503 and the like for describing a method for embedding the semiconductor device in the thermoplastic resin sheet-substrate 503 whose protruding electrodes are leveled in advance. On a rigid stage 505, there is placed the thermoplastic resin sheet-substrate 503, on which the semiconductor device 513 having protruding electrodes 515a, 515b is placed with an electrode-side face thereof facing down, and a back face of the semiconductor device 513 is pressed while being heated by a hot pressing tool 504. Since the protruding electrodes 515a, 515b of the semiconductor device 513 are already leveled, heights of the protruding electrodes 515a and 515b are almost the same. Consequently, the semiconductor device 513 is embedded so that faces of the semiconductor device 513 are almost parallel to a surface of the stage 505, and the electrodes 515a, 515b are easily exposed from a surface of the thermoplastic resin sheet-substrate 503.

Figure 39A:
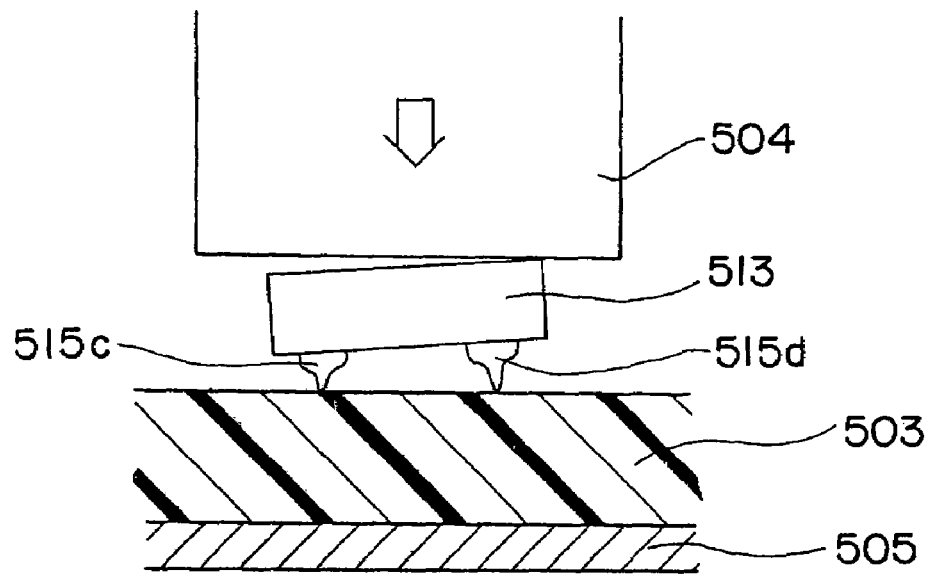
FIGS. 39A and 39B are cross sectional views of a thermoplastic resin sheet base-substrate and others for describing a method for directly embedding a semiconductor device in the thermoplastic resin sheet base-substrate without leveling after formation of bumps in still another embodiment of the present invention.
Figure 39B:
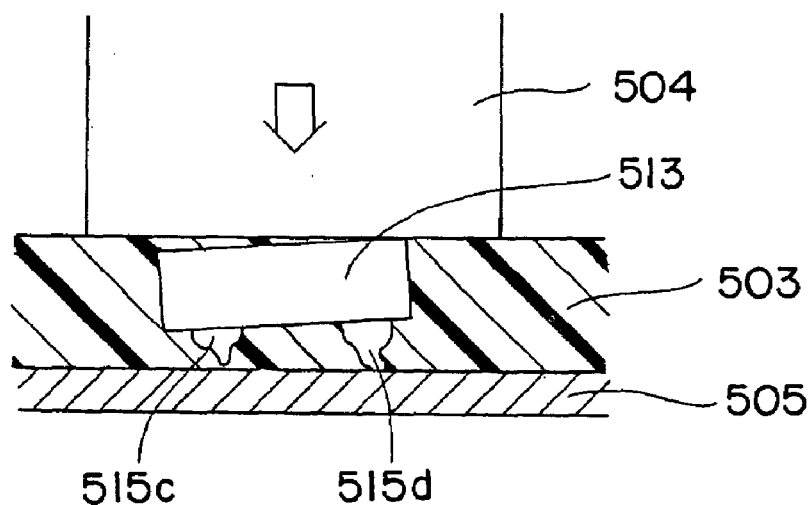

FIGS. 39A and 39B are cross sectional views of a thermoplastic resin sheet base-substrate and others for describing a method for directly embedding semiconductor device 513 in a thermoplastic resin sheet base-substrate 503 without a leveling operation after formation of bumps. Heights of protruding electrodes 515c, 515d of the semiconductor device 513 are expressed as (height of the electrode 515c)<(height of the electrode 515d) due to variance after formation of the bumps. Consequently, faces of the semiconductor device 513 are inclined from a surface of stage 505. If the semiconductor device 513 is pressed in this state, a top end thereof does not reach a surface of the thermoplastic resin sheet-substrate 503 and fails to be exposed therefrom like protruding electrode 515c of FIG. 39B, or a top end of the protruding electrode falls down and is exposed in an irregular form like the protruding electrode 515d. With such exposure, a joining failure and shortage of joining reliability occur in a next circuit formation step.

Accordingly, description will be given of an embedding method without leveling with reference to FIGS. 40A and 40B.

Figure 40A:
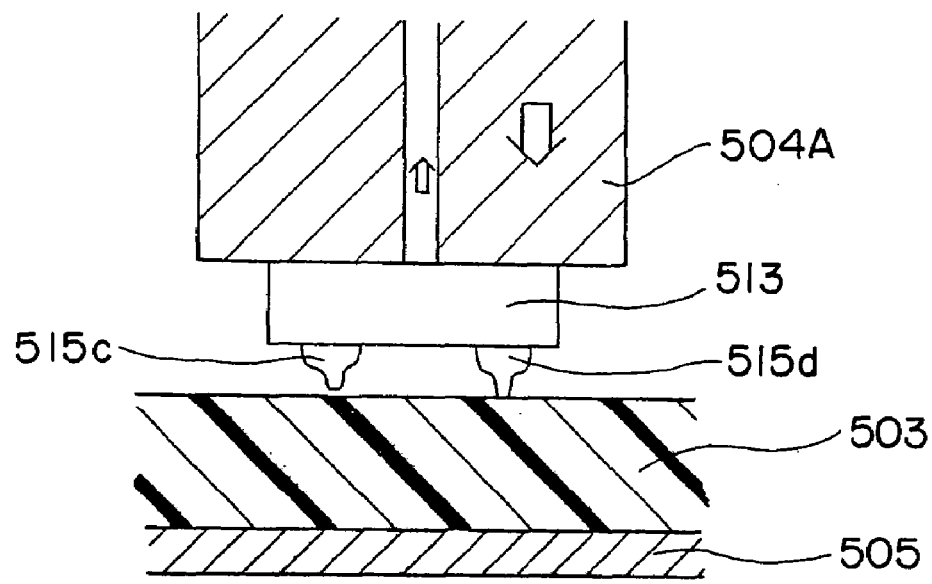
FIGS. 40A and 40B are cross sectional views of a thermoplastic resin sheet base-substrate and others for describing an embedding method without leveling in still another embodiment of the present invention.
Figure 40B:
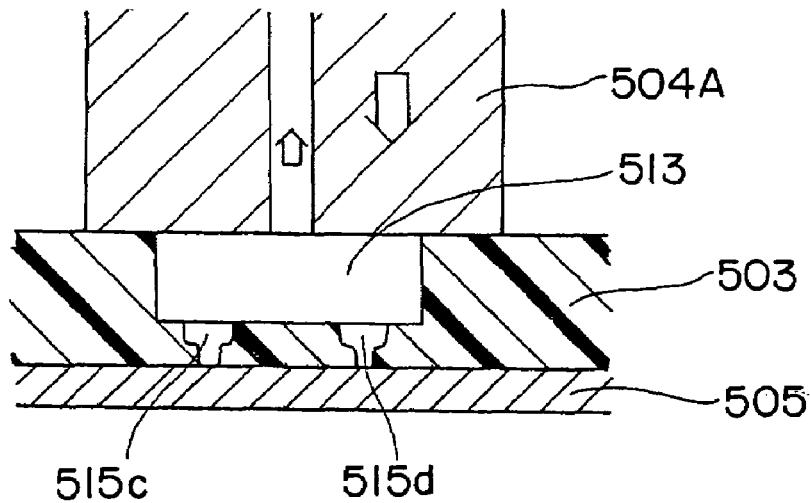

As shown in FIG. 40A, by using a hot pressing tool 504A having a mechanism of sucking the semiconductor device 513, the semiconductor device 513 is embedded in the thermoplastic base substrate 503 while a back face of the semiconductor device 513 is being sucked. As the semiconductor device 513 is continuously sucked, faces of the semiconductor device 513 are held parallel to the surface of the stage 505. The protruding electrode 515c is pressed against the stage 505 that is a rigid member so as to be plastically-deformed. If the protruding electrode 515c is pressed until it is deformed to be shaped as shown in FIG.

40B, not only the protruding electrode 515c, but also the protruding electrode 515d that is higher than the protruding electrode 515c, are exposed from the surface of the thermoplastic resin sheet-substrate 503. Since the faces of the semiconductor device 513 are always parallel to the surface of the stage 505, heights of the protruding electrodes 515c and 515d are always equal as shown in FIG. 40B. It is noted that in this method, a mechanism for sucking the semiconductor device 513 is necessary, which makes it impossible to interpose the release paper between the semiconductor device 513 and the press tool 504A as a preventive measure for preventing the thermoplastic resin sheet-substrate 503 from being vitreous during a heating operation and sticking on the press tool 504A. It is therefore desirable to form the press tool 504A from a material that is easily released from the thermoplastic resin sheet-substrate 503, or the press tool 504A is formed to be smaller than the semiconductor device 513.

Figure 41:
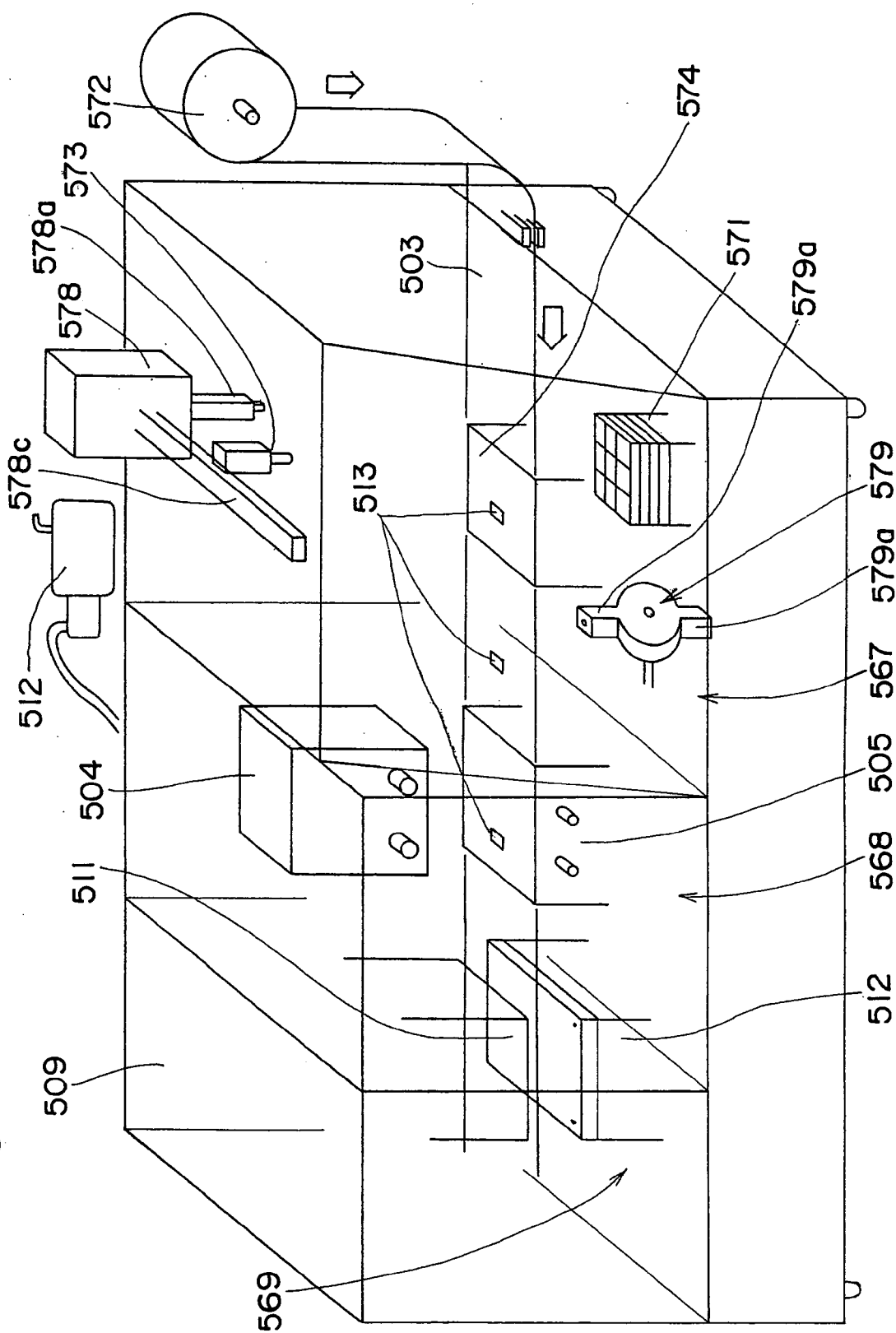
FIG. 41 is a schematic view showing one example of an apparatus for manufacturing an electronic component-mounted component according to yet another embodiment of the present invention.

Next, FIG. 41 is a schematic view showing one example of an apparatus for manufacturing an electronic component-mounted component according to yet another embodiment of the present invention. The apparatus is mainly composed of: a feeding mechanism 572 for feeding thermoplastic resin sheet-substrate 503; a semiconductor device feeding mechanism 567; a recognition camera 573; a transportation mechanism 578 for semiconductor devices 513; a semiconductor device inverting tool 579; a temporal embedding stage 574; an upper-side press tool 504 constituting a hot pressing mechanism 568 and a heating stage 505; and a plasma etching mechanism 569.

First, the thermoplastic resin sheet-substrates 503 are preferably fed by a roll feeding method or a sheet feeding method. FIG. 41 shows the roll feeding method. First, roll-type thermoplastic resin sheet-substrates 503 are constantly fed without slack from the right side to the left side in FIG. 41 by the feeding mechanism 572.

The semiconductor devices 513 having protruding electrodes 515 formed in advance on the electrode pads 514 are stored regularly in trays with an electrode-side face thereof facing up. These trays are stacked in multiple stages and placed in a feeding tray portion 571 of the semiconductor device feeding mechanism 567 that is an example of an electronic component feeding apparatus. It is noted that without being limited to this storing method, the semiconductor devices 513 may be stored in the form of a wafer.

Next, with use of a semiconductor device recognition camera, as an example of the recognition apparatus, for the semiconductor device inverting tool 579, as an example of a vertical inverting apparatus, there are recognized characteristics and patterns of the electrode-side face, and an outside diameter of the protruding electrodes of the semiconductor device 513 in a tray. Then, with use of a suction jig 579a of the semiconductor device inverting tool 579 having a sucking function, one face of the semiconductor device 513 placed in a tray, that is an electrode-side face, is sucked, and then the semiconductor device inverting tool 579 is rotated about a rotational axis for inverting the semiconductor device 513 upside down so as to dispose the electrode-side face of the semiconductor device 513 face down.

Next, a transportation suction nozzle 578a of the semiconductor device transportation mechanism 578, as an example of the electronic component mounting apparatus, is moved along a rail 578c to an upper side of the semiconductor device inverting tool 579, where the transportation suction nozzle 578a is lowered to suck and hold a face of the semiconductor device 513 that is opposed to a face sucked by the suction jig 579a of the semiconductor device inverting tool 579. Thus, one face of the semiconductor device 513 sucked by the transportation suction nozzle 578a of the semiconductor device transportation mechanism 578, that is the electrode-side face, is placed face down.

Next, while the semiconductor device 513 is sucked by the transportation suction nozzle 578a of the semiconductor device transportation mechanism 578, the transportation suction nozzle 578a of the semiconductor device transportation mechanism 578 is moved along the rail 578c to an upper side of the thermoplastic resin sheet-substrate 503 on the temporal embedding stage 574. Next, after an embedding position of the thermoplastic resin sheet-substrate 503 placed on the temporal embedding stage 574 is recognized by the recognition camera 573, the transportation suction nozzle 578a is lowered, and the semiconductor device 513 sucked by the transportation suction nozzle 578a is embedded in the embedding position of the thermoplastic resin sheet-substrate 503 on the temporal embedding stage 574. Here, for preventing displacement of embedded semiconductor device 513 during transportation, the transportation suction nozzle 578a preferably presses the semiconductor device 513 down by a specified amount for a short period of time while the transportation suction nozzle 578a is being heated. It is noted that a planar size of the transportation suction nozzle 578a is preferably the same size as the semiconductor device 513.

Next, the thermoplastic resin sheet-substrate 503 placed on the temporal embedding stage 574 is moved to an upper side of the heating stage 505, where the semiconductor device 513 is pressed in the thermoplastic resin sheet-substrate 503 for a specified period of time by the upper-side press tool 504, that is an example of an electronic component inserting apparatus. It is noted that the hot pressing mechanism 568 may be used in air or in a vacuum. Also, it is desirable to provide a multistage stacking mechanism capable of hot-pressing a plurality of the thermoplastic resin sheet-substrates 503 in a state of being stacked in a superposing direction of the semiconductor device 513 on the thermoplastic resin sheet-substrate 503, as well as a rotating stage mechanism and a temperature profile controller supporting divided steps such as a preheating step, a full-heating step and a cooling step. It is noted that the hot pressing mechanism 568 is preferably capable of controlling a contact-starting position, pressing-in end position, lowering speed, lifting speed and the like for embedding the semiconductor device 513 in the thermoplastic resin sheet-substrate 503.

Next, the thermoplastic resin sheet-substrate 503 on the heating stage 505 is transported to the plasma etching mechanism 569, that is an example of an electrode exposing apparatus, where electrodes 515 of the semiconductor device 513 are exposed from the thermoplastic resin sheet-substrate 503 by performing plasma etching. In the plasma etching mechanism 569, plasma-discharge upper-side electrode 511 is disposed on an upper side of the thermoplastic resin sheet-substrate 503 for sucking the thermoplastic resin sheet-substrate 503 with no space between the upper-side electrode 511 and the thermoplastic resin sheet-substrate 503. A plasma-discharge lower-side electrode 512 is disposed on a lower side of the thermoplastic resin sheet-substrate 503 so as to be parallel to a surface of the plasma-discharge upper-side electrode 511. Between both electrodes 511 and 512, it is necessary to provide a high frequency generating source for applying high voltage and a matcher for attaining impedance matching between plasma and a source. Also, it is desirable to provide pipes for introducing oxygen gas, hydrofluoric acid, argon gas and the like, and a gas cylinder for storing a corresponding gas. Further, it is desirable to provide a pump for creating a high vacuum such as an oil-sealed rotary vacuum pump, an oil diffusion pump and a cryopump, as well as a vacuum gauge for confirming attainment of a vacuum. It is noted that the plasma etching mechanism 569 may be replaced by a polishing function. In a case of polishing, creation of a vacuum is not necessary.

The above structure enables continuous execution of temporal embedding, pressing-down, and electrode exposure of the semiconductor device 513 against the thermoplastic resin sheet-substrate 503.

Next, description will be given of a case of a stack module in which a plurality of memory chips are stacked in multiple stages as still another embodiment of the present invention.

Figure 42:
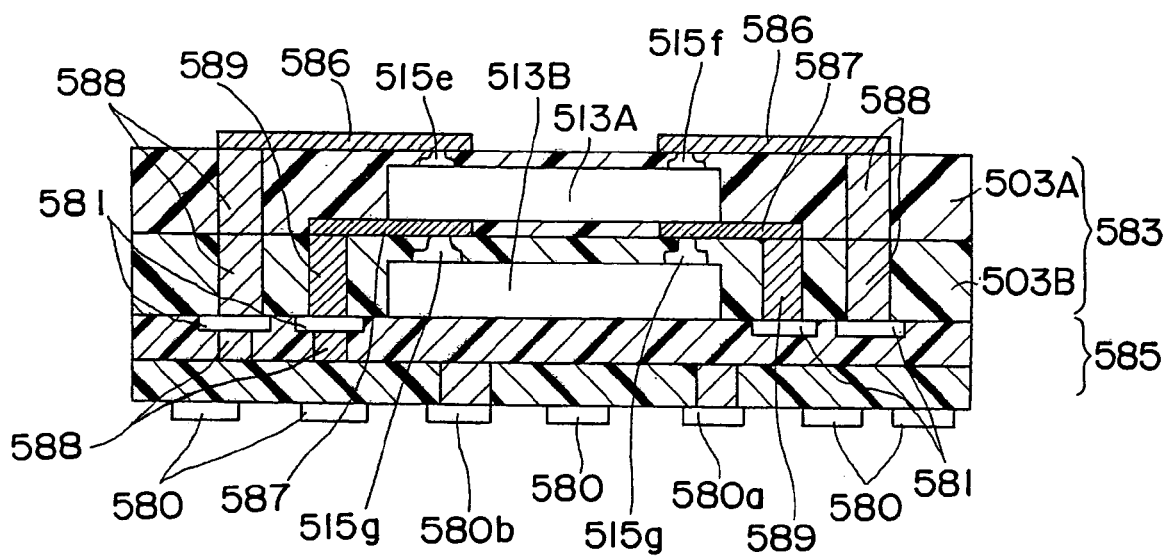
FIG. 42 is a cross sectional view showing a built-in package module in which a stack module formed by stacking two memory chips is mounted on a printed circuit board in still another embodiment of the present invention.
Figure 43:
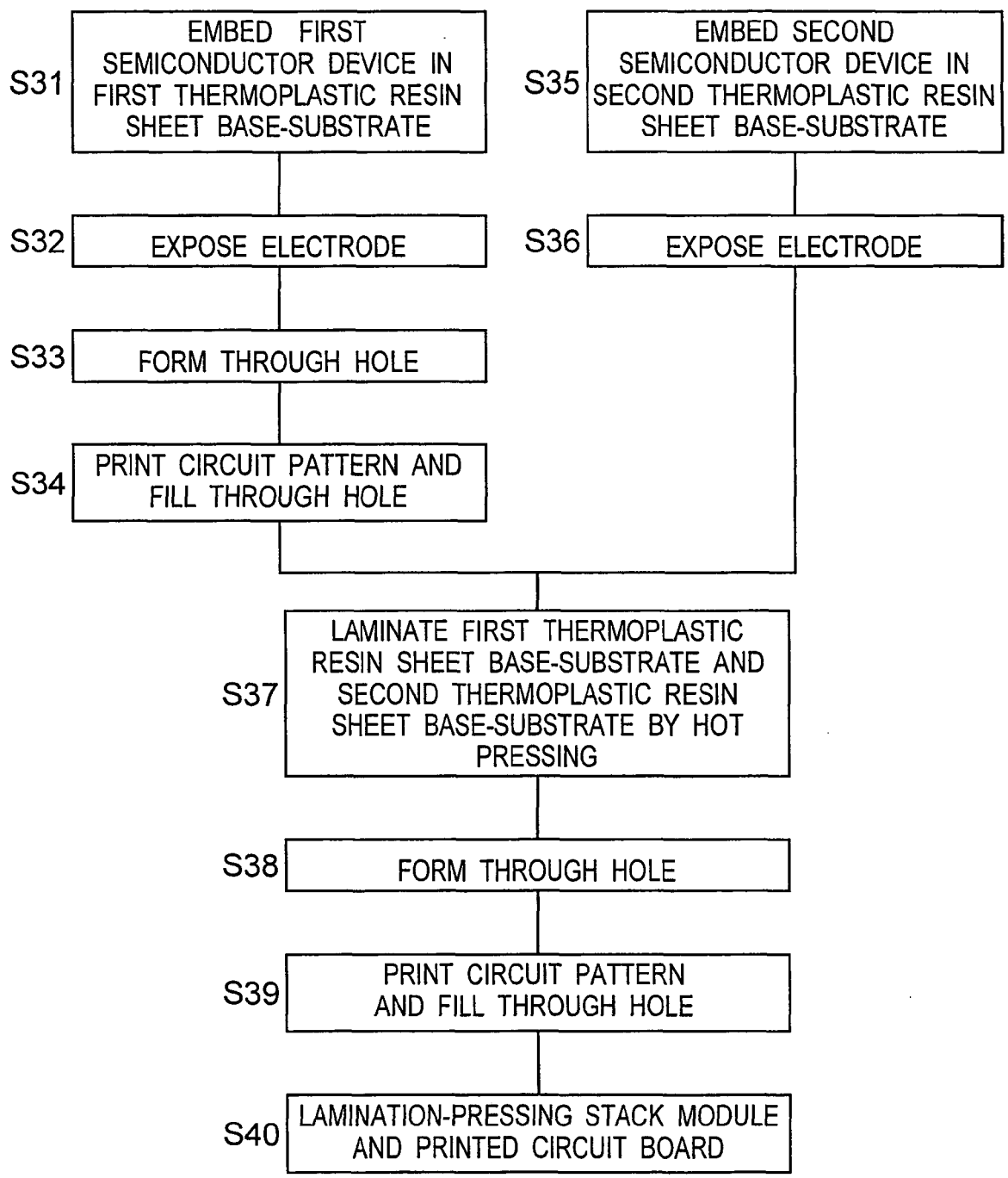
FIG. 43 is a flowchart showing a method for manufacturing a package module of FIG. 42.

FIG. 42 is a cross sectional view showing a built-in package module in which a stack module 583 formed by stacking two memory chips (herein a first semiconductor device 513A and a second semiconductor device 513B, both of which are examples of electronic components) is mounted on a printed circuit board 585. FIG. 43 is a flowchart showing a method for manufacturing the package module.

The built-in package module is structured such that a stack module 583 is mounted on the printed circuit board 585 having circuit patterns provided in advance. Substrate electrodes 580, 580a, 580b of the built-in package module are joined to a mother board unshown in FIG. 42 via solder or conductive adhesive to establish electric joining to the mother board. For example, electrodes 515e, 515f of the first semiconductor device 513A are electrically joined to the electrodes 580a, 580b via circuit patterns 586 on a surface of the stack module 583, through holes 588 of the stack module 583 and electrodes 581 of the printed circuit board 585.

In a manufacturing process of the stack module 583, first in step S31, the first semiconductor device 513A is embedded in a first thermoplastic resin sheet base-substrate 503A, and then in step S32, electrodes 515e, 515f of the first semiconductor device 513A are exposed by performing plasma etching or polishing. The plasma etching may be applied to either an entire surface of the first thermoplastic resin sheet base-substrate 503A or a surface of the first thermoplastic resin sheet base-substrate 503A around the electrodes.

Also in step S33, conductive through-holes 589 are formed in a second thermoplastic resin sheet base-substrate 503B with use of an NC puncher. Its hole diameter is preferably 0.1 to 1.0 mm. Next, in step S34, circuit patterns 587 are printed by such a method as sputtering, plating and printing of conductive adhesive.

In step S35, by the same method, the second semiconductor device 513B is embedded in the second thermoplastic resin sheet base-substrate 503B, and in step S36, electrodes 515g of the second semiconductor device 513B are exposed. Steps S31 through S34 and steps S35 through S36 may be performed separately or simultaneously.

Next in step S37, the first thermoplastic resin sheet base-substrate 503A is superposed on the second thermoplastic resin sheet base-substrate 503B, and these base-substrates are hot-pressed and fixed in a laminated state. Then in step S38, there are formed through holes 588 that pass through the first thermoplastic resin sheet base-substrate 503A and the second thermoplastic resin sheet base-substrate 503B.

Next in step S39, circuit patterns 586 are printed on an upper face of the first thermoplastic resin sheet base-substrate 503A, and the through holes 588 are filled with electric conductive material. Thus, the stack module 583 is completed.

Finally in step S40, the printed circuit board 585 with the circuit patterns provided in advance made of, for example, a ceramic, a glass epoxy resin and a resin multilayer substrate (e.g., ALIVH (Any Layer Interstitial Via Hole) made by Matsushita Electric Industrial Co., Ltd.) and the stack module 583 are hot-pressed to form the built-in package module.

Figure 44:
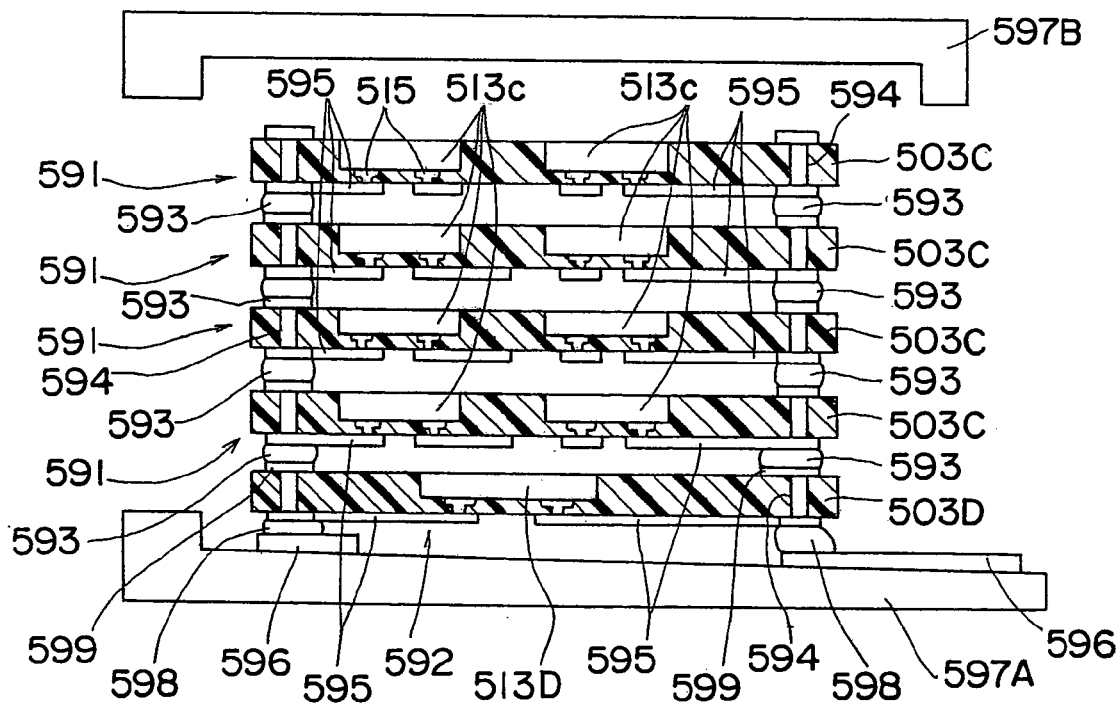
FIG. 44 is a cross sectional view showing a memory card composed of: four layers of sheet modules for memory made of layers of thermoplastic resin sheet base-substrates incorporating two semiconductor devices for memory; and one layer of a sheet module for controller made of a thermoplastic resin sheet base substrate incorporating one semiconductor device for controller in still another embodiment of the present invention.

FIG. 44 is a cross sectional view showing a memory card composed of: four layers of sheet modules for memory 591 made of layers of thermoplastic resin sheet base-substrates 503C incorporating two semiconductor devices (bare IC chips) for memory 513C exemplifying electronic components; and one layer of a sheet module for controller 592 made of a thermoplastic resin sheet base-substrate 503D (the sheet base-substrate 503D is one example of a base substrate) incorporating one semiconductor device (a bare IC chip) for controller 513D exemplifying an electronic component in still another embodiment of the present invention. Since one semiconductor device for memory 513C has a capacity of 64 MB, one layer of the sheet module for memory 591 has a capacity of 128 MB and the total four layers thereof have a recording capacity of 512 MB. FIG. 45 is a flowchart showing a manufacturing process of the memory card.

For example, the memory card of FIG. 44 is composed of: four layers of the sheet modules for memory 591 incorporating two semiconductor devices for memory 513C being 16 mm long×8 mm wide×0.080 mm thick; and one layer of the sheet module for controller 592 incorporating one semiconductor device for controller 513D that is a square whose one side is 7.8 mm and whose thickness is 0.200 mm, in which each layer is electrically joined via conductive paste 593 and the like. It is noted that on each electrode of the semiconductor devices 513C, 513D, protruding bumps with a height of 0.04 mm are formed.

Following description discusses one example of a method for manufacturing a memory card.

First in step S41, through holes 594 of ϕ0.2 mm are formed in specified positions of the thermoplastic resin sheet base-substrate 503C, that is, for example, a thermoplastic polyimide sheet base-substrate 503C, by use of an NC puncher or a laser.

Next in step S42, two semiconductor devices for memory 513C are simultaneously embedded in the thermoplastic resin sheet base-substrate for memory 503C, whereas one semiconductor device for controller 513D is embedded in the thermoplastic resin sheet base-substrate for controller 503D.

Next in step S43, bump electrodes 515 of the semiconductor devices 513C, 513D are exposed from a surface by performing plasma etching. For the plasma etching, it is desirable to use oxygen plasma.

Next in step S44, each of the thermoplastic resin sheet base-substrate for memory 503C and the thermoplastic resin sheet base-substrate for controller 503D is plated with a Ni layer of approximately 1 μm by performing electroless Ni plating, and then dipped in an electrolytic plating solution to form a Cu layer of 15 μm. Then, during a step of performing photolithography, circuit patterns 595 joined to the electrodes 515 are formed. Here, surroundings of the through holes 594 are also plated at the same time so as to obtain electric joining. It is noted that this step may be fulfilled by printing of conductive adhesive or sputtering. After that, on casing-electrodes 596 of a casing 597A, a printing mask is mounted and then there is printed conductive paste 598 such as solder paste and conductive adhesive typified by silver paste, copper paste and silver palladium paste by use of a squeegee. A thickness of the conductive paste 598 after printing is preferably 0.020 to 0.030 mm.

After that in step S45, the sheet module for controller 592 is mounted on the casing 597A, where the casing-electrodes 596 of the casing 597A are electrically joined to the circuit patterns 595 of the thermoplastic resin sheet base-substrate for controller 503D via the conductive paste 598, and the conductive paste 598 is hardened in a hardening furnace or a reflow furnace.

Next, on top of electrodes 599 on an upper side of the sheet module for controller 592, there is printed conductive paste 593 such as solder paste and conductive adhesive typified by silver paste, copper paste and silver palladium paste, on which a fourth-layer or lowermost sheet module for memory 591 is mounted and hardened. Next, on electrodes on an upper side of the fourth-layer sheet module for memory 591, there is printed conductive paste 593 such as solder paste and conductive adhesive typified by silver paste, copper paste and silver palladium paste, on which a third-layer sheet module for memory 591 is mounted and hardened. Next, on electrodes on an upper side of the third-layer sheet module for memory 591, there is printed conductive paste 593 such as solder paste and conductive adhesive typified by silver paste, copper paste and silver palladium paste, on which a second-layer sheet module for memory 591 is mounted and hardened. Next, on electrodes on an upper side of the second-layer sheet module for memory 591, there is printed conductive paste 593 such as solder paste and conductive adhesive typified by silver paste, copper paste and silver palladium paste, on which a first-layer or an uppermost sheet module for memory 591 is mounted and hardened.

Finally in step S46, a casing cover 597B is put over the sheet modules 591, 592, by which the memory card is formed.

Figure 47:
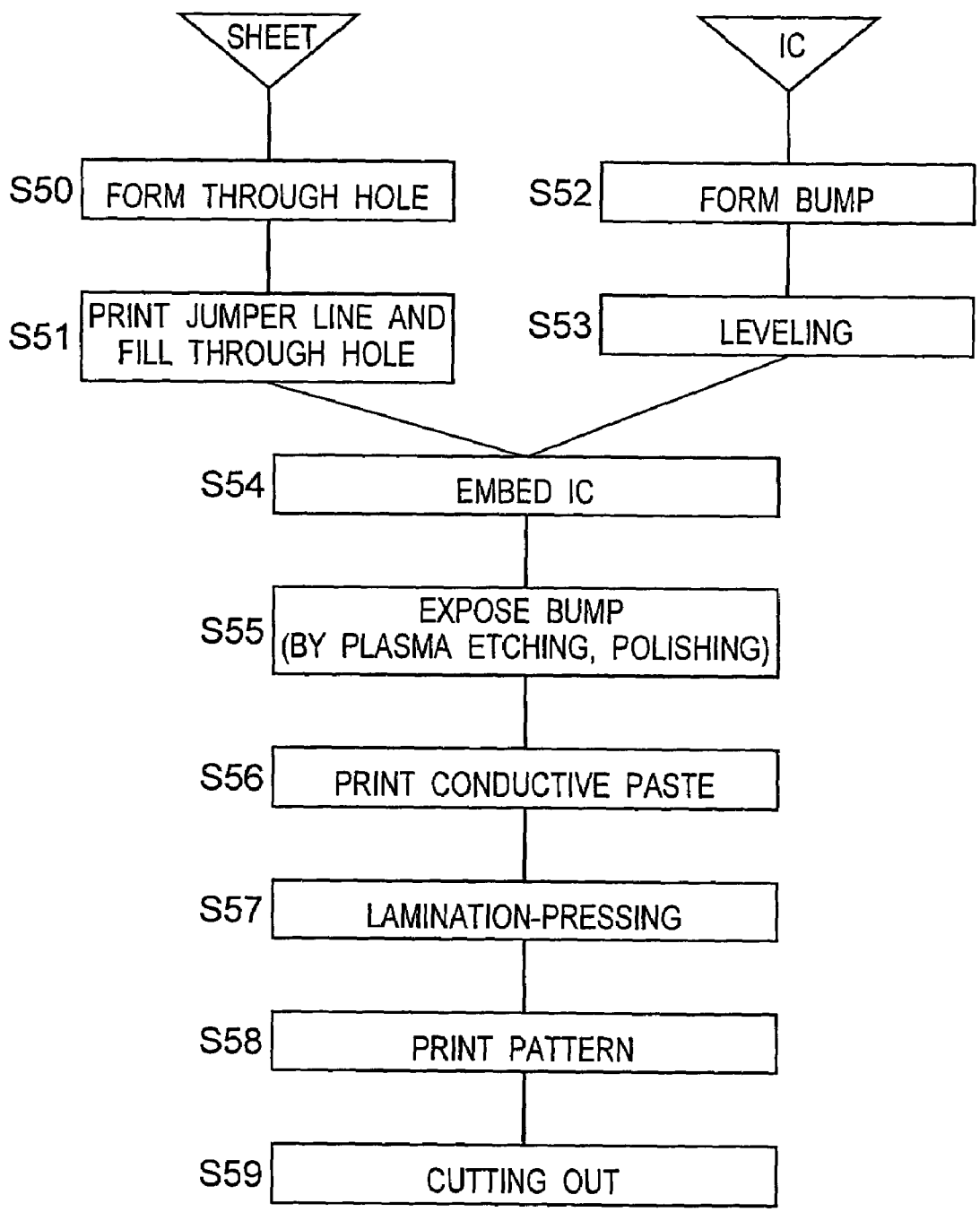
FIG. 47 is a flowchart showing the method for manufacturing the non-contact IC card.

FIGS. 46A, 46B and 46C are, respectively, a top view, a bottom view and a cross sectional view each showing an intermediate layer of a non-contact IC card manufactured by a method for manufacturing a non-contact IC card according to yet another embodiment of the present invention. FIG. 47 is a flowchart showing a method for manufacturing the non-contact IC card. FIGS. 48A, 48B, 48C, 48D, 49E, 49F and 49G are process charts each showing the method for manufacturing a non-contact IC card. The non-contact IC card enables data write and read for a short period of time.

Figure 48A:
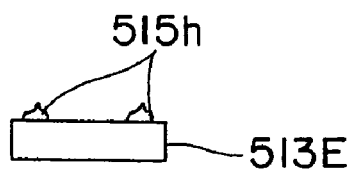
FIGS. 48A, 48B, 48C and 48D are process charts each showing the method for manufacturing the non-contact IC card.
Figure 48B:
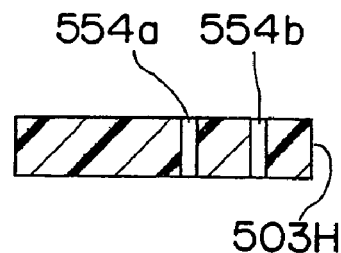
Figure 48C:
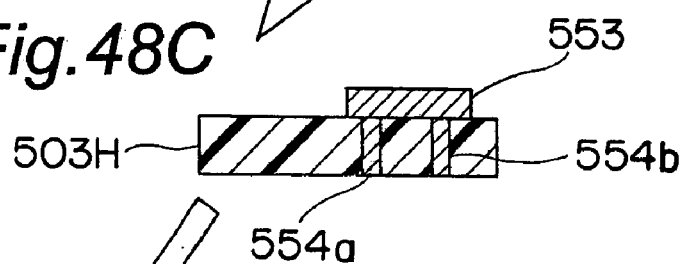

The non-contact IC card shown in FIGS. 48A, 48B and 48C incorporates a semiconductor device (bare IC chip) 513E that is data rewritable FeRAM (the semiconductor device 513E is an example of an electronic component), and a coil 556 serving as an antenna is printed on a surface of the intermediate layer.

In the manufacturing process of the non-contact IC card, first in step S50 and FIG. 48B, two through holes of 0.200 mm in diameter (554a, 554b) are formed in a thermoplastic resin sheet-substrate 503H having a sheet thickness of 0.100 mm, e.g., a polyethylene terephthalate sheet-substrate 503H (the sheet-substrate 503H is one example of the base substrate), by use of an NC puncher.

Next in step S51 and FIG. 48C, a jumper line 553 is formed so as to cover the through holes 554a, 554b by printing of conductive paste, and hardened. Hardening conditions in a case of using silver paste is 110° C. and 10 minutes.

Figure 48D:
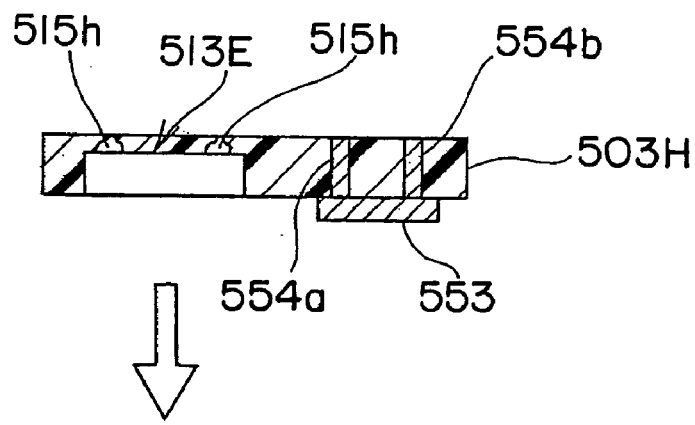

Next, in step S54 and FIG. 48D, the semiconductor device 513E (see FIG. 48A) of FeRam with dimensions of 4 mm long×6 mm wide×0.080 mm thick having gold protruding electrodes of 0.040 mm in height, previously formed in four corners in step S52 and leveled in step S53, is embedded in the sheet-substrate 503H made of polyethylene terephthalate having a sheet thickness of 0.100 mm. Then in step S55 and FIG. 49E, the electrodes 515h of the semiconductor device 513E are collectively exposed by performing plasma etching. Steps S50 through S51 and steps S52 through S53 may be performed separately or at the same time.

Figure 49E:
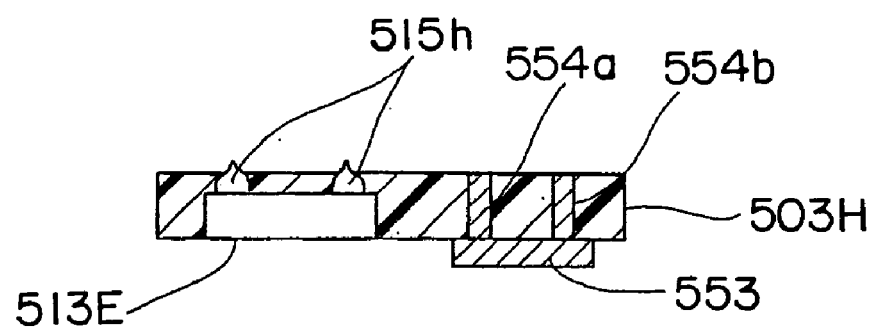
FIGS. 49E, 49F and 49G are process charts each showing the method for manufacturing the non-contact IC card following FIG. 48D.
Figure 49F:
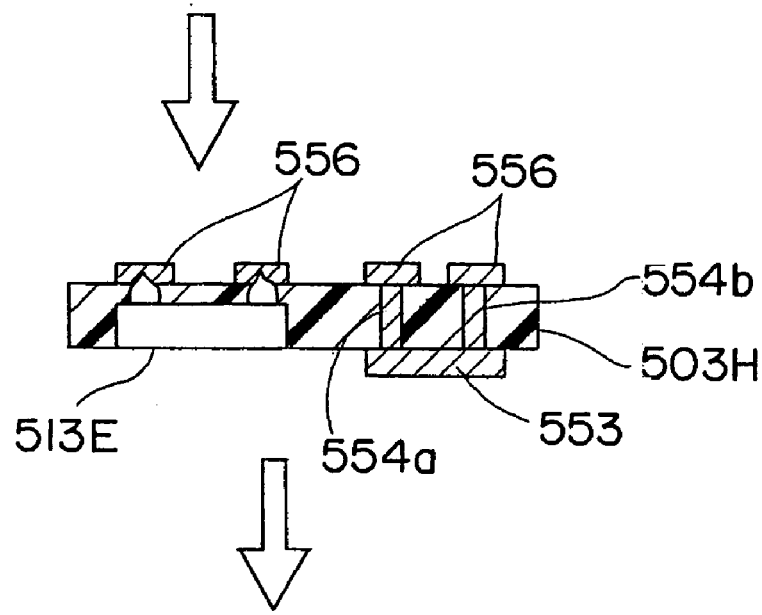

After that, in step S56 and FIG. 49F, a conductive paste is printed and hardened to form the coil 556 serving as the antenna so as to be in contact with the electrodes 515h.

Figure 49G:
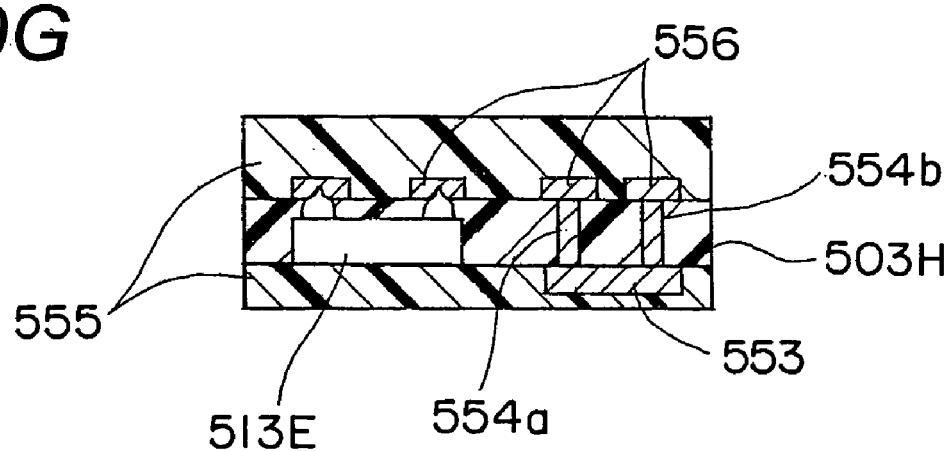
Figure 50:
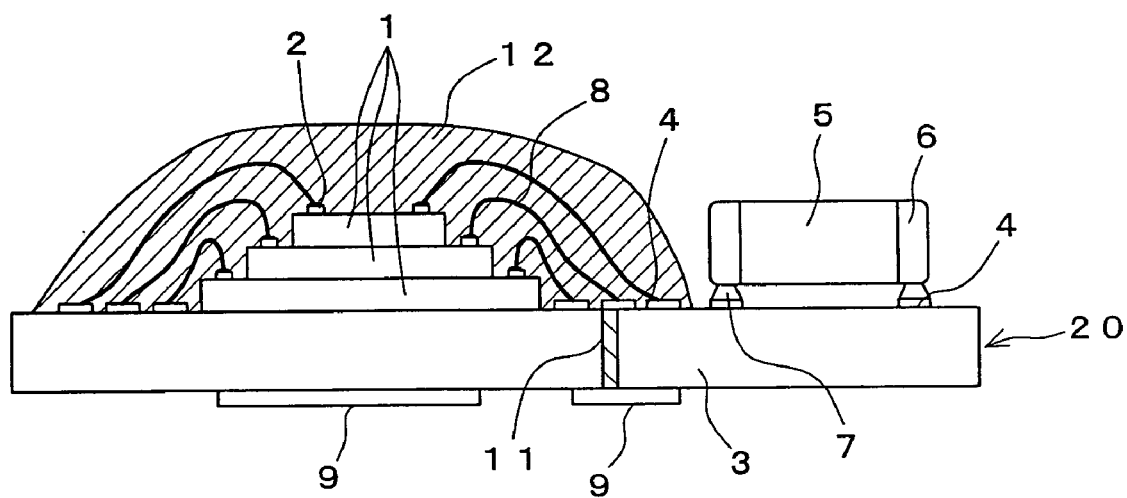
FIG. 50 is a view showing a conventional electronic component-mounted component.
Figure 51:
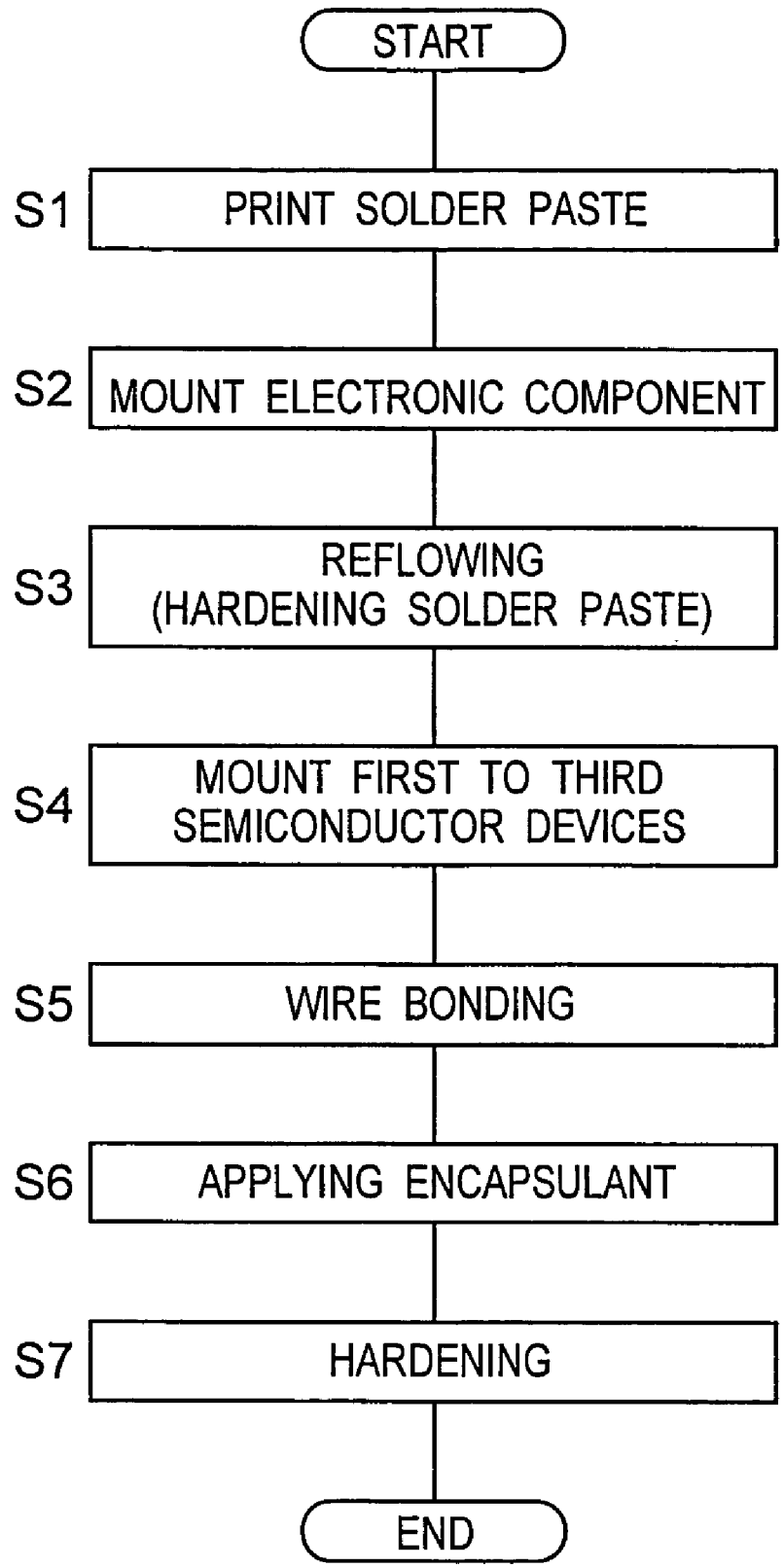
FIG. 51 is a flowchart showing a manufacturing process of a conventional electronic component-mounted component.

Finally in step S57 and FIG. 49G, thermoplastic resins, e.g., polyethylene terephthalate sheets 555, are superposed on both sides of thermoplastic resin sheet-substrate 503H, and lamination-pressing is executed to form these superposed sheets into a card (see FIGS. 46C, 46G).

Then, in step S58, patterns are printed, and in step S59, the sheets are cut out in a card size with a blanking apparatus. Thus, a non-contact IC card is completed.

It is noted that appropriately combining arbitrary embodiments from among the above-described various embodiments makes it possible to implement effects of each embodiment.

As described above in detail, according to the first aspect, on a circuit formation face of a base substrate having a first electronic component inserted therein, first circuit patterns are formed so as to be electrically joined to each of electrodes of the first electronic component, and then a second electronic component is mounted on the first circuit patterns. Therefore, in a case where the first electronic component and the second electronic component are disposed and mounted in a thickness direction of the base substrate, a thickness of this electronic component-mounted component may be decreased by a thickness of the base substrate, thereby making it possible to satisfy recent product needs of reduced thickness.

Also, since the second electronic component is surface-mounted on the first circuit patterns on the base substrate, it is not necessary to place wire-bonding electrodes in a peripheral portion of the electronic component, which makes it possible to use a second electronic component of an arbitrary size.

Further, since there is no limitation of a position of the electrodes of the second electronic component, types of the electrodes are not limited either, which makes it possible to stack area pad-type semiconductor devices.

Also, according to the second aspect of the present invention, the first electronic component is inserted in the base substrate such that each of the electrodes of the first electronic component is exposed from a circuit formation face of the base substrate, that is a surface of the base substrate on which the first circuit patterns are formed. This facilitates and ensures establishment of electric connection between each of the electrodes of the first electronic component and the first circuit patterns. Therefore, an electronic component-mounted component capable of obtaining an effect of the first embodiment may be manufactured easily and certainly.

Also, according to other aspects of the present invention, further the electronic component-mounted component is lamination-processed from another side of the electronic component-mounted component, so that the first electronic component inserted in the electronic component-mounted component may be sealed, thereby making it possible to provide a module more excellent in terms of moisture resistance.

Also, in a case where a first substrate and a second substrate are provided, generally-used conventional circuit boards may be used as these substrates. Consequently, conventional printing technology and reflow technology in the surface mounting field is applicable, and therefore a degree of difficulty in module formation may be lowered.

Further, electric connection between each of the electrodes of the first electronic component and the first circuit patterns is established such that the first circuit patterns are electrically connected to conductive through-holes having conductors inside thereof which are formed so as to pass through the base substrate in a thickness direction, thereby enabling mounting of components on both faces of the base substrate. Thus, establishing electric connection by utilizing the through holes formed in the base substrate makes it possible to adopt various configurations in superposing the second electronic component, the first substrate, and the second substrate, on the electronic component-mounted component.

Also, the first substrate and the second substrate, and the electronic component-mounted component are superposed on top of each other with use of binder, which enables easy superposition, thereby making it possible to manufacture the electronic component-mounted component having more diverse superposing configurations.

Also, according to the twentieth aspect of the present invention, in a case where each of the electrodes of the first electronic component in the state of being inserted in the base substrate is not exposed from the surface of the base substrate, any one of or both of polishing processing and plasma discharge processing are performed, so that each of the electrodes of the first electronic component inserted in the base substrate may be exposed from the surface of the base substrate. This makes it possible to form the first circuit patterns so as to be electrically connected to the exposed electrodes with reliability.

More specifically, when a formation thickness of the base substrate is larger than a formation thickness of the first electronic component, inserting the first electronic component in the base substrate results in inserting each of the electrodes of the first electronic component in the base substrate. However, by applying polishing processing or plasma discharge processing to the surface of the base substrate, each of the electrodes of the first electronic component may be exposed.

Therefore, when the electrodes of the first electronic component in a state of being inserted in the base substrate are exposed from the surface of the base substrate, the circuit patterns are formed without executing any step, whereas when the electrodes are not exposed, polishing processing or plasma discharge processing is applied to ensure formation of the first circuit patterns and manufacturing of the electronic component-mounted component.

Also, as shown in the above-described various aspects of the present invention, since a thickness of the electronic component-mounted component may be decreased, it becomes possible to provide the electronic component-mounted component such as sheet modules which are softer than a conventional substrate so as to be used on a curved face or a place where a bending operation is performed.

Further, according to still another aspect of the present embodiment, in a case where a semiconductor device (bare IC chip) as an example of the first electronic component is inserted in the base substrate, a film formation and circuit pattern formation area on the surface of the base substrate may be enlarged, which makes it possible to provide the electronic component-mounted component capable of implementing a high function and downsizing.

Further, there is implemented an effect of increasing productivity since unlike conventional batch-processing, a plurality of first electronic components may be collectively inserted in the base substrate, and each of electrodes of each of the first electronic components may be collectively exposed from the surface of the base substrate.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for manufacturing an electronic component-mounted component, comprising:
    inserting a first electronic component in a sheet-like base substrate by pressing said first electronic component into said sheet-like base substrate so as to embed said first electronic component in said sheet-like base substrate;
    forming a first circuit pattern on a circuit formation face of said sheet-like base substrate;
    establishing an electrical connection between said first circuit pattern and an electrode of said first electronic component once embedded in said sheet-like base substrate; then
    superposing a first substrate, having a second circuit pattern and a third circuit pattern, and said sheet-like base substrate in a thickness direction of said sheet-like base substrate and said first substrate; and
    electrically connecting said first circuit pattern to said second circuit pattern,
    wherein said second circuit pattern is spaced from said third circuit pattern in the thickness direction of said first substrate, and said first substrate also has a through hole with a conductor therein for electrically interconnecting said second circuit pattern and said third circuit pattern.

2. The method according to claim 1, wherein
    inserting said first electronic component in said sheet-like base substrate results in said electrode of said first electronic component being exposed from said circuit formation face of said sheet-like base substrate.

3. The method according to claim 1, wherein electrically connecting said first circuit pattern to said second circuit pattern comprises electrically connecting said first circuit pattern to said second circuit pattern after superposing said first substrate and said sheet-like base substrate, said method further comprising:
    mounting a second electronic component on said third circuit pattern after electrically connecting said first circuit pattern to said second circuit pattern.

4. The method according to claim 3, further comprising:
    superposing a second substrate, having a fourth circuit pattern and a fifth circuit pattern, and said sheet-like base substrate, having said first electronic component embedded therein and said first circuit pattern formed thereon, in a thickness direction of said sheet-like base substrate and said second substrate;

electrically connecting said fourth circuit pattern to a conductor in a through hole of said sheet-like base substrate; and mounting a third electronic component on said fifth circuit pattern, wherein said fourth circuit pattern is spaced from said fifth circuit pattern in the thickness direction of said second substrate, and said second substrate also has a through hole with a conductor therein for electrically interconnecting said fourth circuit pattern and said fifth circuit pattern.

5. The method according to claim 4, wherein superposing said first substrate and said sheet-like base substrate comprises superposing said first substrate and said sheet-like base substrate via a binder, and
superposing said second substrate and said sheet-like base substrate comprises superposing said second substrate and said sheet-like base substrate via a binder.

6. The method according to claim 1, further comprising: mounting a second electronic component on said third circuit pattern prior to electrically connecting said first circuit pattern to said second circuit pattern.

7. The method according to claim 6, further comprising: superposing a second substrate, having a fourth circuit pattern and a fifth circuit pattern, and said sheet-like base substrate, having said first electronic component embedded therein and said first circuit pattern formed thereon, in a thickness direction of said sheet-like base substrate and said second substrate;
electrically connecting said fourth circuit pattern to a conductor in a through hole of said sheet-like base substrate; and
mounting a third electronic component on said fifth circuit pattern,
wherein said fourth circuit pattern is spaced from said fifth circuit pattern in the thickness direction of said second substrate, and said second substrate also has a through hole with a conductor therein for electrically interconnecting said fourth circuit pattern and said fifth circuit pattern.

8. The method according to claim 7, wherein superposing said first substrate and said sheet-like base substrate comprises superposing said first substrate and said sheet-like base substrate via a binder, and
superposing said second substrate and said sheet-like base substrate comprises superposing said second substrate and said sheet-like base substrate via a binder.

9. The method according to claim 1, further comprising: after inserting said first electronic component in said sheet-like base substrate and forming said first circuit pattern, and before electrically connecting said first circuit pattern to said second circuit pattern, performing lamination processing so as to dispose an insulating protective sheet on a face of said sheet-like base substrate that is opposite said circuit formation face of said sheet-like base substrate.

10. The method according to claim 1, further comprising: electrically connecting said first circuit pattern to a conductor in a through hole that extends through said sheet-like base substrate in a thickness direction of said sheet-like base substrate.

11. The method according to claim 10, further comprising:
superposing a second substrate, having a fourth circuit pattern and a fifth circuit pattern, and said sheet-like base substrate, having said first electronic component embedded therein and said first circuit pattern formed thereon, in a thickness direction of said sheet-like base substrate and said second substrate;
electrically connecting said fourth circuit pattern to a conductor in a through hole of said sheet-like base substrate; and then
mounting a second electronic component on said fifth circuit pattern,
wherein said fourth circuit pattern is spaced from said fifth circuit pattern in the thickness direction of said second substrate, and said second substrate also has a through hole with a conductor therein for electrically interconnecting said fourth circuit pattern and said fifth circuit pattern.

12. The method according to claim 11, wherein superposing said first substrate and said sheet-like base substrate comprises superposing said first substrate and said sheet-like base substrate via a binder, and
superposing said second substrate and said sheet-like base substrate comprises superposing said second substrate and said sheet-like base substrate via a binder.

13. The method according to claim 1, wherein superposing said first substrate and said sheet-like base substrate comprises superposing said first substrate and said sheet-like base substrate via a binder.

14. A method for manufacturing an electronic component-mounted component, comprising:
inserting a first electronic component in a thermoplastic resin base substrate by pressing said first electronic component into said thermoplastic resin base substrate, while heating said thermoplastic resin base substrate so as to plasticize said thermoplastic resin base substrate, so as to embed said first electronic component in said thermoplastic resin base substrate;
forming a first circuit pattern on a circuit formation face of said thermoplastic resin base substrate;
establishing an electrical connection between said first circuit pattern and an electrode of said first electronic component once embedded in said thermoplastic resin base substrate; then
superposing a first substrate, having a second circuit pattern and a third circuit pattern, and said thermoplastic resin base substrate in a thickness direction of said thermoplastic resin base substrate and said first substrate; and
electrically connecting said first circuit pattern to said second circuit pattern,
wherein said second circuit pattern is spaced from said third circuit pattern in the thickness direction of said first substrate, and said first substrate also has a through hole with a conductor therein for electrically interconnecting said second circuit pattern and said third circuit pattern.

15. The method according to claim 14, wherein inserting said first electronic component in said thermoplastic resin base substrate results in said electrode of said first electronic component being exposed from said circuit formation face of said thermoplastic resin base substrate.

16. The method according to claim 14, wherein electrically connecting said first circuit pattern to said second circuit pattern comprises electrically connecting said first circuit pattern to said second circuit pattern after superposing said first substrate and said thermoplastic resin base substrate, said method further comprising:
mounting a second electronic component on said third circuit pattern after electrically connecting said first circuit pattern to said second circuit pattern.

17. The method according to claim 16, further comprising:
- superposing a second substrate, having a fourth circuit pattern and a fifth circuit pattern, and said thermoplastic resin base substrate, having said first electronic component embedded therein and said first circuit pattern formed thereon, in a thickness direction of said thermoplastic resin base substrate and said second substrate;
- electrically connecting said fourth circuit pattern to a conductor in a through hole of said thermoplastic resin base substrate; and
- mounting a third electronic component on said fifth circuit pattern,
- wherein said fourth circuit pattern is spaced from said fifth circuit pattern in the thickness direction of said second substrate, and said second substrate also has a through hole with a conductor therein for electrically interconnecting said fourth circuit pattern and said fifth circuit pattern.

18. The method according to claim 17, wherein
- superposing said first substrate and said thermoplastic resin base substrate comprises superposing said first substrate and said thermoplastic resin base substrate via a binder, and
- superposing said second substrate and said thermoplastic resin base substrate comprises superposing said second substrate and said thermoplastic resin base substrate via a binder.

19. The method according to claim 14, further comprising:
- mounting a second electronic component on said third circuit pattern prior to electrically connecting said first circuit pattern to said second circuit pattern.

20. The method according to claim 19, further comprising:
- superposing a second substrate, having a fourth circuit pattern and a fifth circuit pattern, and said thermoplastic resin base substrate, having said first electronic component embedded therein and said first circuit pattern formed thereon, in a thickness direction of said thermoplastic resin base substrate and said second substrate;
- electrically connecting said fourth circuit pattern to a conductor in a through hole of said thermoplastic resin base substrate; and
- mounting a third electronic component on said fifth circuit pattern,
- wherein said fourth circuit pattern is spaced from said fifth circuit pattern in the thickness direction of said second substrate, and said second substrate also has a through hole with a conductor therein for electrically interconnecting said fourth circuit pattern and said fifth circuit pattern.

21. The method according to claim 20, wherein
- superposing said first substrate and said thermoplastic resin base substrate comprises superposing said first substrate and said thermoplastic resin base substrate via a binder, and
- superposing said second substrate and said thermoplastic resin base substrate comprises superposing said second substrate and said thermoplastic resin base substrate via a binder.

22. The method according to claim 14, further comprising:
- after inserting said first electronic component in said thermoplastic resin base substrate and forming said first circuit pattern, and before electrically connecting said first circuit pattern to said second circuit pattern, performing lamination processing so as to dispose an insulating protective sheet on a face of said thermoplastic resin base substrate that is opposite said circuit formation face of said thermoplastic resin base substrate.

23. The method according to claim 14, further comprising:
- electrically connecting said first circuit pattern to a conductor in a through hole that extends through said thermoplastic resin base substrate in a thickness direction of said thermoplastic resin base substrate.

24. The method according to claim 23, further comprising:
- superposing a second substrate, having a fourth circuit pattern and a fifth circuit pattern, and said thermoplastic resin base substrate, having said first electronic component embedded therein and said first circuit pattern formed thereon, in a thickness direction of said thermoplastic resin base substrate and said second substrate;
- electrically connecting said fourth circuit pattern to a conductor in a through hole of said thermoplastic resin base substrate; and then
- mounting a second electronic component on said fifth circuit pattern,
- wherein said fourth circuit pattern is spaced from said fifth circuit pattern in the thickness direction of said second substrate, and said second substrate also has a through hole with a conductor therein for electrically interconnecting said fourth circuit pattern and said fifth circuit pattern.

25. The method according to claim 24, wherein
- superposing said first substrate and said thermoplastic resin base substrate comprises superposing said first substrate and said thermoplastic resin base substrate via a binder, and
- superposing said second substrate and said thermoplastic resin base substrate comprises superposing said second substrate and said thermoplastic resin base substrate via a binder.

26. The method according to claim 14, wherein
- superposing said first substrate and said thermoplastic resin base substrate comprises superposing said first substrate and said thermoplastic resin base substrate via a binder.

* * * * *